US012776626B2

(12) United States Patent
Hirose et al.

(10) Patent No.: US 12,776,626 B2
(45) Date of Patent: Oct. 27, 2026

(54) SURFACE-EMITTING LASER DEVICE

(71) Applicant: HAMAMATSU PHOTONICS K.K., Hamamatsu (JP)

(72) Inventors: Kazuyoshi Hirose, Hamamatsu (JP); Masahiro Hitaka, Hamamatsu (JP); Hiroki Kamei, Hamamatsu (JP); Takahiro Sugiyama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 425 days.

(21) Appl. No.: 18/286,149

(22) PCT Filed: Mar. 2, 2022

(86) PCT No.: PCT/JP2022/008934
§ 371 (c)(1),
(2) Date: Oct. 9, 2023

(87) PCT Pub. No.: WO2022/224591
PCT Pub. Date: Oct. 27, 2022

(65) Prior Publication Data
US 2024/0195150 A1 Jun. 13, 2024

(30) Foreign Application Priority Data
Apr. 21, 2021 (JP) ................................ 2021-071665

(51) Int. Cl.
*H01S 5/32* (2006.01)
*H01S 5/042* (2006.01)
(Continued)

(52) U.S. Cl.
CPC ........ *H01S 5/3215* (2013.01); *H01S 5/04252* (2019.08); *H01S 5/04256* (2019.08);
(Continued)

(58) Field of Classification Search
CPC ............... H01S 5/3215; H01S 5/04252; H01S 5/04256; H01S 5/11; H01S 5/18308; H01S 5/2031; H01S 5/3213
See application file for complete search history.

(56) References Cited

U.S. PATENT DOCUMENTS

2003/0197188 A1* 10/2003 Watatani ............... B82Y 20/00 257/E33.008
2007/0036189 A1 2/2007 Hori et al.
(Continued)

FOREIGN PATENT DOCUMENTS

CN 102347591 A 2/2012
CN 109690890 A 4/2019
(Continued)

OTHER PUBLICATIONS

Machine translation of JP 2020098891A (Year: 2020).*
(Continued)

*Primary Examiner* — Yuanda Zhang
(74) *Attorney, Agent, or Firm* — Faegre Drinker Biddle & Reath LLP

(57) ABSTRACT

A surface-emitting laser device includes a first electrode, a lower cladding layer, an active layer, an upper cladding layer, a relaxation layer, a contacting layer having a bandgap different from that of the upper cladding layer, a second electrode, and a photonic crystal layer provided between the lower cladding layer and the active layer or between the active layer and the upper cladding layer, including a basic region and a plurality of different refractive index regions that differ in refractive index from the basic region and are distributed two-dimensionally in a plane perpendicular to a thickness direction to form a resonance mode of light in the
(Continued)

plane. The relaxation layer has a bandgap that is between a bandgap of the upper cladding layer and a bandgap of the contacting layer.

20 Claims, 42 Drawing Sheets

(51) Int. Cl.

| | |
|---|---|
| ***H01S 5/11*** | (2021.01) |
| ***H01S 5/183*** | (2006.01) |
| ***H01S 5/20*** | (2006.01) |
| ***H01S 5/323*** | (2006.01) |

(52) U.S. Cl.
CPC ............ *H01S 5/11* (2021.01); *H01S 5/18308* (2013.01); *H01S 5/2031* (2013.01); *H01S 5/3213* (2013.01); *H01S 5/323* (2013.01)

(56) References Cited

U.S. PATENT DOCUMENTS

| | | | | |
|---|---|---|---|---|
| 2009/0201961 | A1* | 8/2009 | Sato | B82Y 20/00 372/45.01 |
| 2015/0303654 | A1* | 10/2015 | Petrescu-Prahova | H01S 5/2031 372/45.01 |
| 2018/0026419 | A1 | 1/2018 | Hirose et al. | |
| 2021/0391691 | A1* | 12/2021 | Sugiyama | H01S 5/3211 |
| 2023/0387662 | A1* | 11/2023 | Kunoh | H01S 5/162 |

FOREIGN PATENT DOCUMENTS

| | | | |
|---|---|---|---|
| JP | 2008-192799 | A | 8/2008 |
| JP | 2008-294444 | A | 12/2008 |
| JP | 2009-231578 | A | 10/2009 |
| JP | 2010-062300 | A | 3/2010 |
| JP | 2011-243831 | A | 12/2011 |
| JP | 2014-197659 | A | 10/2014 |
| JP | 2018-198302 | A | 12/2018 |
| JP | 2019-106398 | A | 6/2019 |
| JP | 2019-216148 | A | 12/2019 |
| JP | 2020-068330 | A | 4/2020 |
| JP | 2020-098891 | A | 6/2020 |
| WO | WO-2019/111787 | A1 | 6/2019 |
| WO | WO-2020/045453 | A1 | 3/2020 |

OTHER PUBLICATIONS

International Preliminary Report on Patentability mailed Nov. 2, 2023 for PCT/JP2022/008934.

Hirose, Kazuyoshi et al., "Watt-class high-power, high-beam-quality photonic-crystal lasers," Nature Photonics, vol. 8, pp. 406-411 (2014).

Kurosaka, Y. et al., "Effects of non-lasing band in two-dimensional photonic-crystal lasers clarified using omnidirectional band structure," Opt. Express 20, 21773-21783 (2012).

* cited by examiner (a)

(b)

(a)

(b)

(a)

ORIGINAL LIGHT IMAGE (b)

RESULTING BEAM PATTERN (a)

(b)

(a)

(b)

(a)

(b)

SURFACE-EMITTING LASER DEVICE

TECHNICAL FIELD

The present disclosure relates to a surface-emitting laser device.

BACKGROUND ART

Patent Literature 1 discloses a semiconductor laser device. The semiconductor laser device includes a support substrate, a first cladding layer, an active layer, a diffraction grating layer, and a second cladding layer. The active layer and the diffraction grating layer are provided between the first cladding layer and the second cladding layer. The active layer generates light. The second cladding layer has a conductivity type different from the conductivity type of the first cladding layer. The diffraction grating layer has a two-dimensional photonic crystal structure in a square lattice arrangement.

Patent Literature 2 discloses a semiconductor light-emitting device and a manufacturing method thereof. The semiconductor light-emitting device includes a semiconductor substrate, and a first cladding layer, an active layer, a second cladding layer, and a contacting layer which are provided in order on the semiconductor substrate. Further, the semiconductor light-emitting device includes a phase modulation layer located between the first cladding layer and the active layer or between the active layer and the second cladding layer. The phase modulation layer has a basic region and a plurality of different refractive index regions having a refractive index different from the refractive index of the basic region. When a virtual square lattice is set in a plane perpendicular to the thickness direction of the phase modulation layer, the phase modulation layer is configured as follows. The different refractive index region allocated to each unit constituent region constituting the square lattice is disposed so that the center of gravity is located away from the lattice point of the corresponding unit constituent region. Each different refractive index region has a rotation angle around the lattice point, according to a desired light image.

Patent Literature 3 discloses a light-emitting device. The light-emitting device outputs light that forms a light image in a normal direction of the main surface of the substrate, in an inclined direction intersecting the normal direction, or in both the normal direction and the inclined direction. The light-emitting device includes a light-emitting part and a phase modulation layer provided on a substrate and optically coupled to the light-emitting part. The phase modulation layer includes a basic region and a plurality of different refractive index regions. The plurality of different refractive index regions are provided in the basic region so as to be distributed two-dimensionally on a plane perpendicular to the normal direction, and have a refractive index different from the refractive index of the basic region. In a state in which a virtual square lattice is set on the plane, the centers of gravity of the plurality of different refractive index regions are located at a predetermined distance from the corresponding lattice points. The rotation angle of the different refractive index region around the lattice point in the virtual square lattice, in other words, the angle of a line segment connecting the center of gravity of each of the plurality of different refractive index regions and the corresponding lattice point with respect to the virtual square lattice, is set in accordance with a phase distribution for forming a light image. The lattice spacing a of the virtual square lattice and the emission wavelength λ of the light-emitting unit are set to satisfy M-point oscillation conditions among symmetric points in the reciprocal lattice space equivalent to the wavenumber space of the phase modulation layer. The magnitude of at least one in-plane wavenumber vector among in-plane wavenumber vectors in four directions formed in the reciprocal lattice space of the phase modulation layer is smaller than 2π/λ.

Non-Patent Literature 1 discloses a two-dimensional photonic crystal surface-emitting laser that enables a high-power single-mode operation at room temperature and under continuous wave conditions by devising the shape of a plurality of holes constituting a photonic crystal.

CITATION LIST

Patent Literature

[Patent Literature 1] Japanese Unexamined Patent Publication No. 2014-197659
[Patent Literature 2] Japanese Unexamined Patent Publication No. 2018-198302
[Patent Literature 3] International Patent Publication WO 2020/045453

Non-Patent Literature

[Non-Patent Literature 1] Kazuyoshi Hirose et al., "Watt-class high-power, high-beam-quality photonic-crystal lasers," Nature Photonics, Volume 8, pp. 406-411 (2014)
[Non-Patent Literature 2] Y. Kurosaka et al., "Effects of non-lasing band in two-dimensional photonic-crystal lasers clarified using omnidirectional band structure," Opt. Express 20, 21773-21783 (2012)

SUMMARY OF INVENTION

Technical Problem

As a surface-emitting-type laser device that emits a laser beam in a direction intersecting the main surface of a substrate, there is a photonic crystal surface-emitting laser in which an active layer and a photonic crystal layer are disposed between two cladding layers. As a surface-emitting-type laser device having a structure similar to that of a photonic crystal surface-emitting laser, there is a device called a so-called static-integrable phase modulating (S-iPM) laser in which a phase modulation layer is disposed instead of a photonic crystal layer. In these laser devices, a contacting layer is provided on one cladding layer, and a current is supplied from an electrode through the cladding layer to the active layer, the electrode being in ohmic contact with the contacting layer.

In order to obtain sufficient laser oscillation with a smaller current, it is required to sufficiently confine light generated in the active layer in the photonic crystal layer or the phase modulation layer. For this purpose, it is desirable to make the refractive index of the cladding layer sufficiently smaller than those of the active layer and the phase modulation layer. However, the bandgap of the cladding layer increases as the refractive index of the cladding layer becomes smaller. As the bandgap of cladding layer increases, the bandgap difference between the cladding layer and the contacting layer increases. The electric resistance increases due to a potential barrier caused by a sharp change in bandgap at the interface between the cladding layer and the contacting layer. As the electric resistance increases, it is necessary to increase a drive voltage in order to obtain sufficient laser oscillation. As a result, power consumption increases and the reliability of the device is lowered.

An object of the present disclosure is to obtain sufficient laser oscillation even at a low drive voltage in a surface-emitting laser device such as a photonic crystal surface-emitting laser or an S-iPM laser.

Solution to Problem

A surface-emitting laser device according to the present disclosure including: a first electrode; a first cladding layer of a first conductivity type electrically connected to the first electrode; an active layer provided on the first cladding layer; a second cladding layer of a second conductivity type provided on the active layer; a relaxation layer of a second conductivity type provided on the second cladding layer; a contacting layer of a second conductivity type provided on the relaxation layer and having a bandgap different from that of the second cladding layer; a second electrode provided on the contacting layer to be in ohmic contact with the contacting layer; and a resonance mode forming layer. The resonance mode forming layer is provided between the first cladding layer and the active layer or between the active layer and the second cladding layer. The resonance mode forming layer includes a basic region and a plurality of different refractive index regions. The plurality of different refractive index regions have a refractive index different from that of the basic region and are distributed two-dimensionally in a plane perpendicular to a thickness direction. The resonance mode forming layer forms a resonance mode of light in the plane. The relaxation layer has a bandgap width that is between a bandgap width of the second cladding layer and a bandgap width of the contacting layer.

Advantageous Effects of Invention

According to the present disclosure, it is possible to obtain sufficient laser oscillation even at a low drive voltage in a surface-emitting laser device such as a photonic crystal surface-emitting laser or an S-iPM laser.

Figure 3:
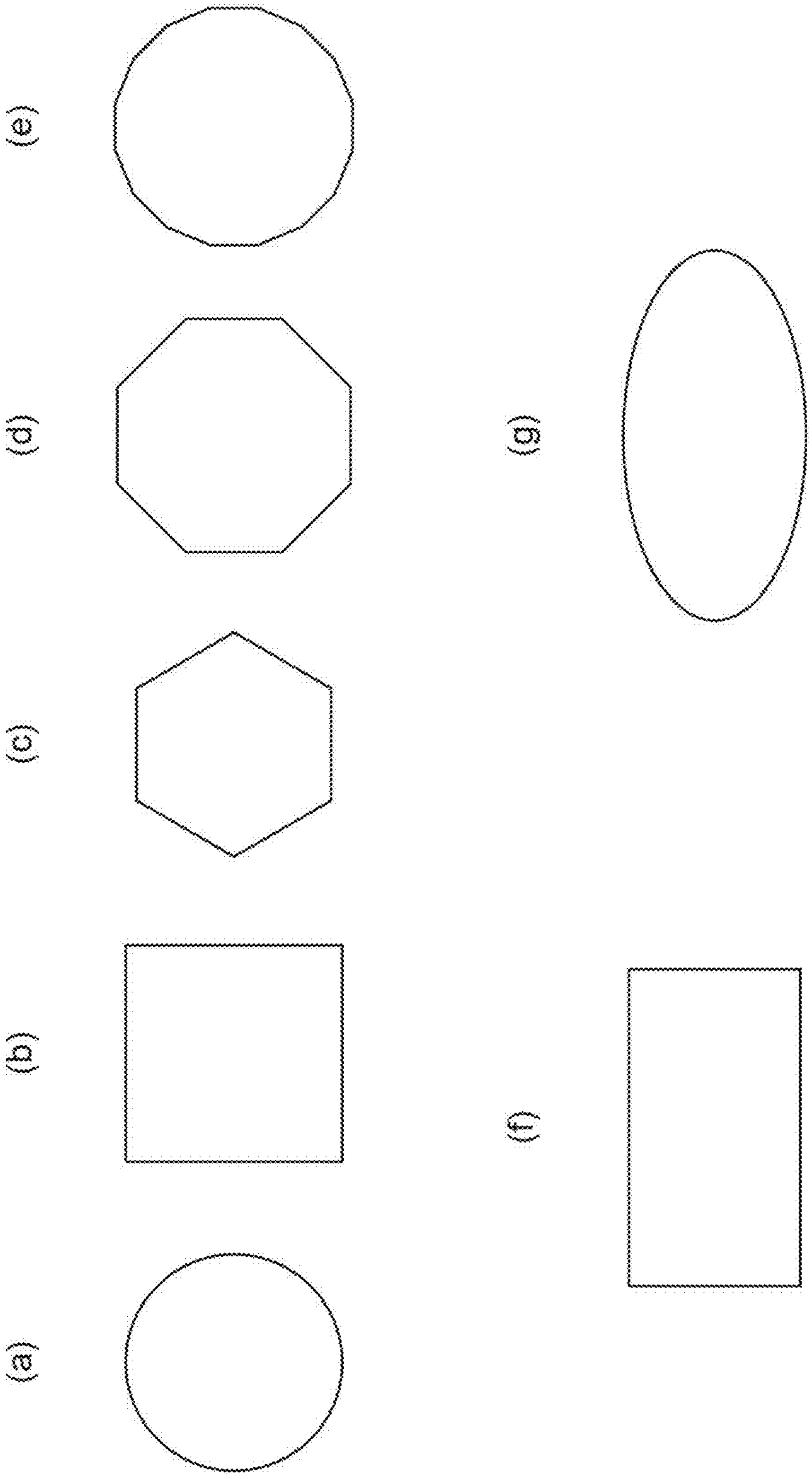

Parts (a) to (g) of FIG. 3 are diagrams illustrating examples of shapes of different refractive index regions.

Figure 4:
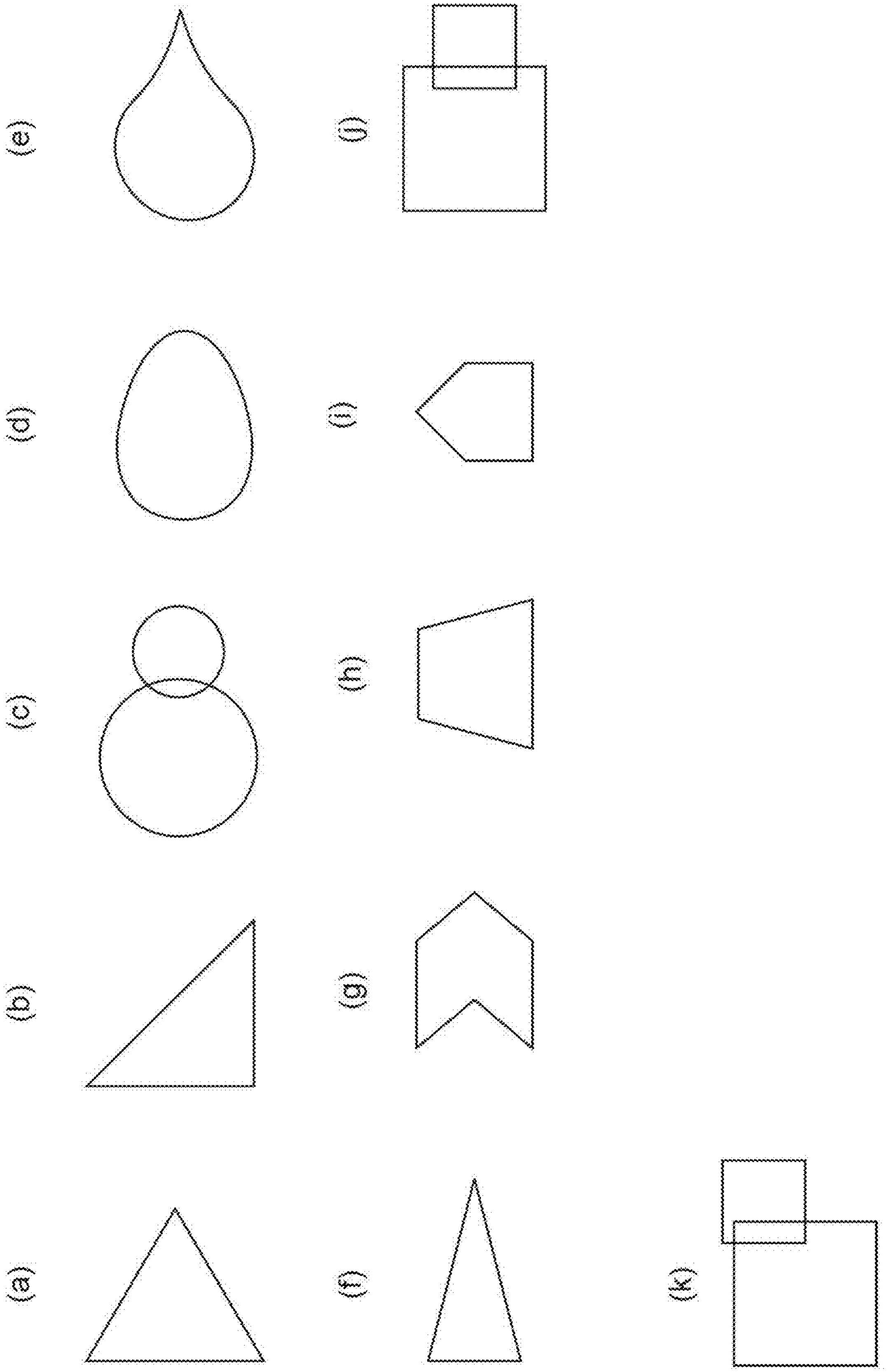

Parts (a) to (k) of FIG. 4 are diagrams illustrating examples of shapes of different refractive index regions.

Figure 5:
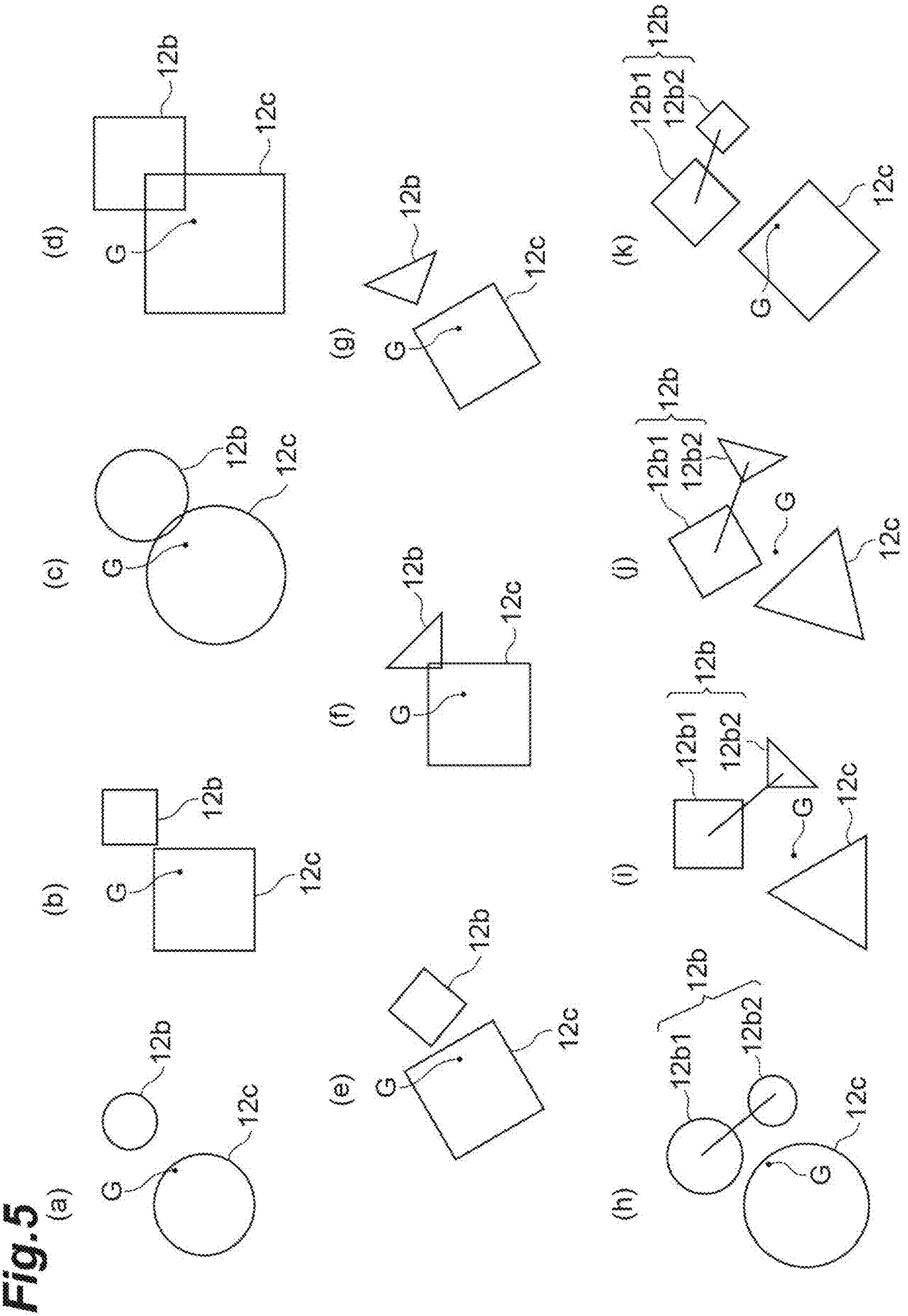

Parts (a) to (k) of FIG. 5 are diagrams illustrating examples of shapes of different refractive index regions.

Figure 6:
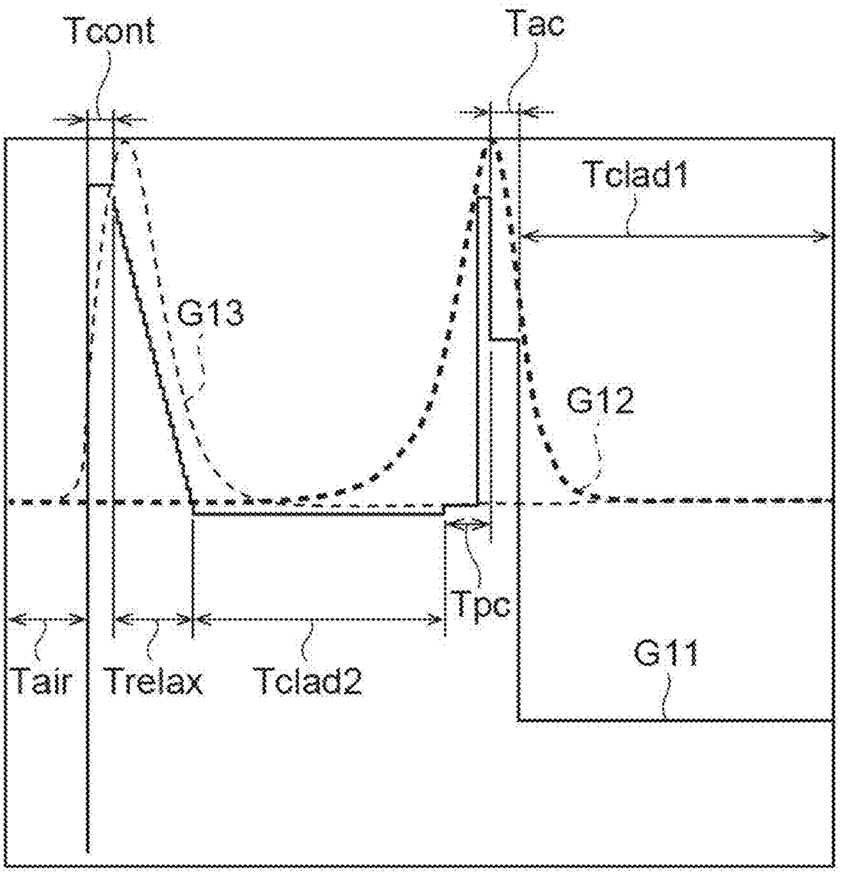
Figure 6:
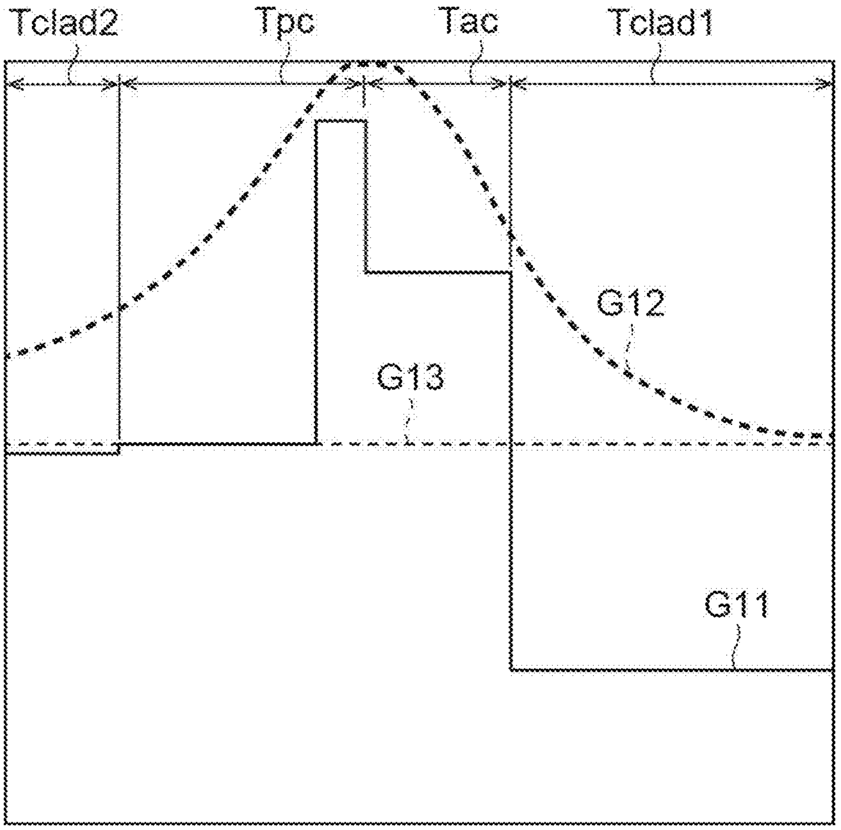

Part (a) of FIG. 6 is a graph illustrating a refractive index distribution of a surface-emitting laser device and a fundamental mode distribution generated around an active layer and a photonic crystal layer. Part (b) of FIG. 6 is a graph illustrating an enlarged view of the vicinity of the active layer and the photonic crystal layer in part (a).

Figure 7:
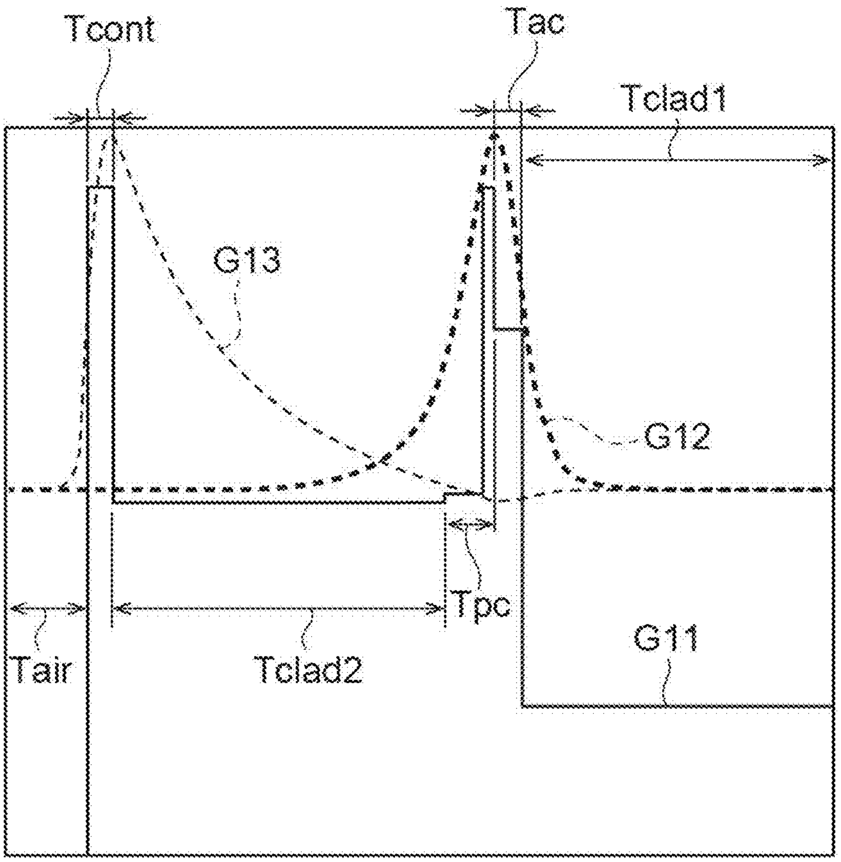
Figure 7:
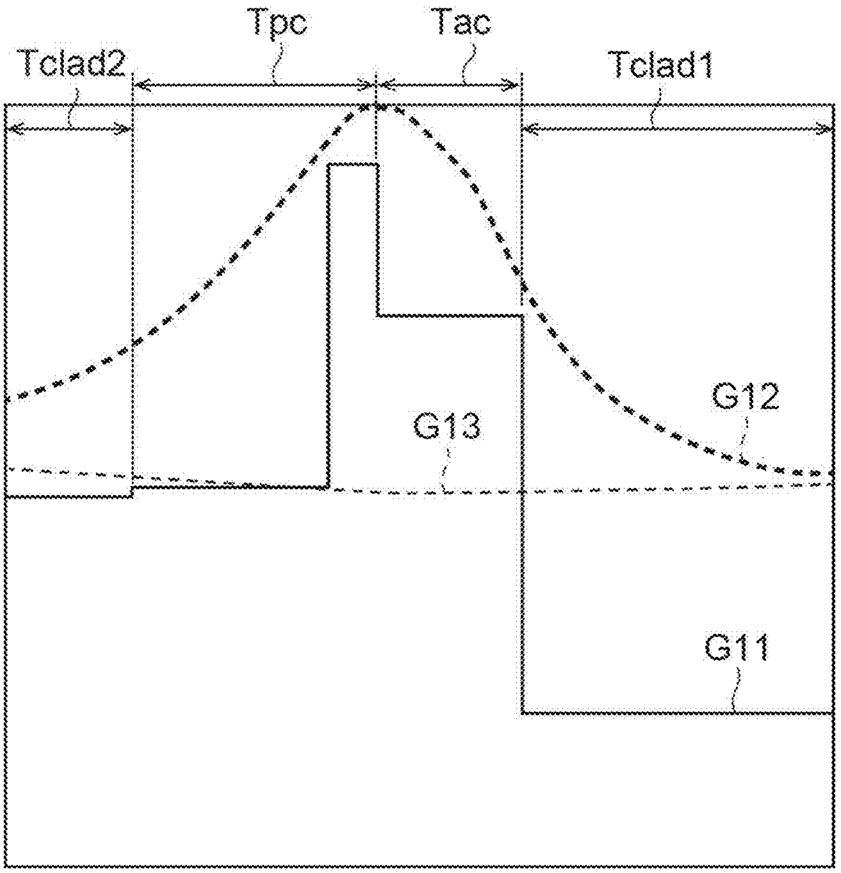

Part (a) of FIG. 7 is a graph illustrating a refractive index distribution and a fundamental mode distribution of the surface-emitting laser device without a relaxation layer. Part (b) of FIG. 7 is a graph illustrating an enlarged view of the vicinity of the active layer and the photonic crystal layer in part (a).

Figure 8:
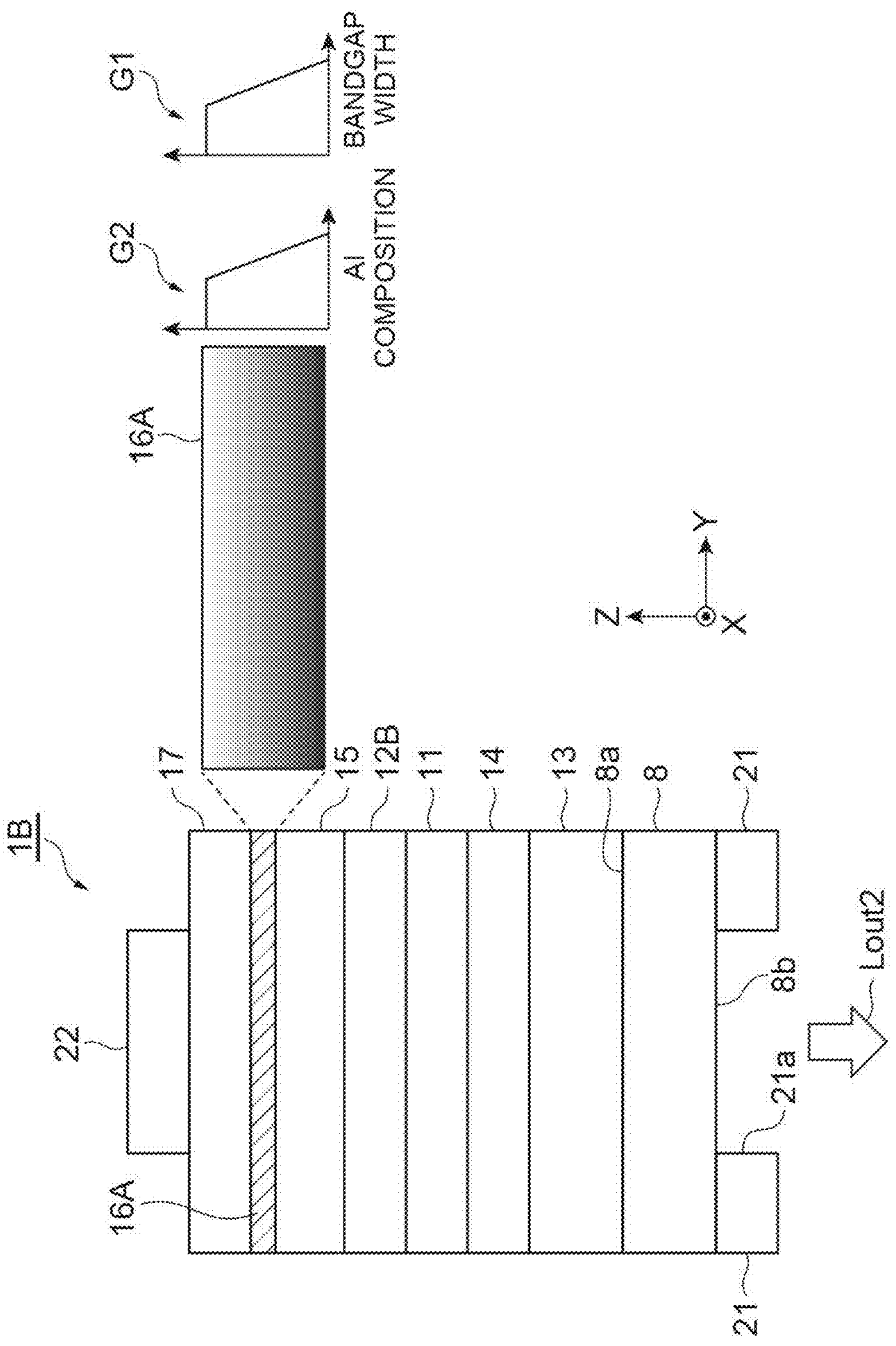

FIG. 8 is a diagram schematically illustrating a cross-sectional configuration of a surface-emitting laser device according to a second embodiment.

Figure 9:
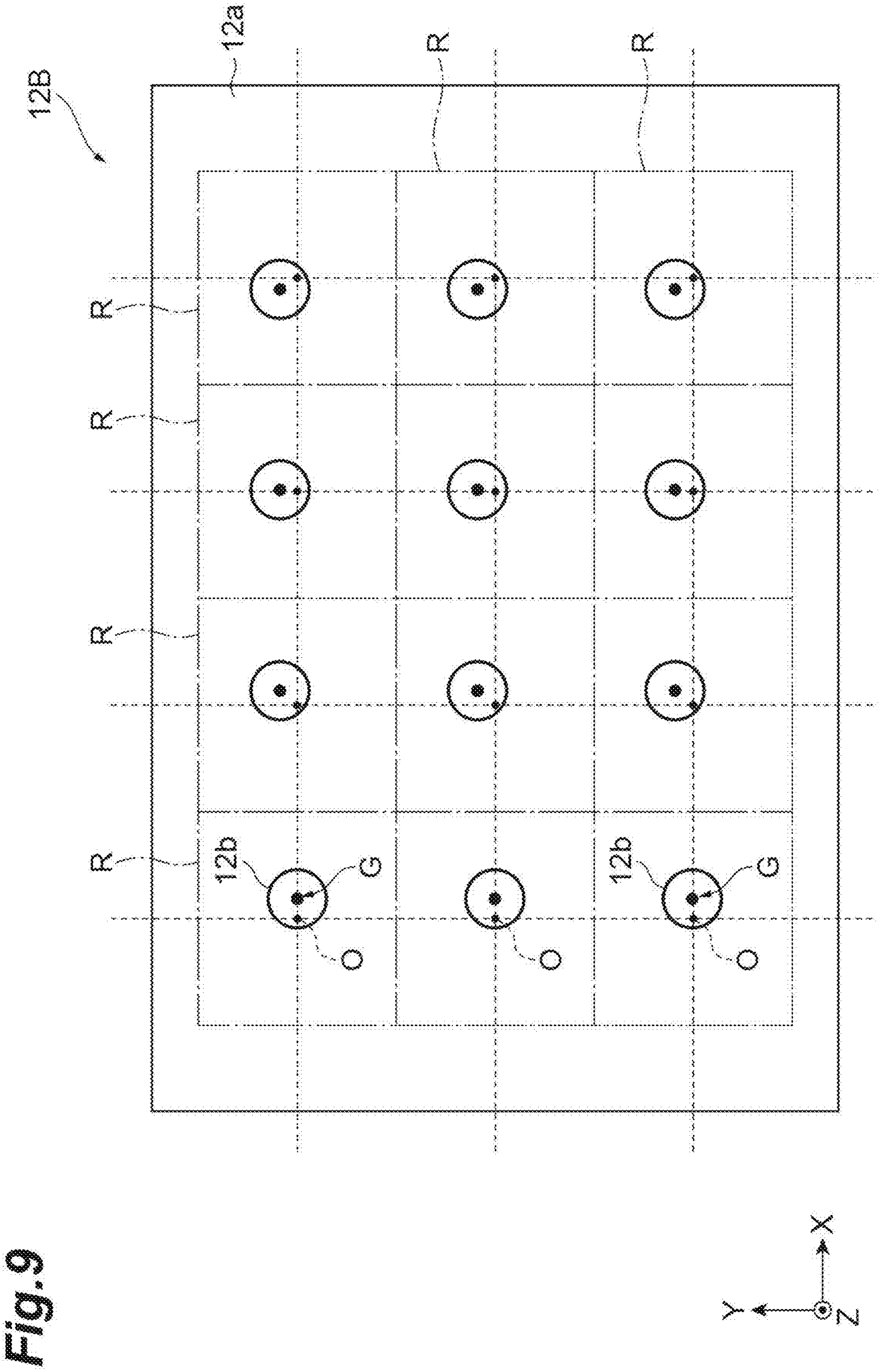

FIG. 9 is a plan view of a phase modulation layer.

Figure 10:
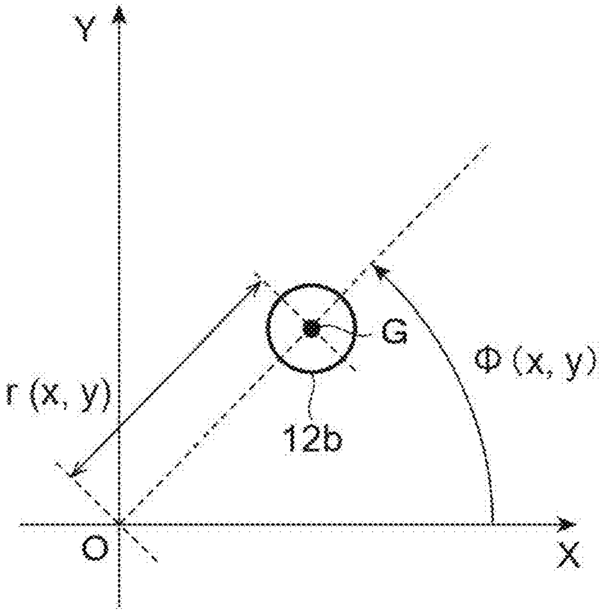

FIG. 10 is an enlarged view of a part of the phase modulation layer.

Figure 11:
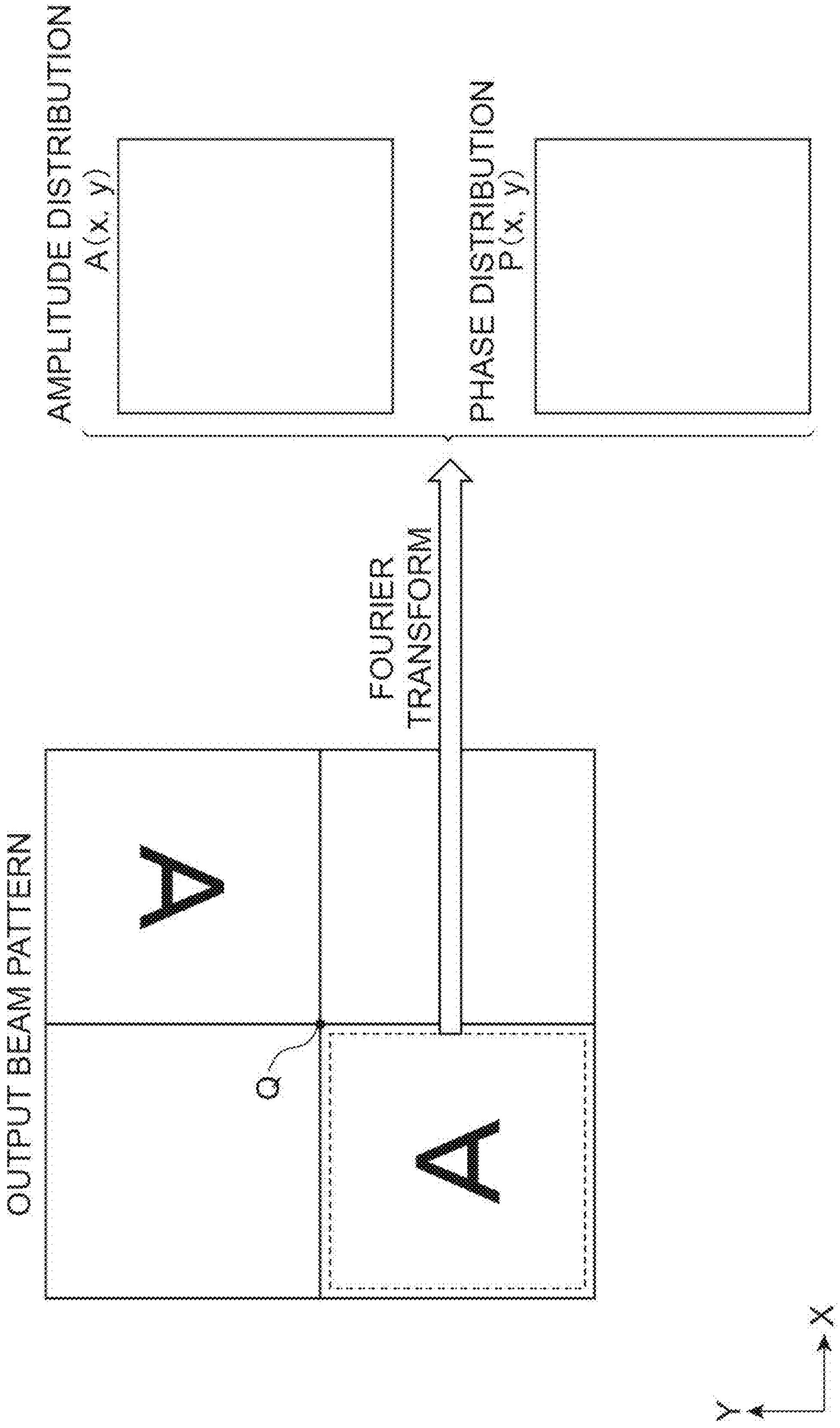

FIG. 11 is a diagram for explaining a relationship between a light image obtained by imaging an output beam pattern of an optical device and a rotation angle distribution in the phase modulation layer.

Figure 12:
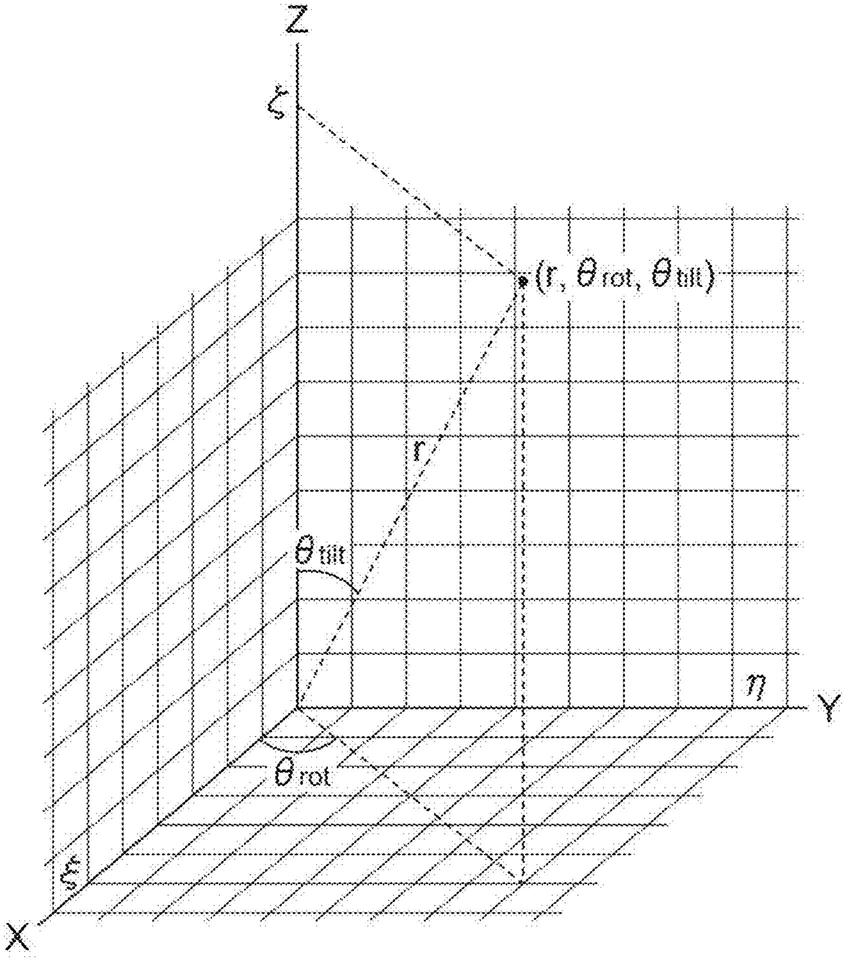

FIG. 12 is a diagram for explaining coordinate transformation from spherical coordinates to coordinates in an XYZ orthogonal coordinate system.

Figure 13:
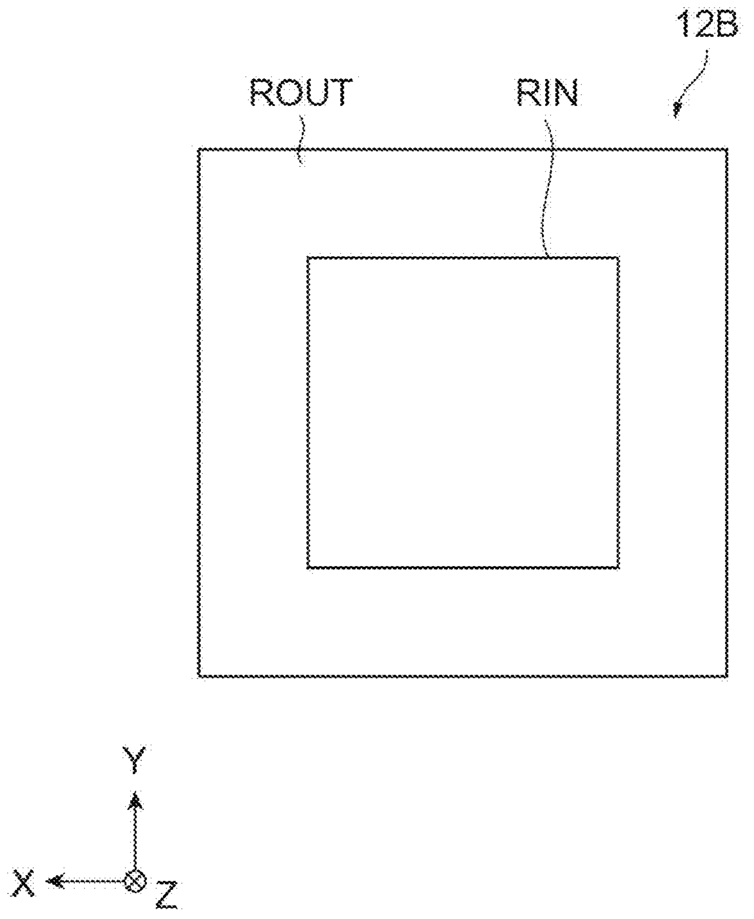

FIG. 13 is a plan view illustrating an example in which the refractive index structure of FIG. 9 is applied to only the inside of a specific region of the phase modulation layer.

Figure 14:
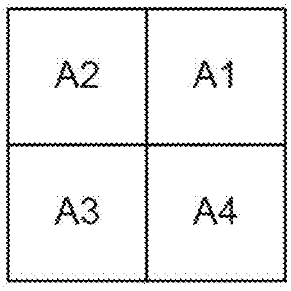
Figure 14:
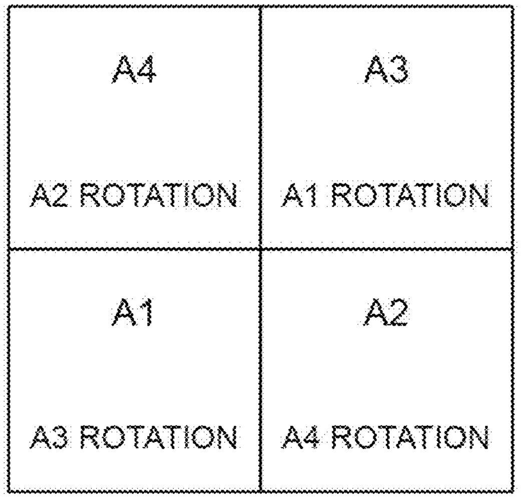

Parts (a) and (b) of FIG. 14 are diagrams for explaining points of attention in a case where calculation is performed using the general discrete Fourier transform or fast Fourier transform when the placement of a plurality of different refractive index regions is determined.

Figure 15:
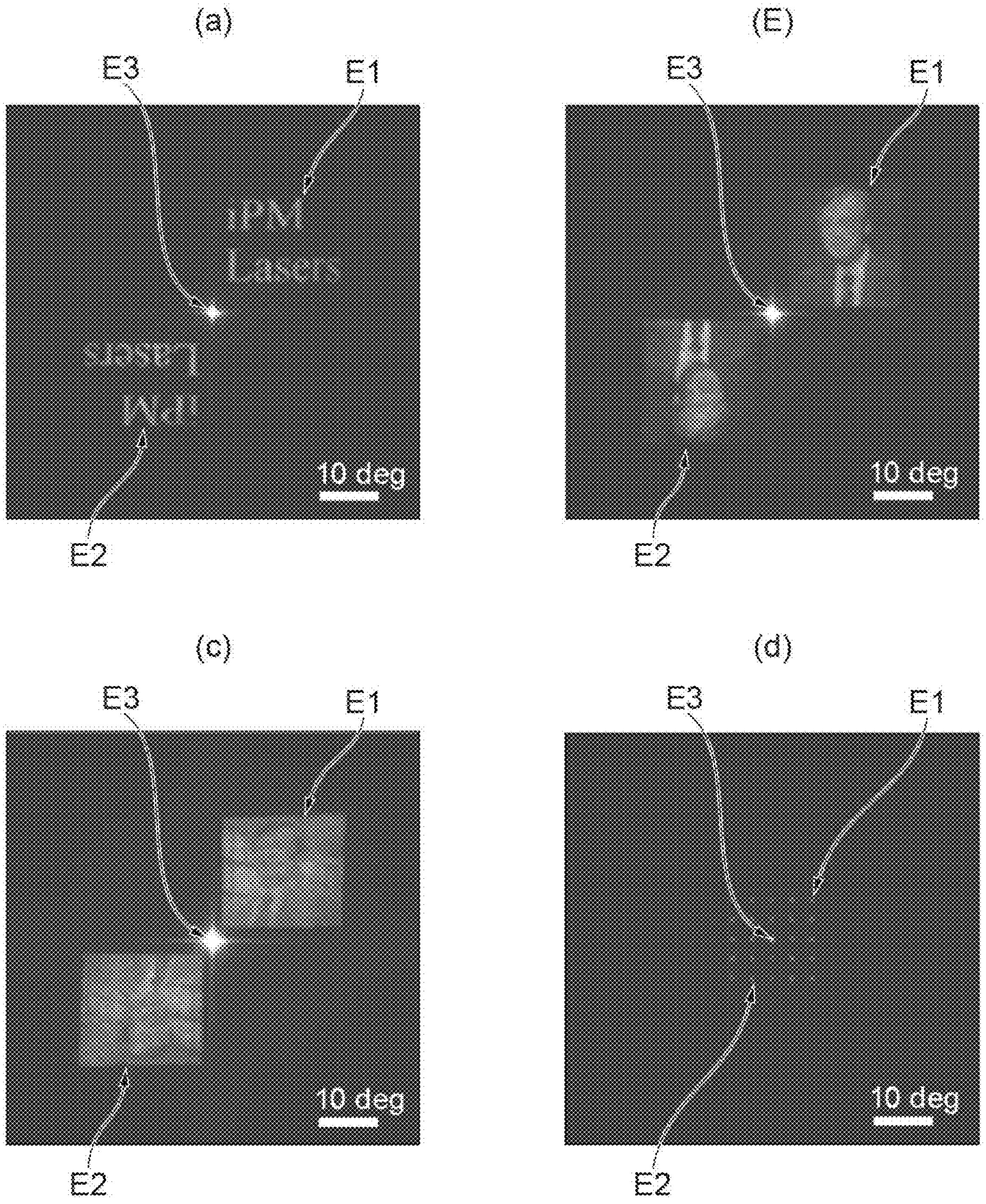

Parts (a) to (d) of FIG. 15 are diagrams showing examples of beam patterns, that is, light images, which are output from a GaAs-based S-iPM laser of a near-infrared wavelength band.

Figure 16:
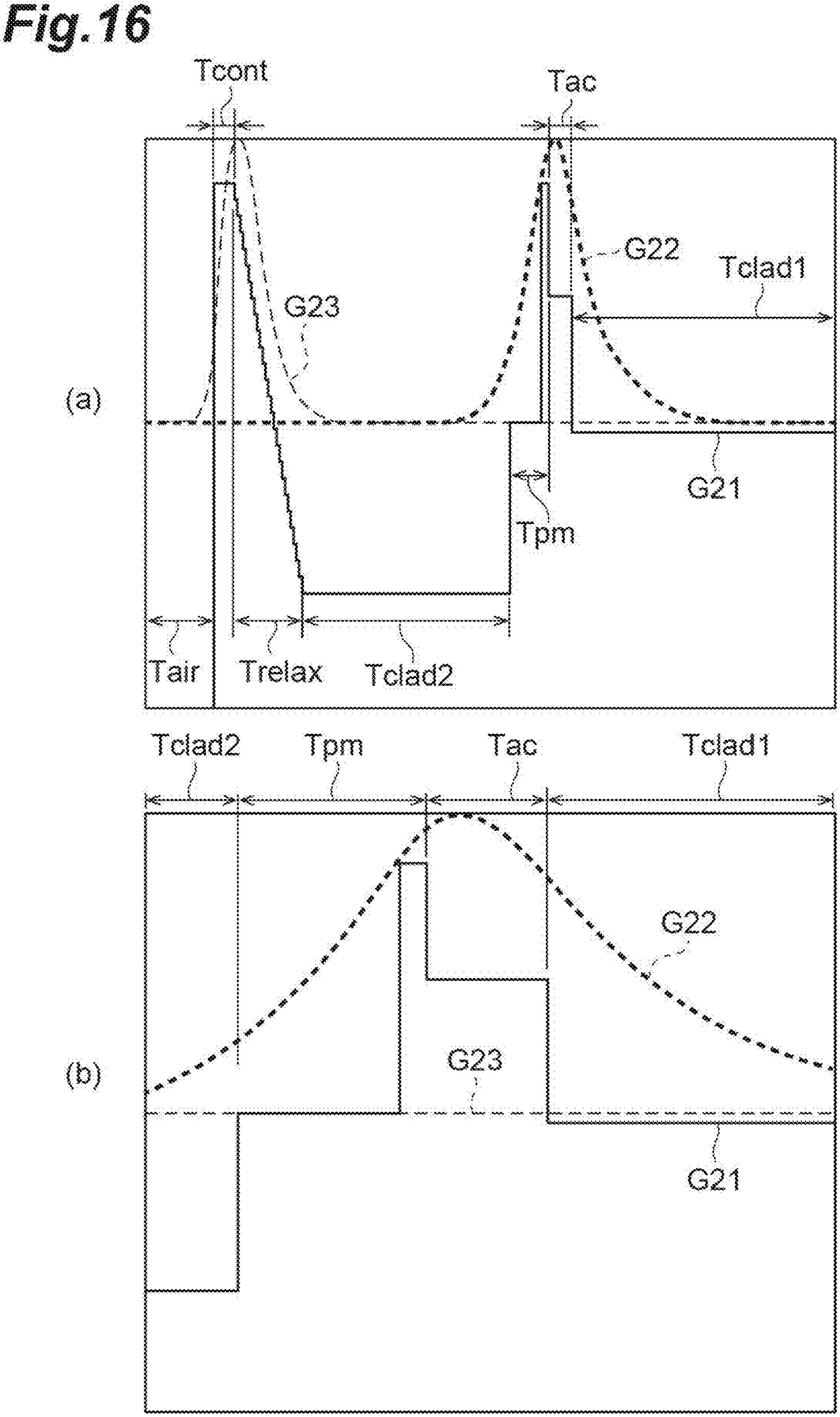

Part (a) of FIG. 16 is a graph illustrating a refractive index distribution of the surface-emitting laser device, a fundamental mode distribution generated around the active layer and the phase modulation layer, and a mode distribution generated around the relaxation layer and a contacting layer. Part (b) of FIG. 16 is a graph illustrating an enlarged view of the vicinity of the active layer and the phase modulation layer in part (a).

Figure 17:
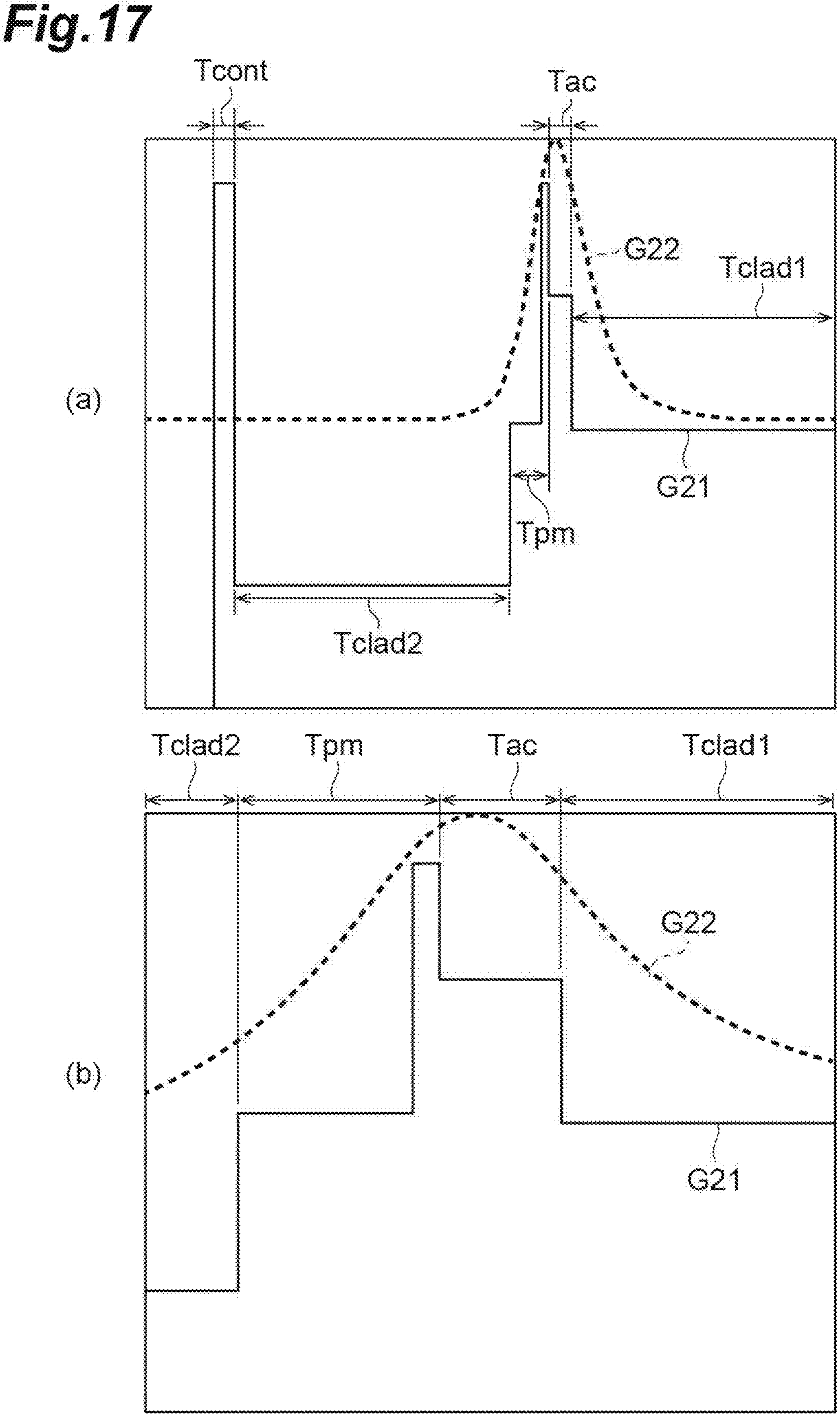

Part (a) of FIG. 17 is a graph illustrating a refractive index distribution and a fundamental mode distribution of the surface-emitting laser device without a relaxation layer. Part (b) of FIG. 17 is a graph illustrating an enlarged view of the vicinity of the active layer and the phase modulation layer in part (a).

Figure 18:
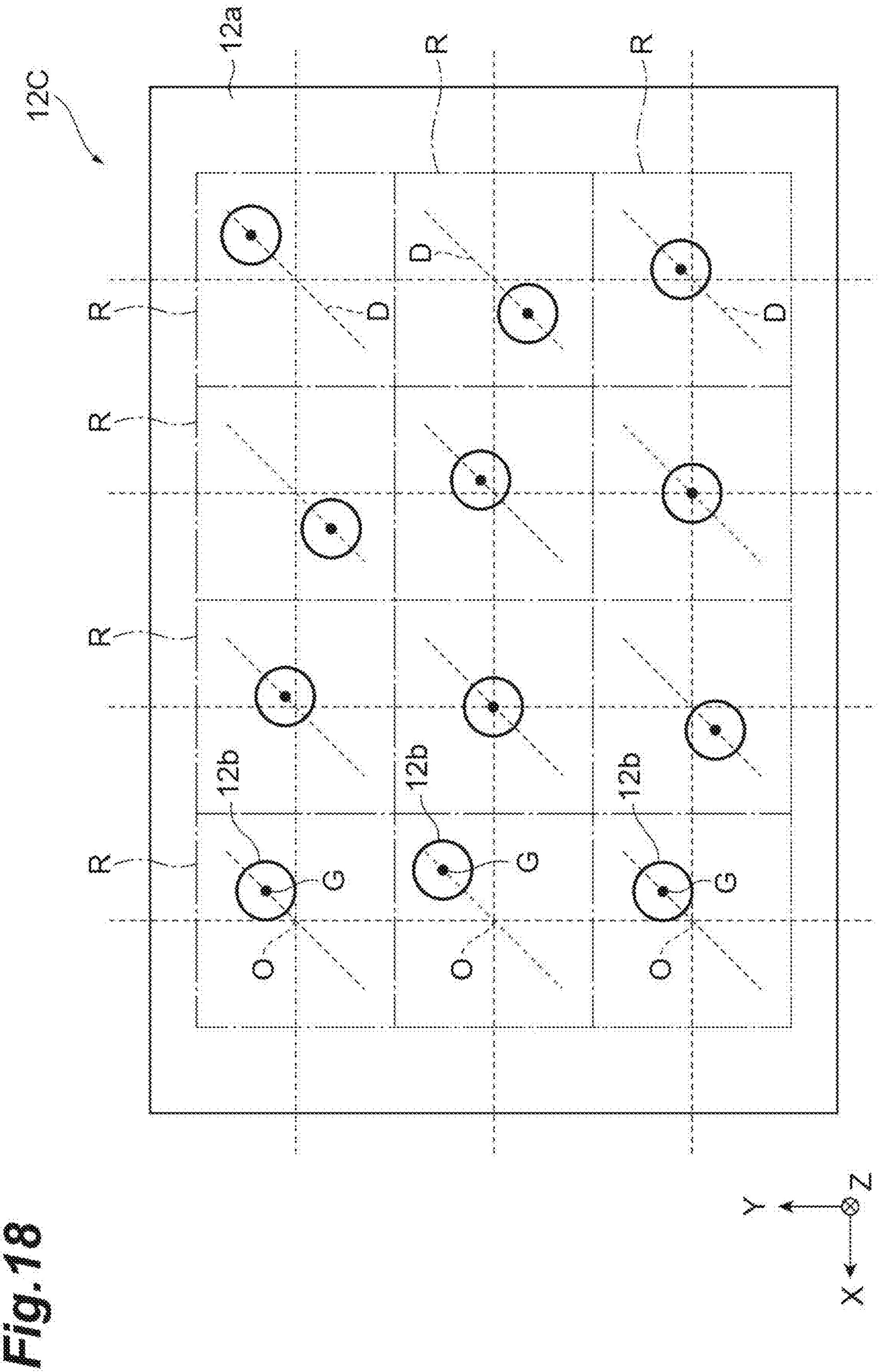

FIG. 18 is a plan view of a phase modulation layer served as a resonance mode forming layer included in an optical device according to a third embodiment.

Figure 19:
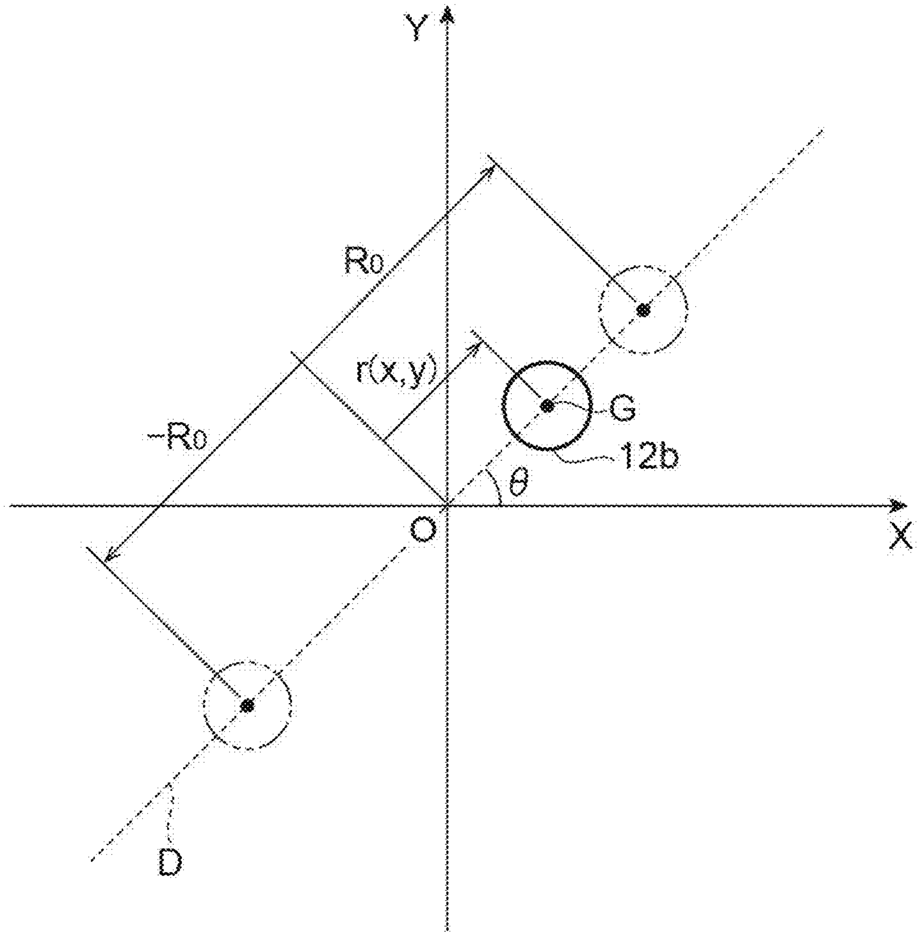

FIG. 19 is a diagram illustrating a positional relationship of different refractive index regions in the phase modulation layer.

Figure 20:
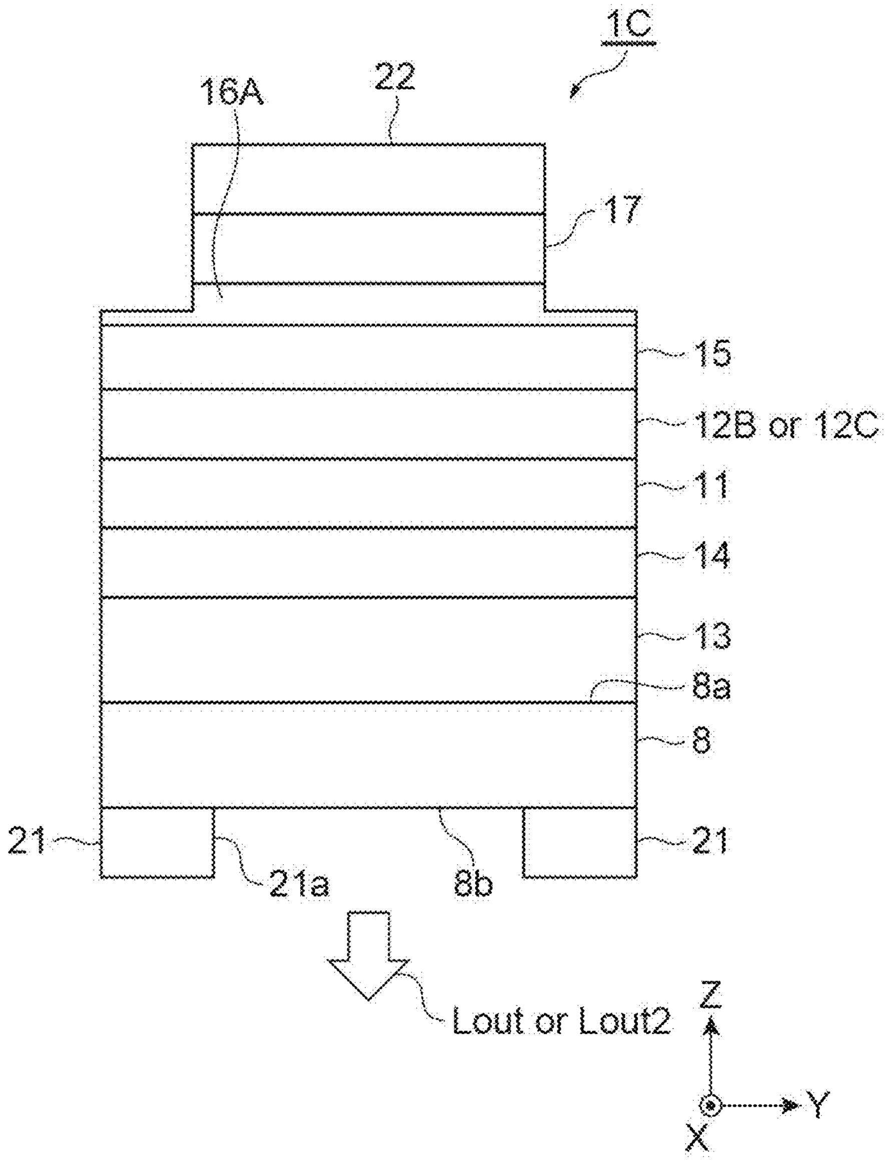

FIG. 20 is a schematic diagram illustrating a cross-sectional configuration of a surface-emitting laser device according to a first modification.

Figure 21:
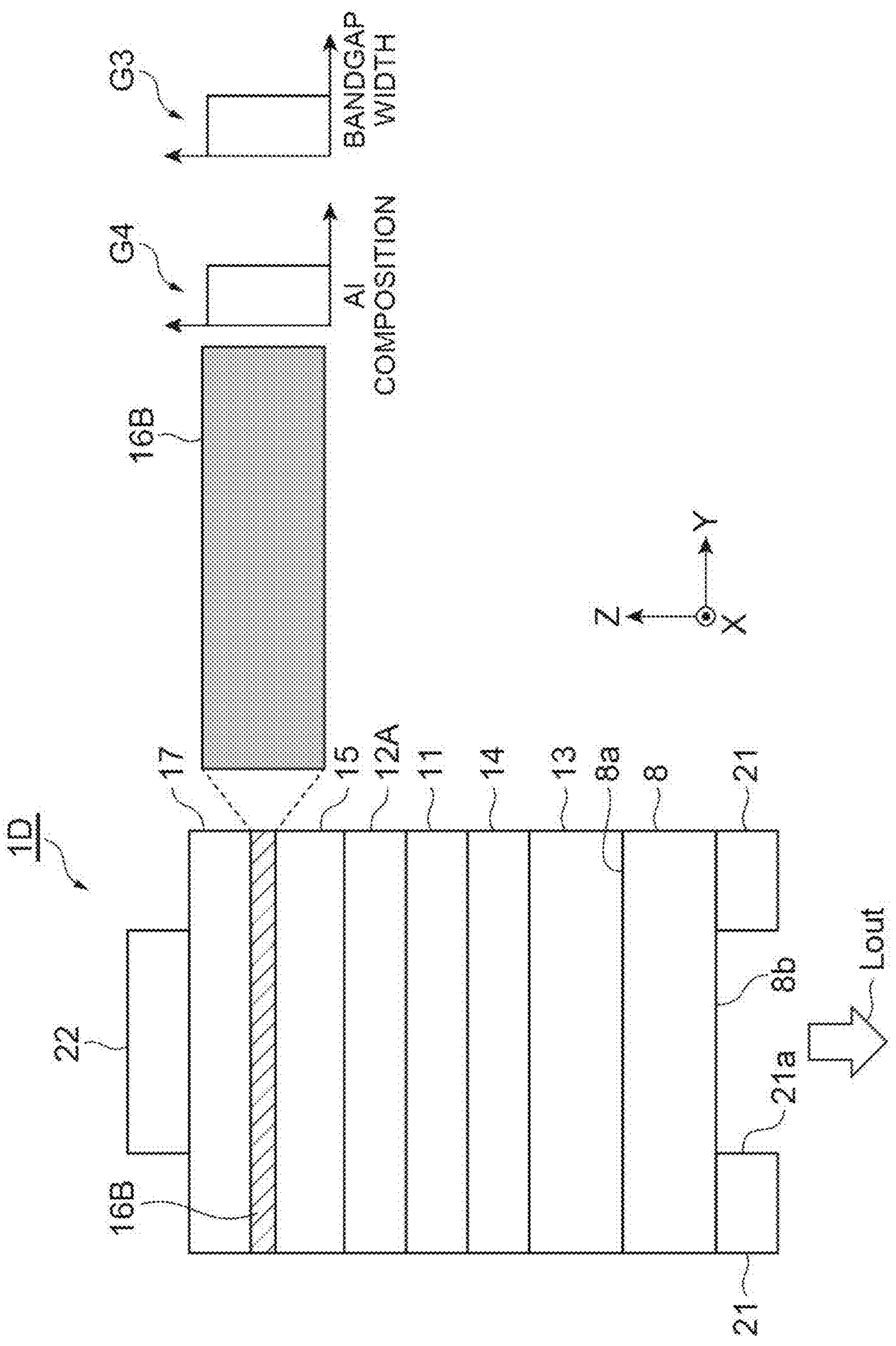

FIG. 21 is a diagram schematically illustrating a cross-sectional configuration of a surface-emitting laser device according to a second modification.

Figure 22:
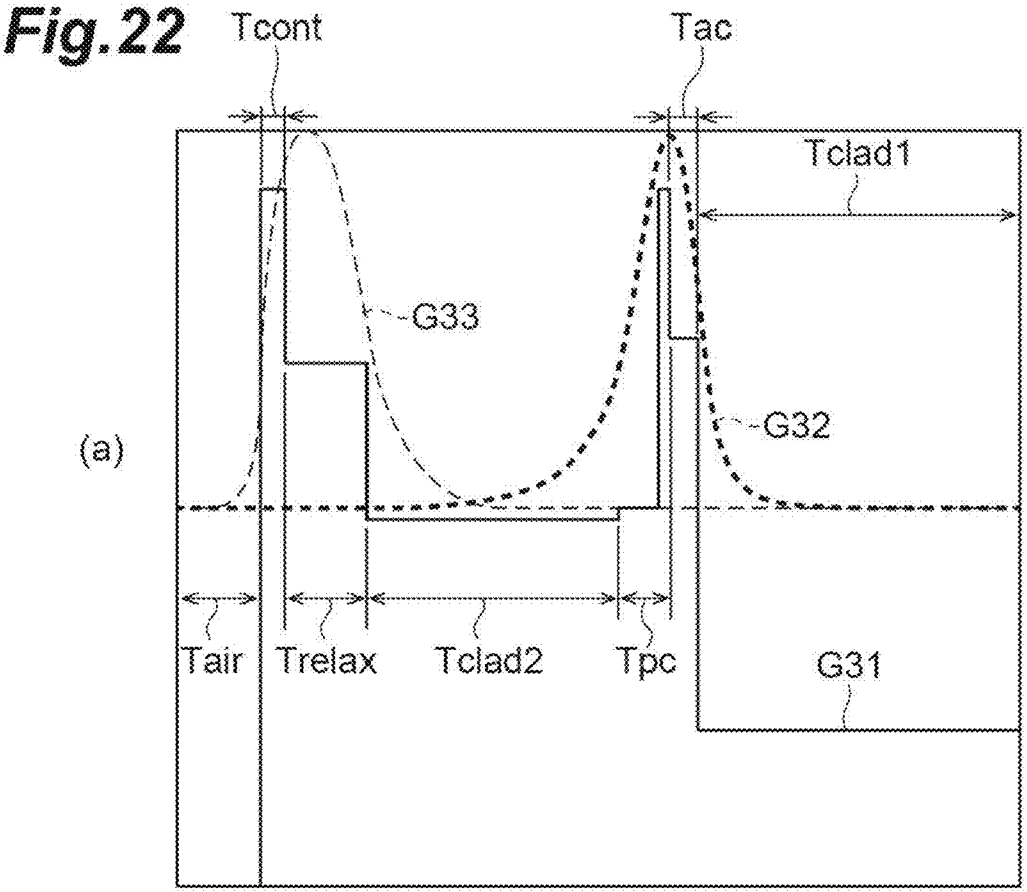
Figure 22:
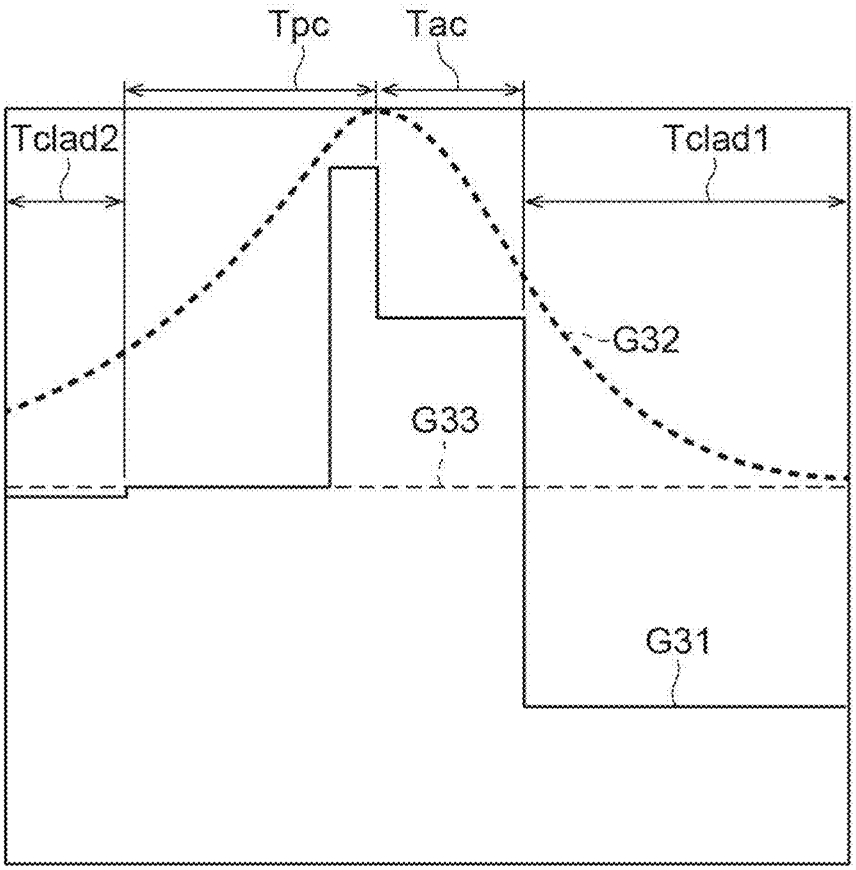

Part (a) of FIG. 22 is a graph illustrating a refractive index distribution of the surface-emitting laser device, a fundamental mode distribution generated around the active layer and the photonic crystal layer, and a mode distribution generated around the relaxation layer and the contacting layer. Part (b) of FIG. 22 is a graph illustrating an enlarged view of the vicinity of the active layer and the photonic crystal layer in part (a).

Figure 23:
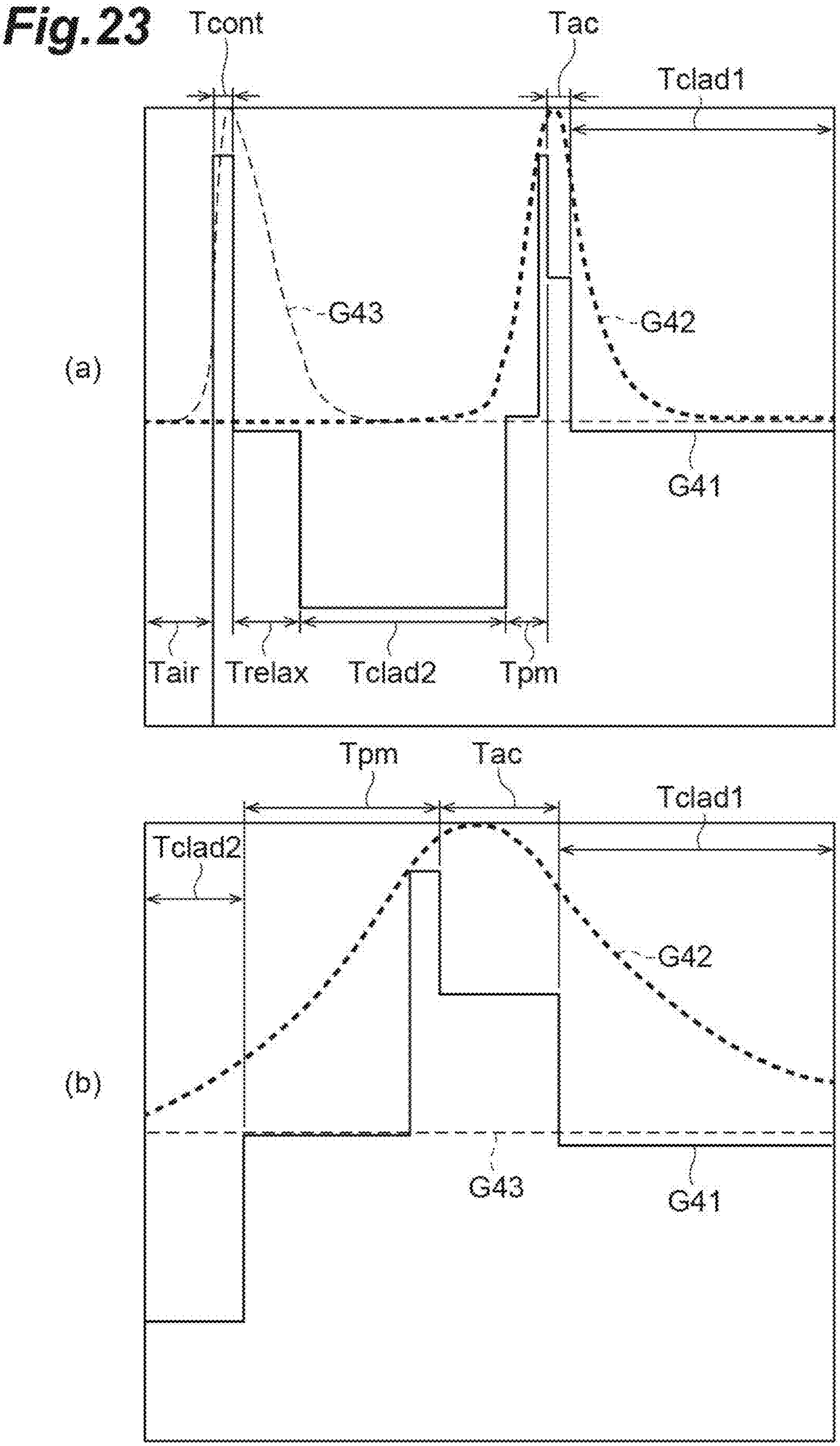

Part (a) of FIG. 23 is a graph illustrating a refractive index distribution of the surface-emitting laser device, a fundamental mode distribution generated around the active layer and the phase modulation layer, and a mode distribution generated around the relaxation layer and the contacting layer. Part (b) of FIG. 23 is a graph illustrating an enlarged view of the vicinity of the active layer and the phase modulation layer in part (a).

Figure 24:
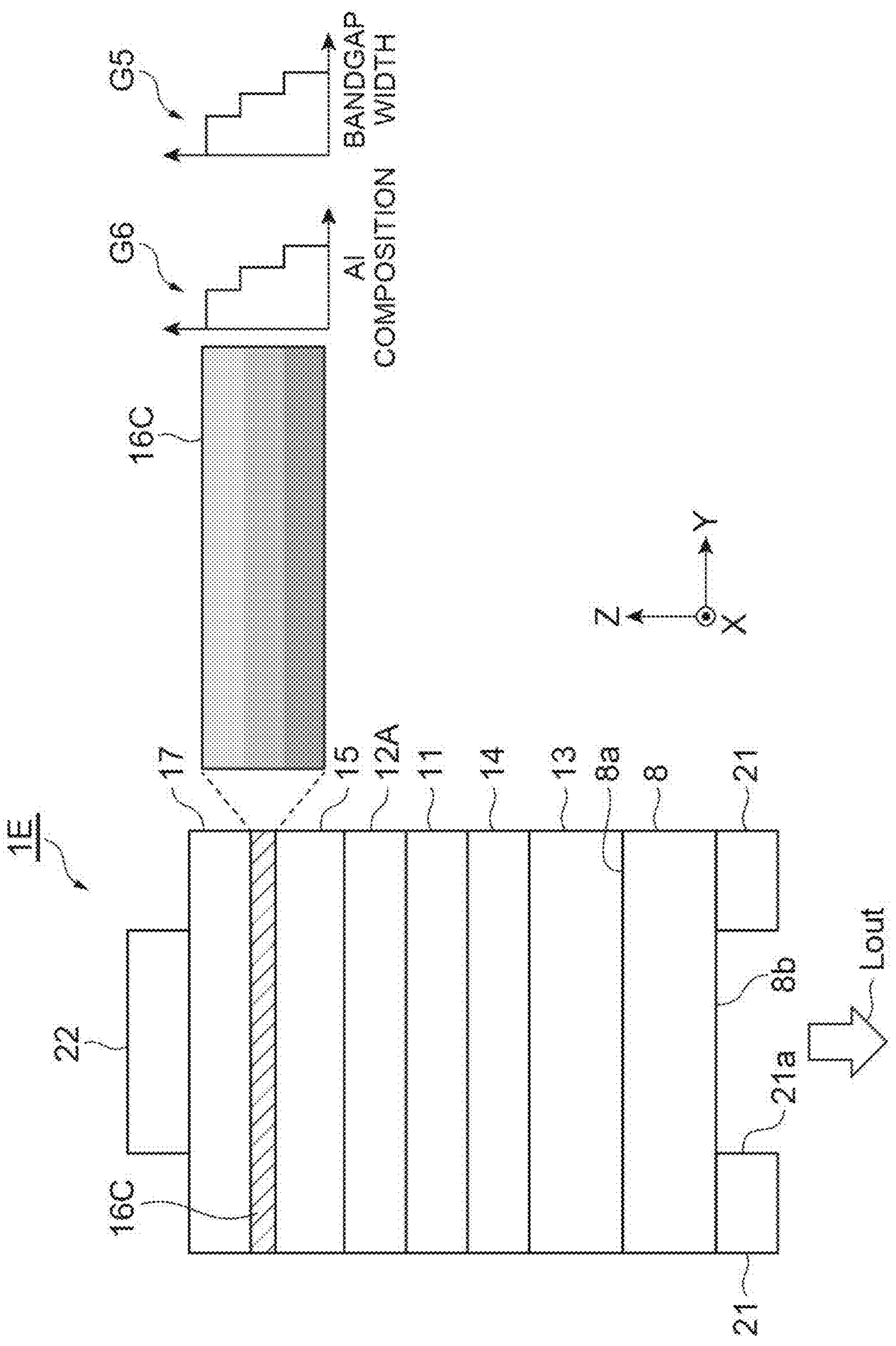

FIG. 24 is a diagram schematically illustrating a cross-sectional configuration of a surface-emitting laser device according to a third modification.

Figure 25:
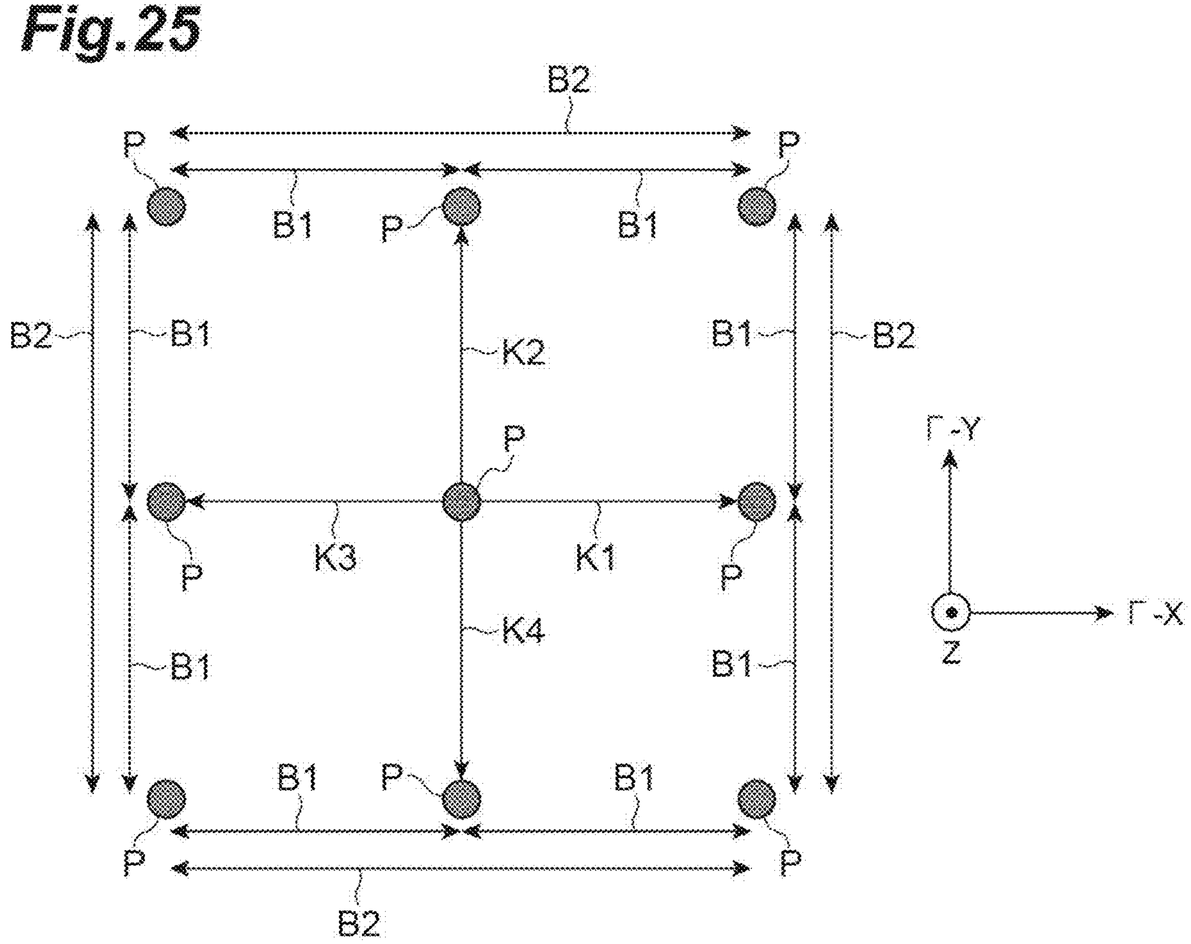

FIG. 25 is a plan view illustrating a reciprocal lattice space for a photonic crystal layer of a PCSEL of Γ-point oscillation.

Figure 26:
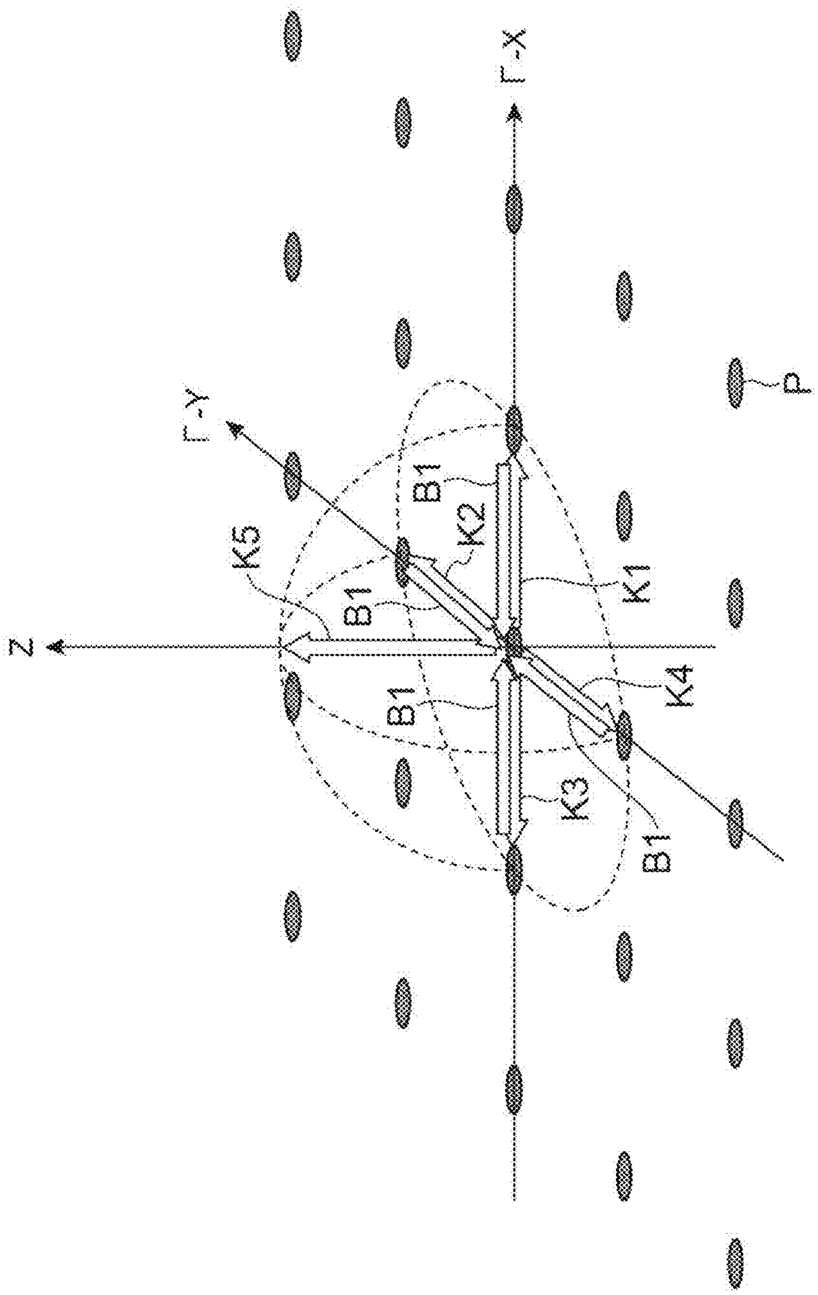

FIG. 26 is a perspective view of the reciprocal lattice space shown in FIG. 25, in a three-dimensional manner.

Figure 27:
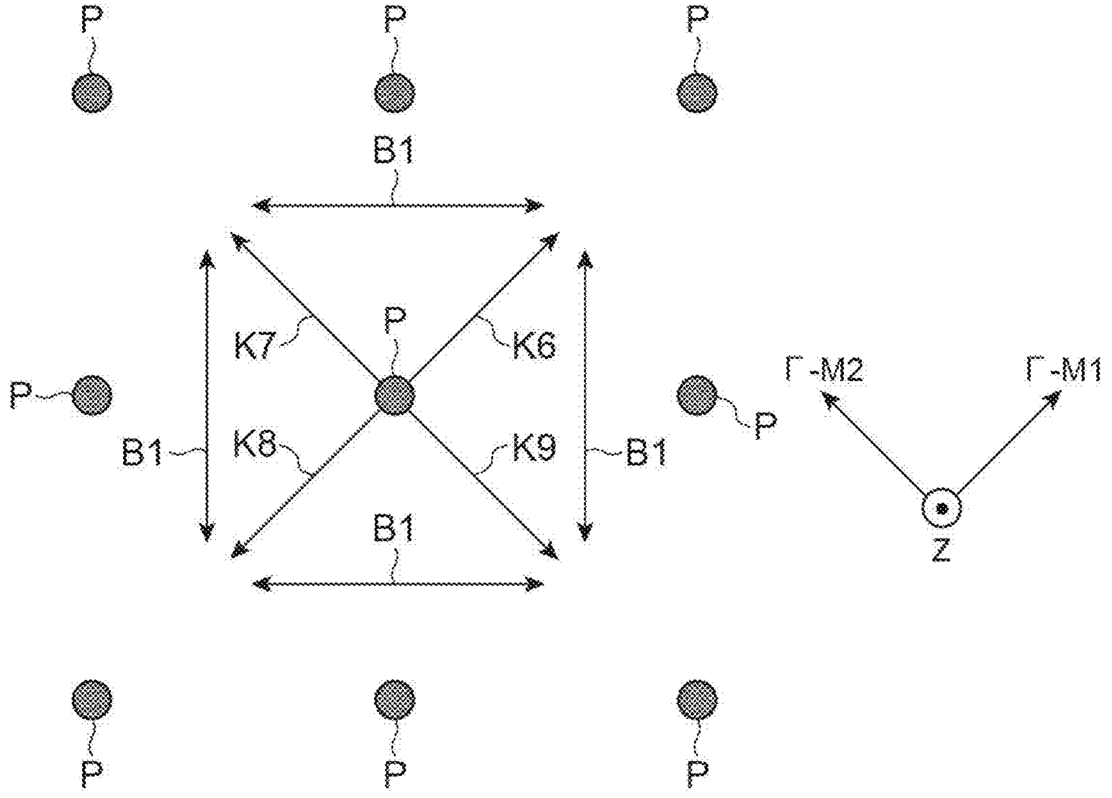

FIG. 27 is a plan view illustrating a reciprocal lattice space for a photonic crystal layer of a PCSEL of M-point oscillation.

Figure 28:
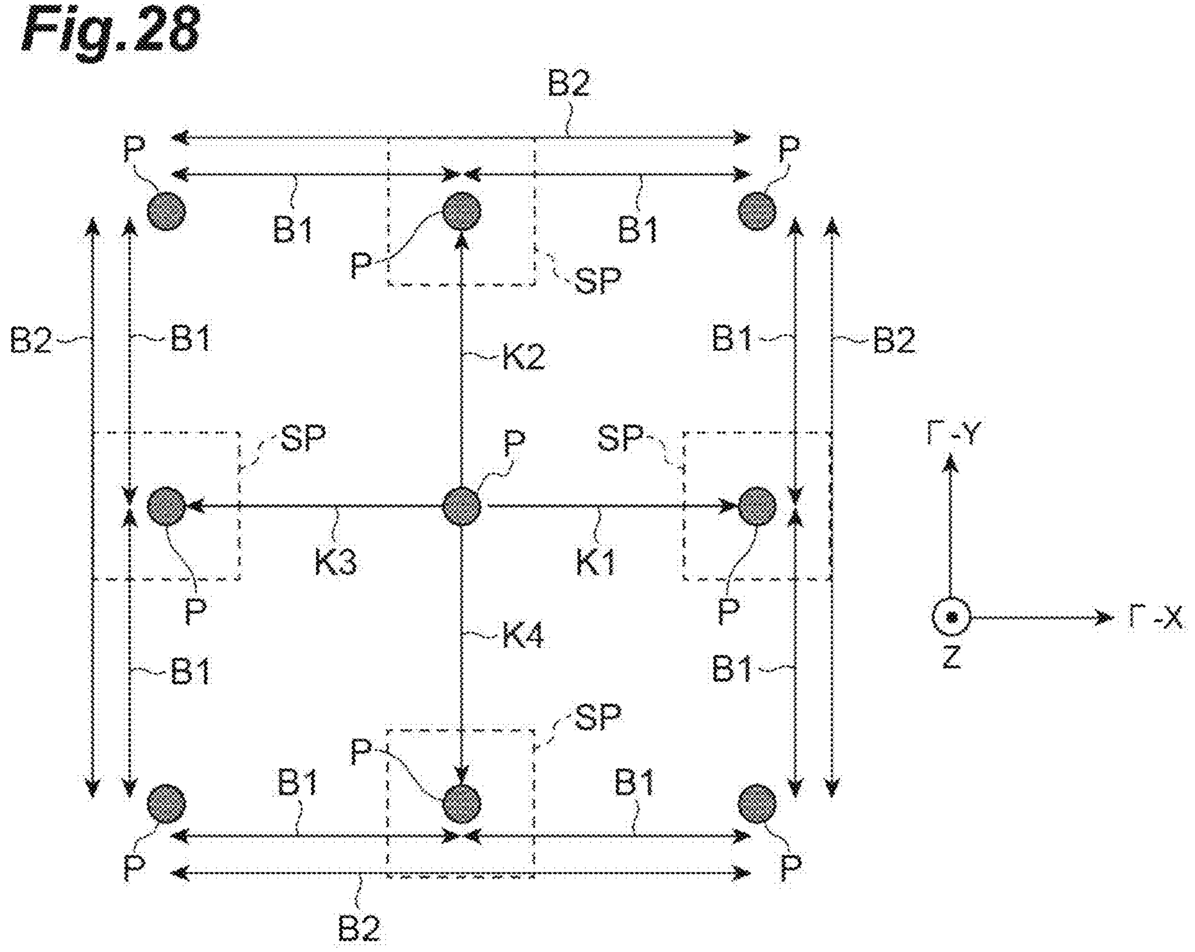

FIG. 28 is a plan view illustrating a reciprocal lattice space for a phase modulation layer of an S-iPM laser of Γ-point oscillation.

Figure 29:
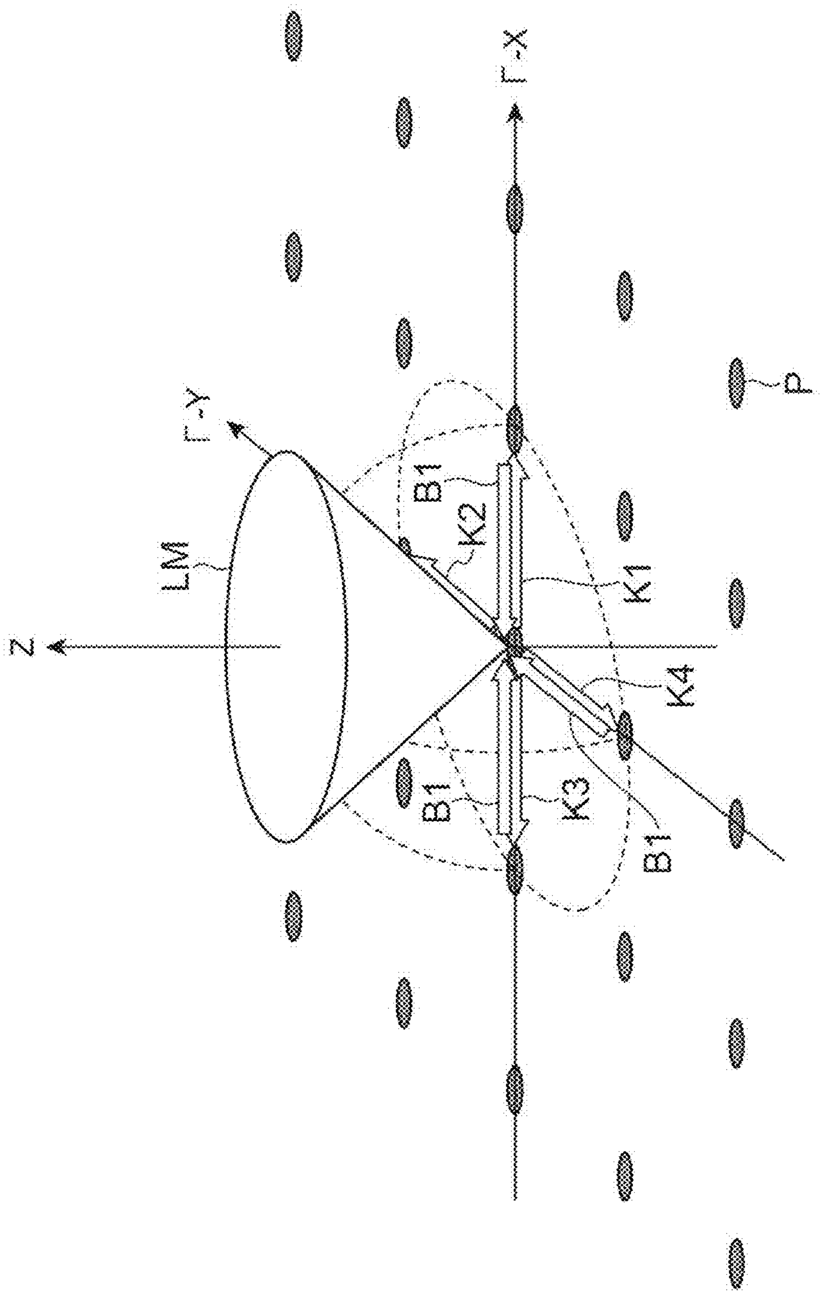

FIG. 29 is a perspective view of the reciprocal lattice space shown in FIG. 28, in a three-dimensional manner.

Figure 30:
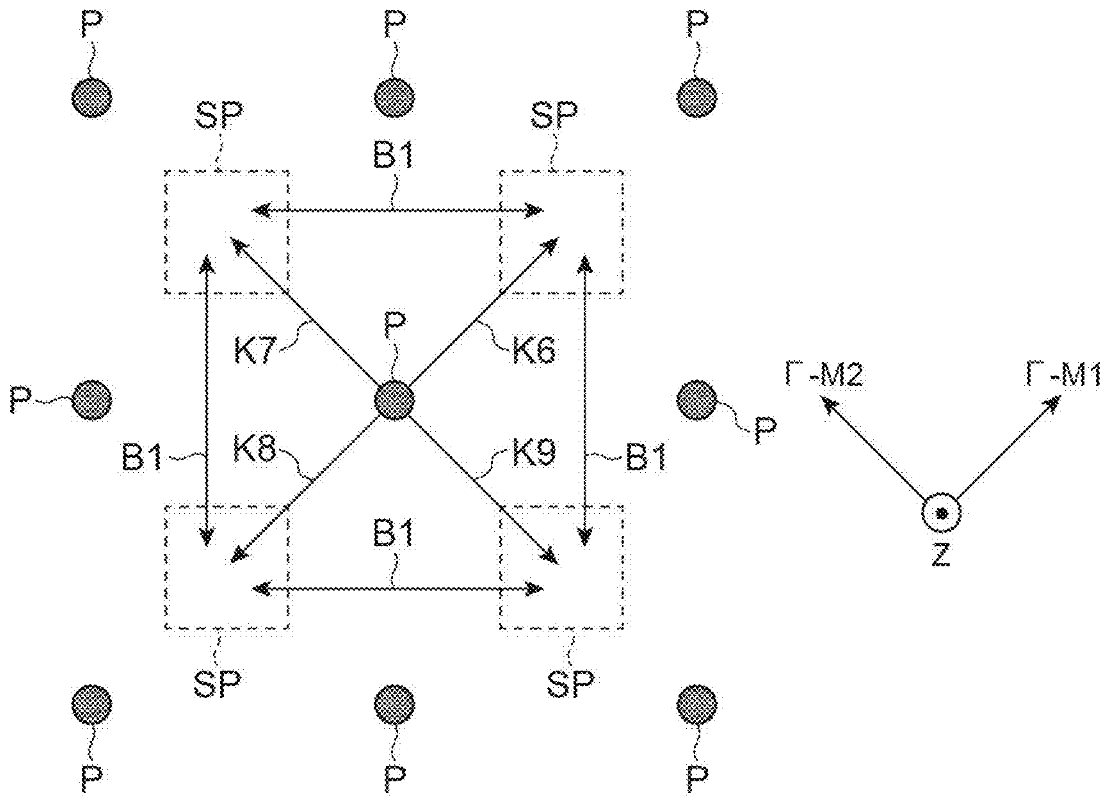

FIG. 30 is a plan view illustrating a reciprocal lattice space for a phase modulation layer of an S-iPM laser of M-point oscillation.

Figure 31:
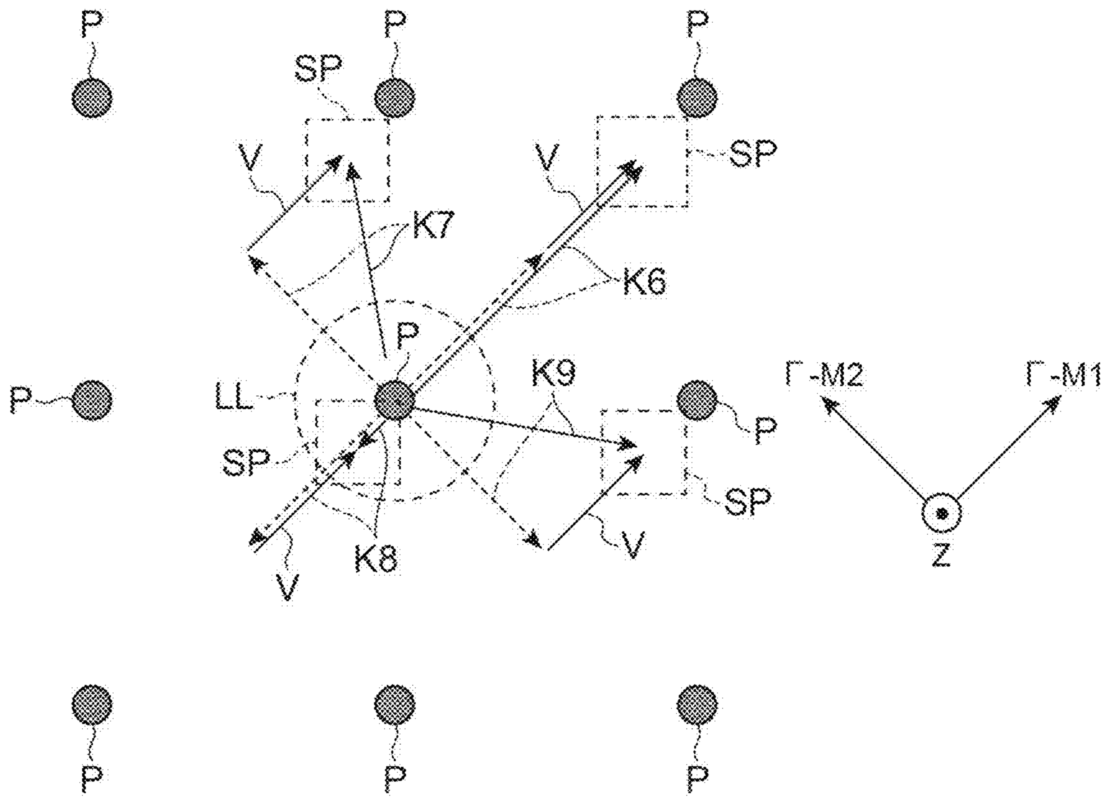

FIG. 31 is a conceptual diagram for explaining an operation of adding a diffraction vector having a certain magnitude and direction to an in-plane wavenumber vector.

Figure 32:
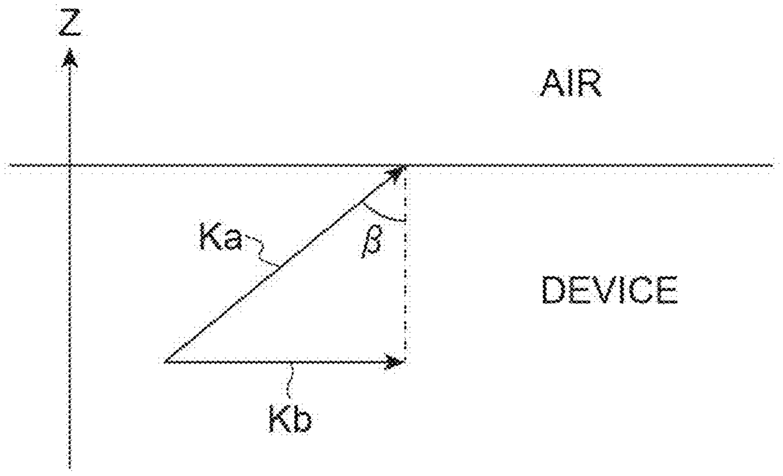

FIG. 32 is a diagram schematically illustrating a peripheral structure of a light line.

Figure 33:
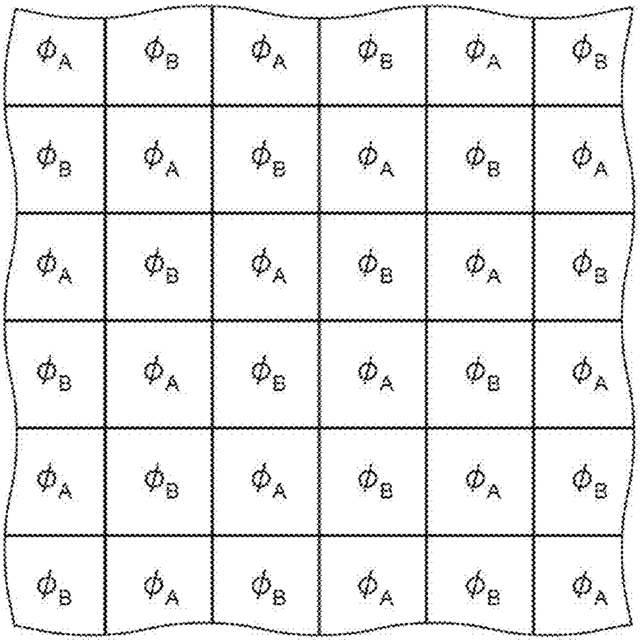

FIG. 33 is a diagram conceptually illustrating an example of a rotation angle distribution.

Figure 34:
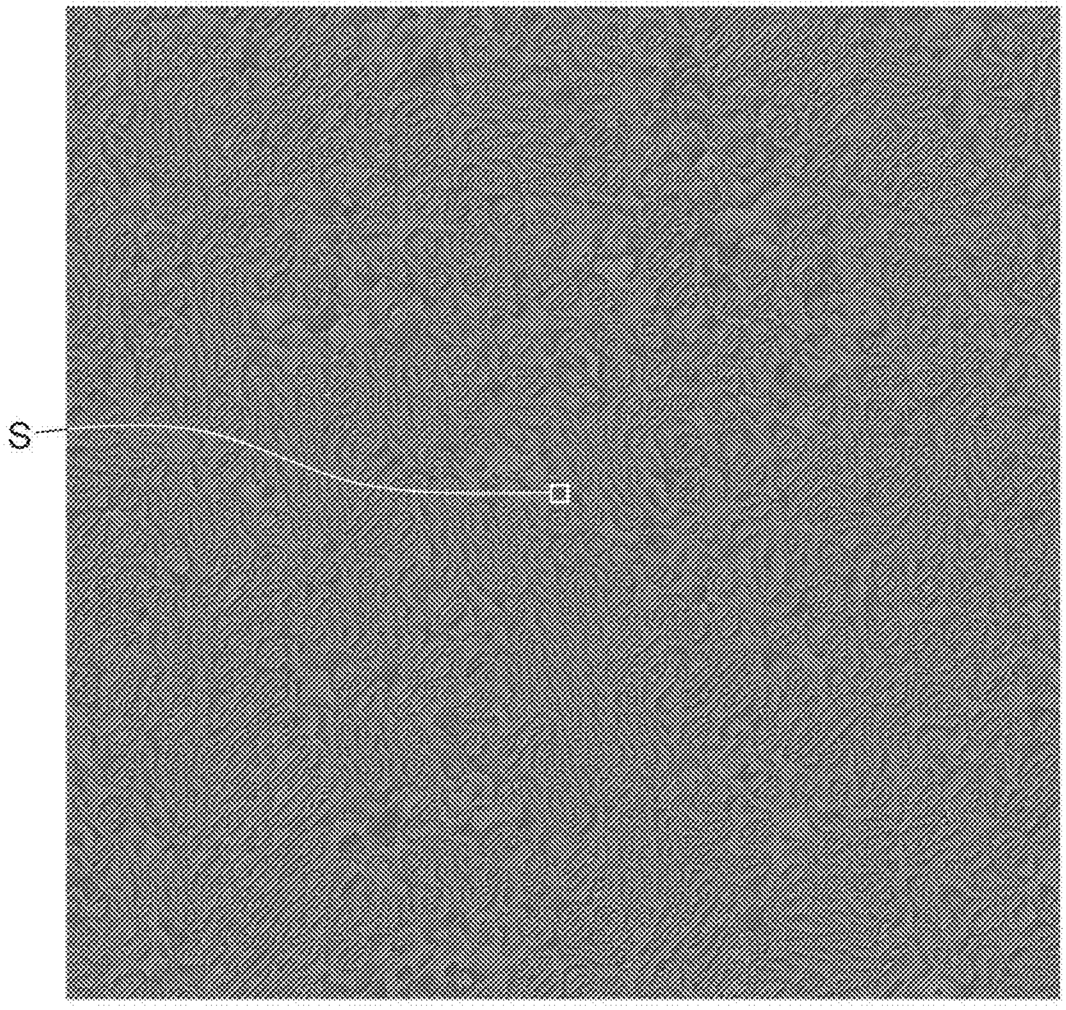

FIG. 34 is a diagram illustrating an example of a rotation angle distribution of the phase modulation layer.

Figure 35:
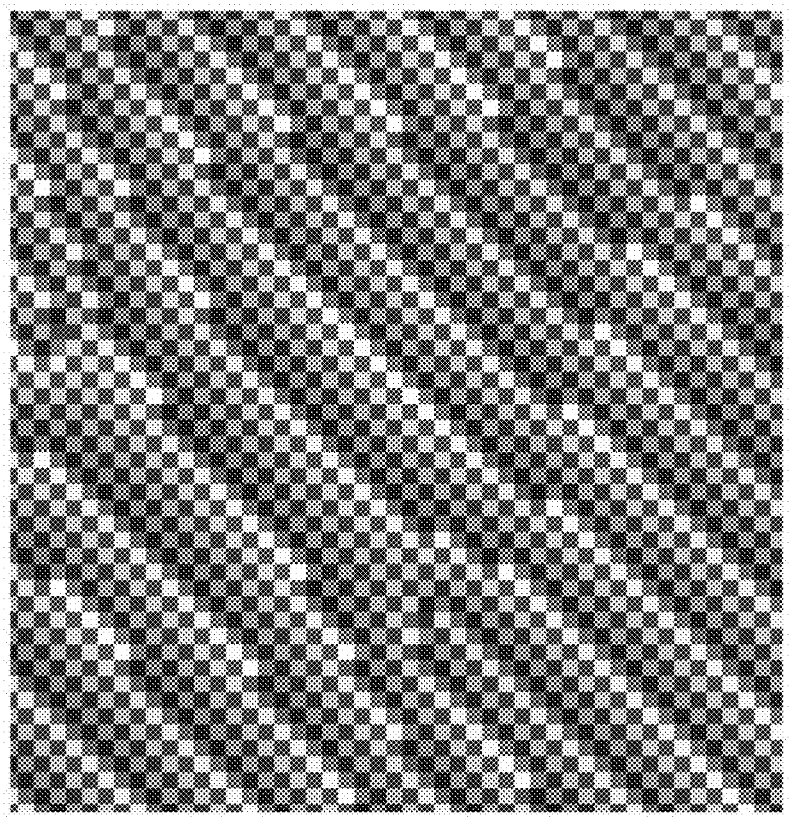

FIG. 35 is an enlarged view of a portion shown in FIG. 34.

Figure 36:
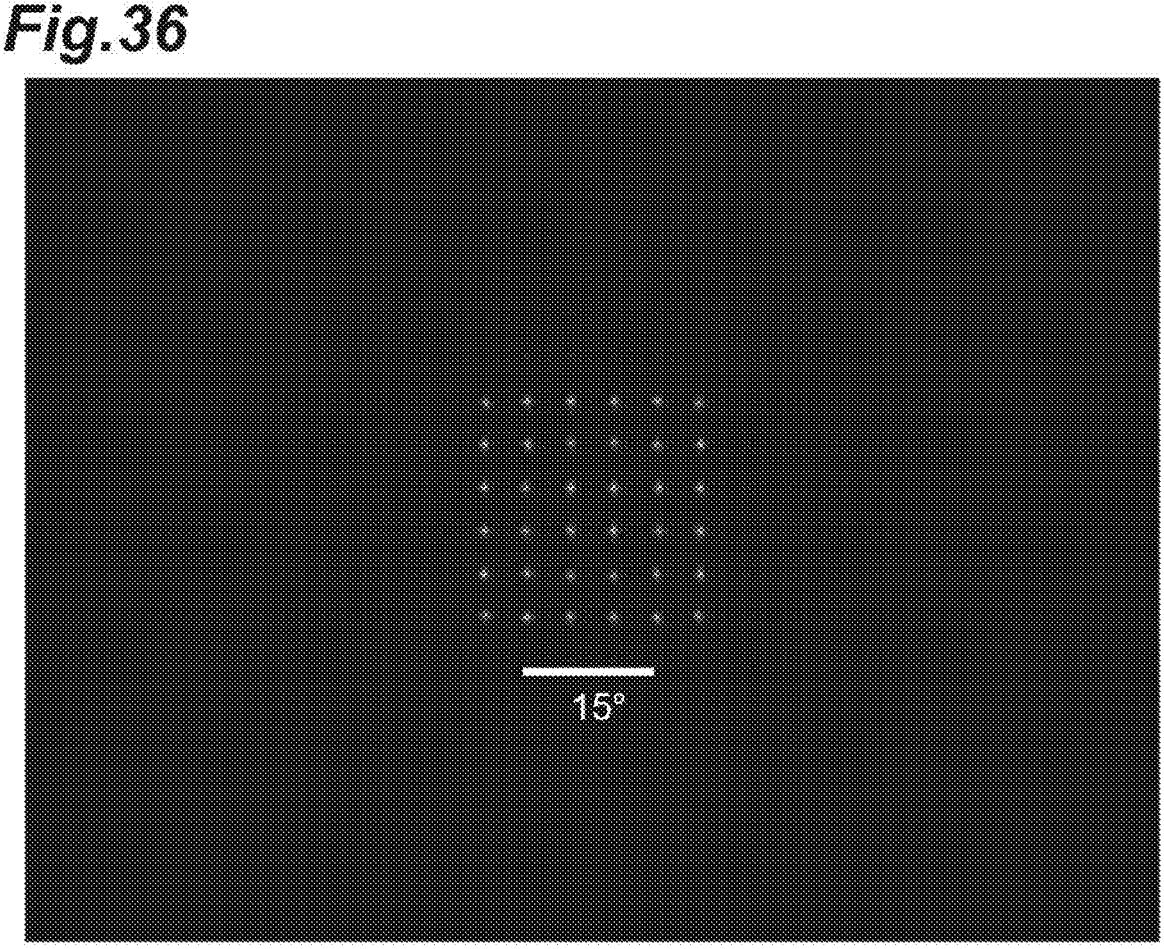

FIG. 36 is a diagram showing a far-field image of a multipoint beam formed in the example.

Figure 37:
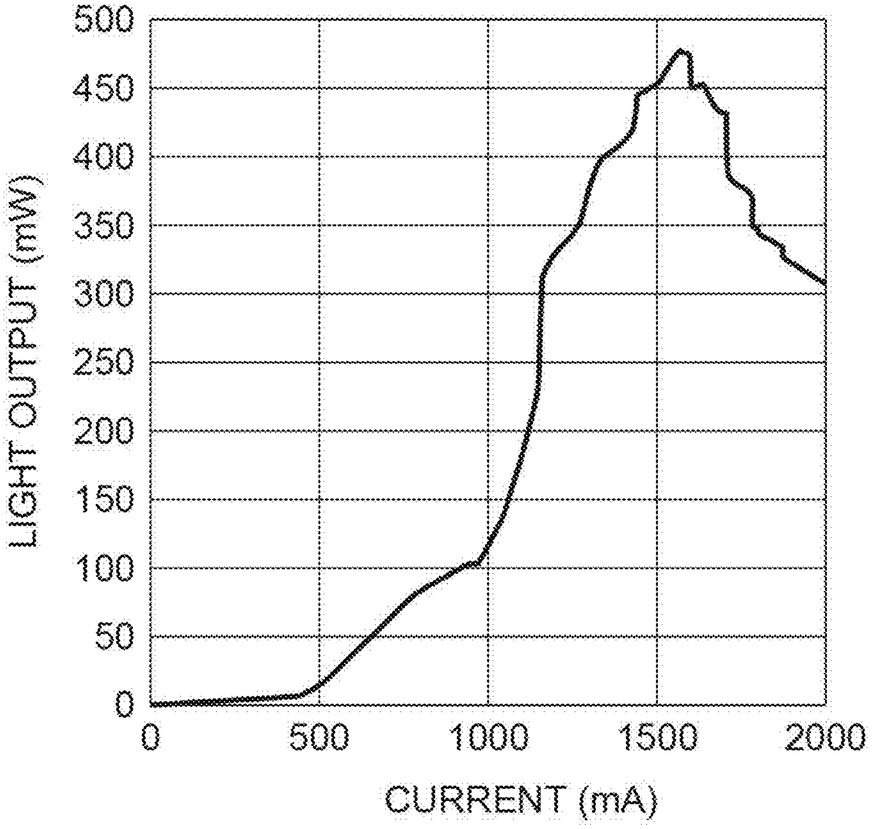

FIG. 37 is a graph illustrating current-optical output characteristics of the fabricated surface-emitting laser device.

Figure 38:
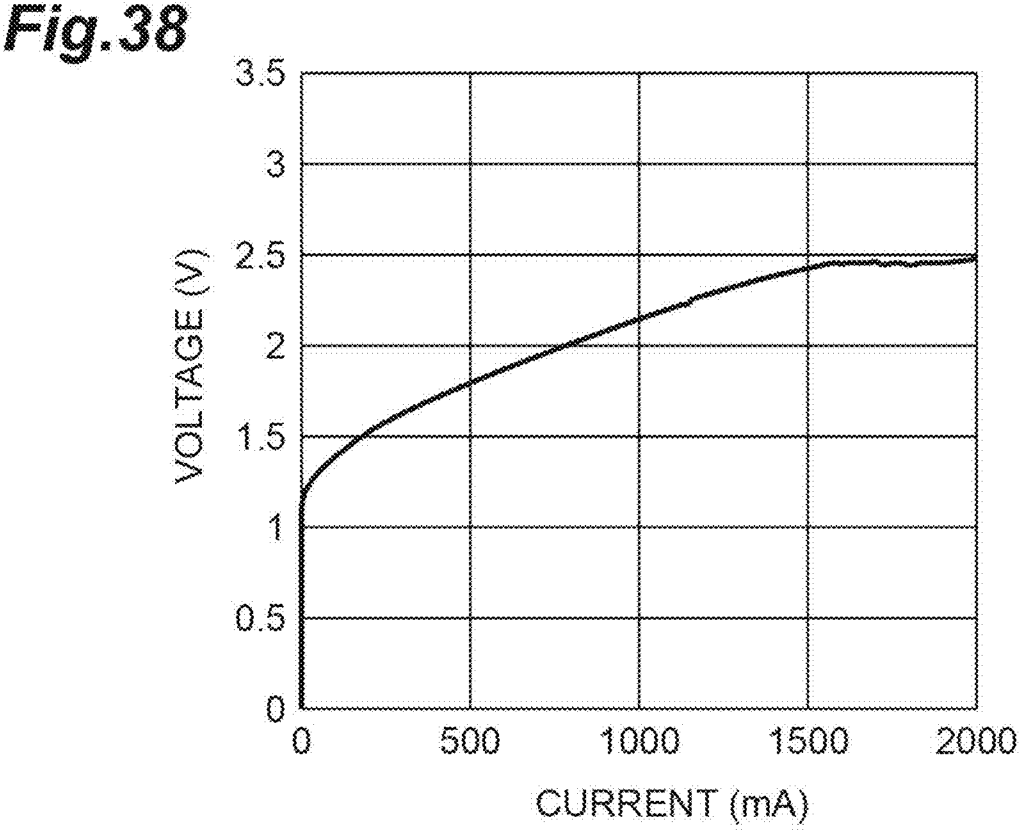

FIG. 38 is a graph illustrating current-voltage characteristics of the fabricated surface-emitting laser device.

Figure 39:
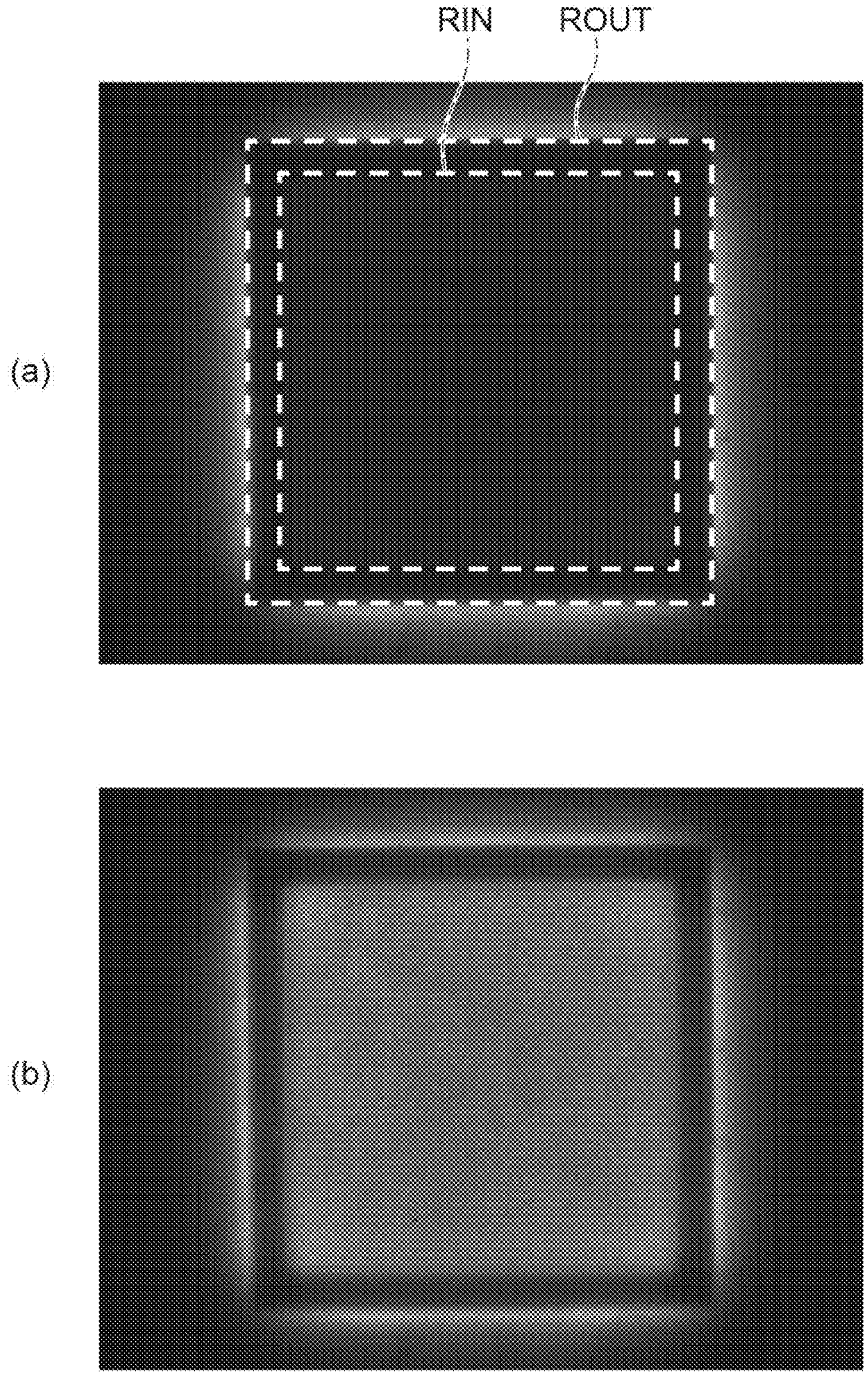

FIG. 39 is a diagram showing a near-field pattern of the example at a low driving current before oscillation. Part (a) of FIG. 39 shows a case where the driving current is 30 mA. Part (b) of FIG. 39 shows a case where the driving current is 100 mA.

Figure 40:
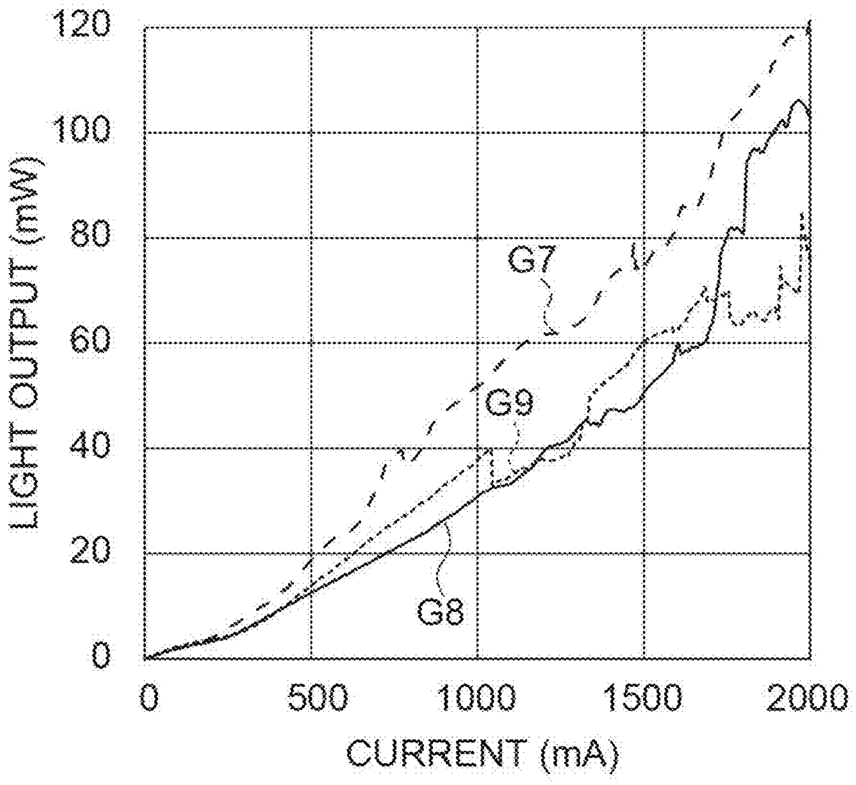
Figure 40:
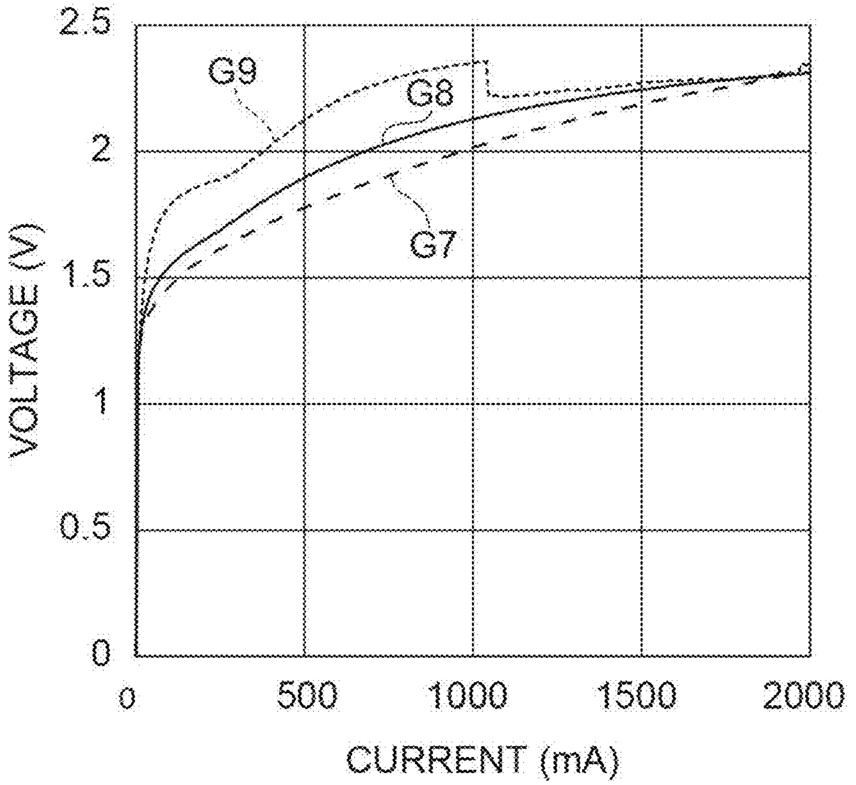

Part (a) of FIG. 40 is a graph illustrating a difference in current-optical output characteristics when the thickness of the relaxation layer is changed. Part (b) of FIG. 40 is a graph illustrating a difference in current-voltage characteristics when the thickness of the relaxation layer is changed.

Figure 41:
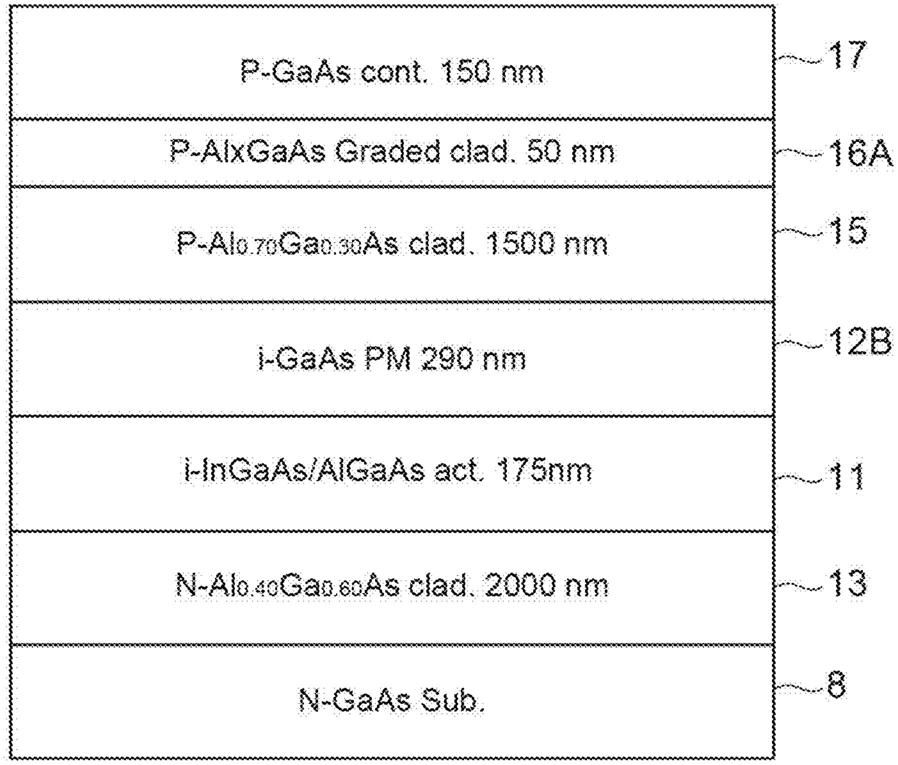

FIG. 41 is a diagram schematically illustrating a manufactured laminated structure.

Figure 42:
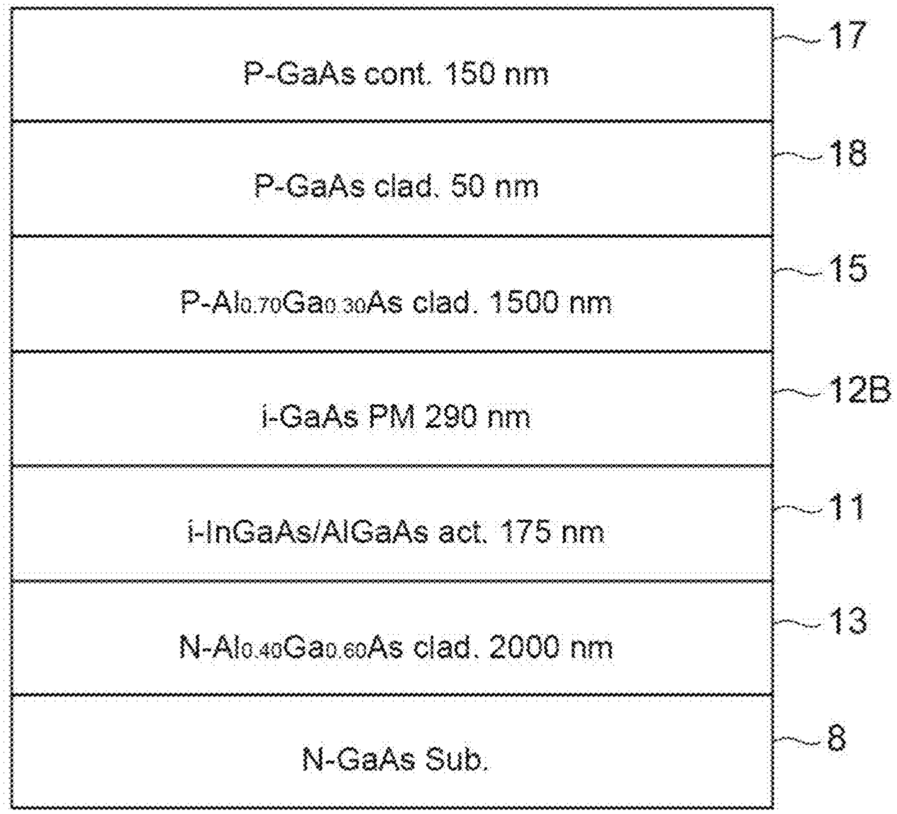
Figure 42:
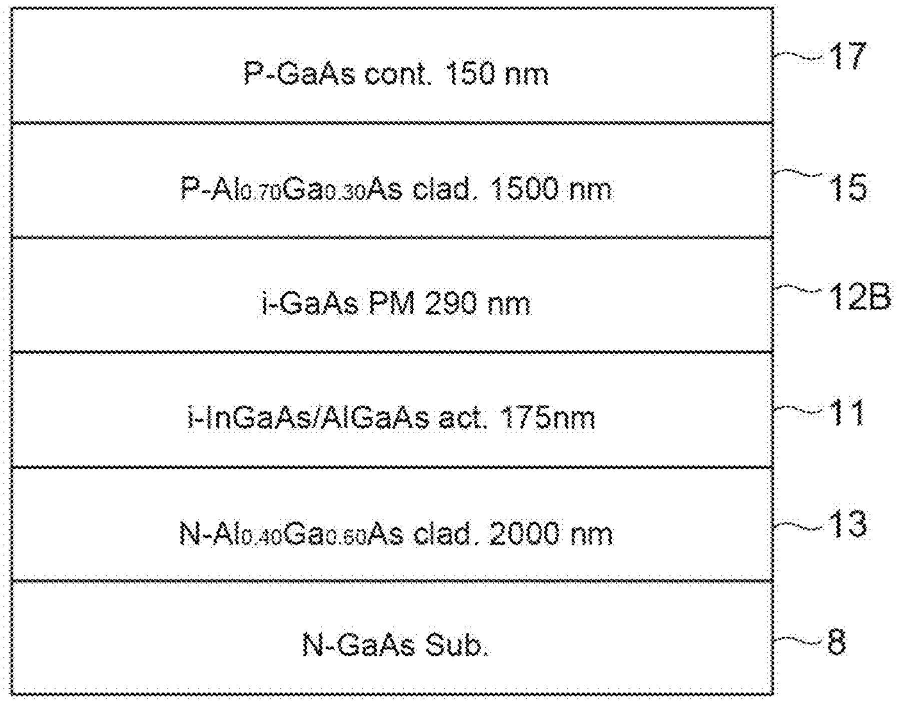

Parts (a) and (b) of FIG. 42 are diagrams schematically illustrating manufactured laminated structures.

DESCRIPTION OF EMBODIMENTS

A surface-emitting laser device of the present disclosure includes a first electrode, a first cladding layer of a first conductivity type electrically connected to the first electrode, an active layer provided on the first cladding layer, a second cladding layer of a second conductivity type provided on the active layer, a relaxation layer of a second conductivity type provided on the second cladding layer, a contacting layer of a second conductivity type provided on the relaxation layer and having a bandgap different from that of the second cladding layer, a second electrode provided on the contacting layer and forming ohmic contact with the contacting layer, and a resonance mode forming layer. The resonance mode forming layer is provided between the first cladding layer and the active layer or between the active layer and the second cladding layer. The resonance mode forming layer includes a basic region and a plurality of different refractive index regions. The plurality of different refractive index regions have a refractive index different from that of the basic region and are distributed two-dimensionally in a plane perpendicular to the thickness direction. The resonance mode forming layer forms a resonance mode of light in the plane. The relaxation layer has a bandgap width that is between the bandgap width of the second cladding layer and the bandgap width of the contacting layer.

In this surface-emitting laser device, when a voltage is applied between the first electrode and the second electrode, a current flows between the first electrode and the second electrode. The active layer converts this current into light. The light output from the active layer is confined between the first cladding layer and the second cladding layer and is diffracted by the resonance mode forming layer. In the resonance mode forming layer, a resonance mode is formed in an in-plane direction perpendicular to the thickness direction of the resonance mode forming layer, and a laser beam with a mode corresponding to the arrangement of the plurality of different refractive index regions is generated. The laser beam travels in the thickness direction of the resonance mode forming layer and is emitted outside the surface-emitting laser device.

This surface-emitting laser device includes the relaxation layer between the second cladding layer and the contacting layer. The relaxation layer has a bandgap that is between the bandgap of the second cladding layer and the bandgap of the contacting layer. Therefore, as compared with a case where the relaxation layer is not provided, the change rate in the bandgap occurring between the cladding layer and the contacting layer is relaxed and a potential barrier is reduced. Therefore, the electric resistance of the device is lowered, and thus sufficient laser oscillation can be obtained even at a low drive voltage. As a result, it is possible to reduce power consumption and to improve the reliability of the device.

In the above surface-emitting laser device, the resonance mode forming layer may be a photonic crystal layer in which the plurality of different refractive index regions are periodically arrayed. In this case, the light output from the active layer is diffracted by the photonic crystal layer. In the photonic crystal layer, a resonance mode is formed in an in-plane direction perpendicular to the thickness direction of the photonic crystal layer, light oscillates at a wavelength corresponding to the array period of the plurality of different refractive index regions, and a laser beam is generated. For example, in a case where the array period is set to the length of one wavelength of light in a square lattice crystal, a part of the laser beam is diffracted in the thickness direction of the photonic crystal layer and is emitted outside the surface-emitting laser device.

The above surface-emitting laser device may be a surface-emitting laser device that outputs a light image, that is, an iPM laser. Each of the centers of gravity of the plurality of different refractive index regions may be located away from the corresponding lattice point of a virtual square lattice set in the plane of the resonance mode forming layer and may have a rotation angle corresponding to the light image around the lattice point. The rotation angles of the centers of gravity of at least two different refractive index regions may be different from each other. The light output from the active layer is diffracted by the resonance mode forming layer. In the resonance mode forming layer, the centers of gravity of the plurality of different refractive index regions have rotation angles set for each different refractive index region around the lattice point of a virtual square lattice. In such a case, as compared with a case where the centers of gravity of the plurality of different refractive index regions are located on the lattice points of the square lattice, the light intensity of light emitted in the thickness direction of the resonance mode forming layer, in other words, in the direction perpendicular to the light emitting surface of the surface-emitting laser device, that is, the light intensity of 0-order light, is reduced. Simultaneously, higher-order light emitted in a direction inclined with respect to that direction, for example, 1-order light and −1-order light, appears. Further, the rotation angle around the lattice point of the center of gravity of each different refractive index region is individually set for each different refractive index region, so that it is possible to independently modulate the phase of light for each different refractive index region and to output a light image of any shape.

The above surface-emitting laser device may be a surface-emitting laser device that outputs a light image, that is, an iPM laser. When a virtual square lattice is set in the plane of the resonance mode forming layer, the centers of gravity of the plurality of different refractive index regions may be located on a straight line that passes through the lattice points of the square lattice and is inclined with respect to the square lattice. The inclination angles of a plurality of straight lines corresponding to the plurality of different refractive index regions with respect to the square lattice may be uniform within the resonance mode forming layer. The distance between a center of gravity of each of the different refractive index regions and the corresponding lattice point may be individually set in accordance with the light image. The distances between the centers of gravity of at least two different refractive index regions and the lattice points may be different from each other. The light output from the active layer is diffracted by the resonance mode forming layer. In the resonance mode forming layer, the centers of gravity of the plurality of different refractive index regions are located on straight lines that pass through the lattice points of a virtual square lattice and are inclined with respect to the square lattice. Even in such a case, the light intensity of light emitted in the direction perpendicular to the light emitting surface, that is, 0-order light, is reduced. Simultaneously, higher-order light such as, for example, 1-order light and −1-order light emitted in a direction inclined with respect to that direction appears. Further, the distance between the center of gravity of each different refractive index region and the corresponding lattice point is individually set for each different refractive index region, so that it is possible to independently modulate the phase of light for each different refractive index region and to output a light image of any shape.

In the above surface-emitting laser device, the relaxation layer may be composed of the same constituent elements as the second cladding layer. In this case, the relaxation layer can be grown without changing raw materials to be supplied after the second cladding layer is grown, and thus it is possible to easily form the relaxation layer.

In the above surface-emitting laser device, the bandgap width of the relaxation layer may change continuously so as to approach the bandgap width of the contacting layer from the bandgap width of the second cladding layer. In this case, the potential barrier can be effectively reduced, and thus the above effect of the surface-emitting laser device of the present disclosure can be obtained more remarkably.

In the above surface-emitting laser device, the bandgap width of the relaxation layer may change stepwise so as to approach the bandgap width of the contacting layer from the bandgap width of the second cladding layer. Even in such a case, the potential barrier can be effectively reduced, and thus the above effect of the surface-emitting laser device of the present disclosure can be obtained remarkably.

In the above surface-emitting laser device, the refractive index of the second cladding layer may be smaller than the refractive index of the first cladding layer. In this case, since the mode generated in the contacting layer is prevented from being coupled to the resonance mode forming layer, it is possible to improve the quality of the output light. Since the bandgap of the second cladding layer increases as the refractive index of the second cladding layer becomes smaller, the bandgap difference between the second cladding layer and the contacting layer increases. The above surface-emitting laser device is particularly useful in such a case.

In the above surface-emitting laser device, the second cladding layer and the relaxation layer may contain Al as a composition, and the Al composition ratio of the relaxation layer may be smaller than the Al composition ratio of the second cladding layer. In a case where the second cladding layer contains Al and the relaxation layer is not provided, Al in the second cladding layer is likely to be oxidized by oxygen atoms that have passed through the contacting layer or incorporated into the second cladding layer exposed from the contacting layer. Alternatively, in a case where growth is interrupted between the second cladding layer and the contacting layer, Al in the second cladding layer is likely to be oxidized. Since the contacting layer requires a high doping concentration for ohmic contact, the crystal growth conditions of the contacting layer may be different from the crystal growth conditions of the second cladding layer. For example, in such a case, growth is interrupted between the second cladding layer and the contacting layer. When Al in the second cladding layer is oxidized, the electric resistance of the second cladding layer increases, and sufficient laser oscillation cannot be obtained unless the drive voltage is increased. As a result, power consumption increases and the reliability of the device decreases. In this surface-emitting laser device, since the relaxation layer having a smaller Al composition ratio than the second cladding layer is interposed between the contacting layer and the second cladding layer, the influence of oxidation of Al can be reduced. That is, according to such a surface-emitting laser device, it is possible to suppress an increase in electric resistance due to the oxidation of Al and to obtain sufficient laser oscillation at a lower drive voltage. As a result, it is possible to make power consumption smaller and to further improve the reliability of the device.

In the above surface-emitting laser device, the Al composition ratio of the relaxation layer may decrease continuously from the interface of the relaxation layer closer to the second cladding layer toward the interface of the relaxation layer closer to the contacting layer. In this case, the oxidation of Al can be effectively reduced, and thus the above effect can be obtained more remarkably.

In the above surface-emitting laser device, the Al composition ratio of the relaxation layer may decrease stepwise from the interface of the relaxation layer closer to the second cladding layer toward the interface of the relaxation layer closer to the contacting layer. Even in such a case, the oxidation of Al can be effectively reduced, and thus the above effect can be obtained remarkably.

In the above surface-emitting laser device, the second cladding layer and the relaxation layer are AlGaAs layers, and the contacting layer may be a GaAs layer. In this case, it is possible to obtain a surface-emitting laser device in an infrared region.

In the above surface-emitting laser device, the first cladding layer contains Al as a composition, and the Al composition ratio of the second cladding layer may be higher than the Al composition ratio of the first cladding layer. In this case, since the refractive index of the second cladding layer is smaller than the refractive index of the first cladding layer, it is possible to reduce a higher-order mode generated in the second cladding layer and to improve the quality of the output light. In a case where the Al composition ratio of the second cladding layer is high as described above, the above surface-emitting laser device including the relaxation layer is particularly useful.

In the above surface-emitting laser device, the area of the contacting layer may be smaller than the area of the relaxation layer when viewed in the thickness direction, and the relaxation layer may be exposed from the contacting layer around the contacting layer. In order to efficiently supply a current, a portion of the contacting layer other than a portion where the second electrode is provided may be removed. In that case, when the relaxation layer is not provided, the second cladding layer is exposed, and Al in the second cladding layer is more likely to be oxidized. In the above surface-emitting laser device, since the relaxation layer of which the Al composition ratio is smaller than that of the second cladding layer is exposed, the influence of oxidation of Al can be reduced.

In the above surface-emitting laser device, the thickness of the relaxation layer may be smaller than the thickness of the second cladding layer. In this case, the thickness of the second cladding layer becomes relatively larger, and the relaxation layer having a larger refractive index than the second cladding layer is separated from the resonance mode forming layer and the active layer. Therefore, it is possible to suppress coupling of a mode generated by the relaxation layer and the contacting layer to the resonance mode forming layer. This makes it possible to stabilize the fundamental mode and improve the quality of the output light.

In the above surface-emitting laser device, the relaxation layer may be located at distance of 1 μm or more from the resonance mode forming layer and the active layer. In this case, the relaxation layer having a refractive index larger than the refractive index of the second cladding layer is separated from the resonance mode forming layer and the active layer. Therefore, it is possible to suppress coupling of a mode generated by the relaxation layer and the contacting layer to the resonance mode forming layer. This makes it possible to stabilize the fundamental mode and improve the quality of the output light.

Hereinafter, specific examples of an surface-emitting laser device according to the present disclosure will be described with reference to the accompanying diagrams. In addition, the present invention is not limited to the examples, and is indicated by the appended claims and is intended to include all modifications within the meaning and scope equivalent to the appended claims. In the following description, the same elements will be denoted by the same reference numerals in the description of the diagrams, and repeated description thereof will be omitted.

First Embodiment

Figure 1:
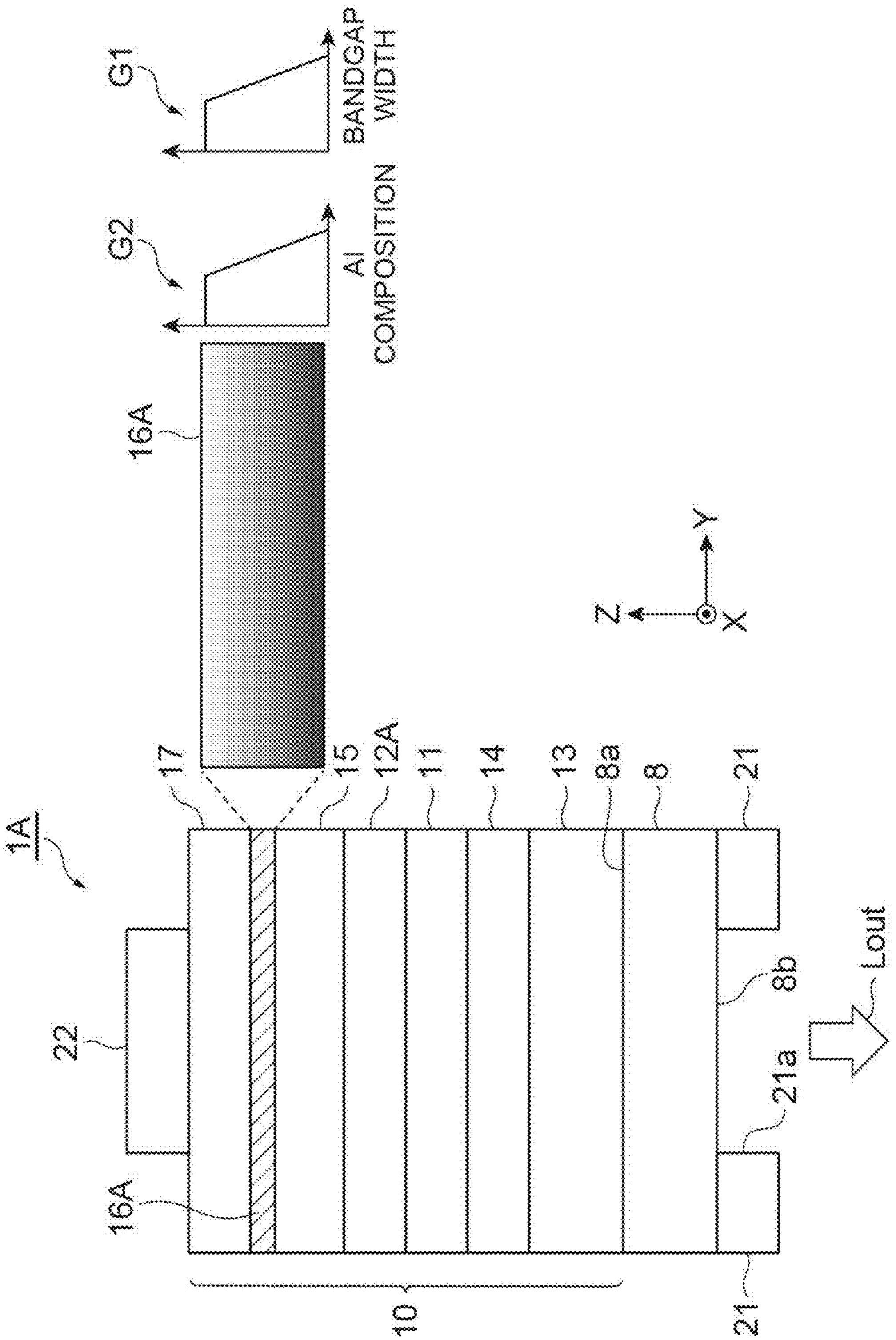
FIG. 1 is diagram schematically illustrating a cross-sectional configuration of a surface-emitting laser device according to a first embodiment.

FIG. 1 is a diagram schematically illustrating a cross-sectional configuration of a surface-emitting laser device 1A according to a first embodiment of the present disclosure. The surface-emitting laser device 1A is a photonic crystal surface-emitting laser (PCSEL). For ease of understanding, an XYZ orthogonal coordinate system is defined in the diagram as necessary. The surface-emitting laser device 1A forms a standing wave in the XY in-plane direction and outputs a laser beam Lout in a direction perpendicular to the light emitting surface, that is, a Z direction.

The surface-emitting laser device 1A of the present embodiment includes a semiconductor substrate 8 having a main surface 8*a* and a rear surface 8*b*, a semiconductor laminate 10 provided on the main surface 8*a* of the semiconductor substrate 8, a first electrode 21, and a second electrode 22. The semiconductor laminate 10 includes an active layer 11, a photonic crystal layer (diffraction grating layer) 12A, a lower cladding layer (first cladding layer) 13, a light guide layer 14, an upper cladding layer (second cladding layer) 15, a relaxation layer 16A, and a contacting layer 17. These layers extend along the XY plane and are laminated in the Z direction with the Z direction as the thickness direction.

The main surface 8*a* and the rear surface 8*b* of the semiconductor substrate 8 are flat and parallel to each other. The semiconductor substrate 8 is used to epitaxially grow a plurality of semiconductor layers constituting the semiconductor laminate 10. In a case where the plurality of semiconductor layers constituting the semiconductor laminate 10 are GaAs-based semiconductor layers, the semiconductor substrate 8 is, for example, a GaAs substrate. In a case where the plurality of semiconductor layers constituting the semiconductor laminate 10 are InP-based semiconductor layers, the semiconductor substrate 8 is, for example, an InP substrate. In a case where the plurality of semiconductor layers constituting the semiconductor laminate 10 are GaN-based semiconductor layers, the semiconductor substrate 8 is, for example, a GaN substrate. The thickness of the semiconductor substrate 8 is, for example, in a range of 50 μm to 1,000 μm. The semiconductor substrate 8 has a p-type or n-type conductivity type. The planar shape of the main surface 8*a* is, for example, rectangular or square.

The lower cladding layer 13 is provided by epitaxial growth on the main surface 8*a* of the semiconductor substrate 8, and is in contact with the main surface 8*a* of the semiconductor substrate 8 in an example. The lower cladding layer 13 may be grown directly on the main surface 8*a*. Alternatively, the lower cladding layer 13 may be grown on the main surface 8*a* with a buffer layer (not shown) provided between the main surface 8*a* and the lower cladding layer 13. The thickness of the lower cladding layer 13 is, for example, in a range of 0.5 μm to 5.0 μm.

The light guide layer 14 is provided by epitaxial growth on the lower cladding layer 13, and is in contact with the lower cladding layer 13 in an example. The light guide layer 14 is a layer for adjusting a light distribution in the Z direction. In the shown example, the light guide layer 14 is provided only between the lower cladding layer 13 and the active layer 11. A light guide layer may also be provided as necessary between the active layer 11 and the upper cladding layer 15. In a case where the light guide layer is provided between the active layer 11 and the upper cladding layer 15, the photonic crystal layer 12A is provided between the upper cladding layer 15 and the light guide layer. Alternatively, no light guide layer may be provided between the lower cladding layer 13 and the active layer 11 and between the active layer 11 and the upper cladding layer 15. The light guide layer 14 may include a carrier barrier layer for efficiently confining carriers in the active layer 11. The thickness of the light guide layer 14 is in a range of 10 nm to 500 nm, for example, when the oscillation wavelength is set to 940 nm. In a case where the light guide layer 14 is thick, a higher-order mode appears in the layer thickness direction. When a higher-order mode appears in the layer thickness direction, there is concern that a higher-order mode may form noise light in a light image to be emitted. Therefore, the thickness of the light guide layer 14 is preferably within a range in which only the fundamental mode in the layer thickness direction is allowed. Even if the thickness of the light guide layer 14 is within such a range, there is concern that, when the light guide layer 14 is relatively thick, the mode may be biased toward the light guide layer 14 and the diffraction efficiency may be lowered. When the light guide layer 14 is relatively thin, there is concern that a large proportion of the resonance mode may leak to the lower cladding layer 13 and the diffraction efficiency may be lowered. When the light guide layer is also provided between the active layer 11 and the upper cladding layer 15, there is concern that, when the light guide layer is relatively thin, a large proportion of the resonance mode may leak to the upper cladding layer 15 and the diffraction efficiency may be lowered. Therefore, it is preferable to set appropriate film thicknesses of the light guide layer 14 and another light guide layer in consideration of the mode shape.

The active layer 11 is provided by epitaxial growth on the lower cladding layer 13. In the shown example, the active layer 11 is provided by epitaxial growth on the light guide layer 14. In an example, the active layer 11 is in contact with the light guide layer 14. The active layer 11 is supplied with a current to generate light. The refractive index of the active layer 11 is greater than the refractive indexes of the lower cladding layer 13 and the upper cladding layer 15, and the bandgap of the active layer 11 is smaller than the bandgaps of the lower cladding layer 13 and the upper cladding layer 15. In an example, the active layer 11 has a multi-quantum well structure in which well layers and barrier layers are alternately laminated.

The photonic crystal layer 12A is provided between the lower cladding layer 13 and the active layer 11 or between the active layer 11 and the upper cladding layer 15. In the shown example, the photonic crystal layer 12A is provided between the active layer 11 and the upper cladding layer 15 and is in contact with the active layer 11 and the upper cladding layer 15.

Figure 2:
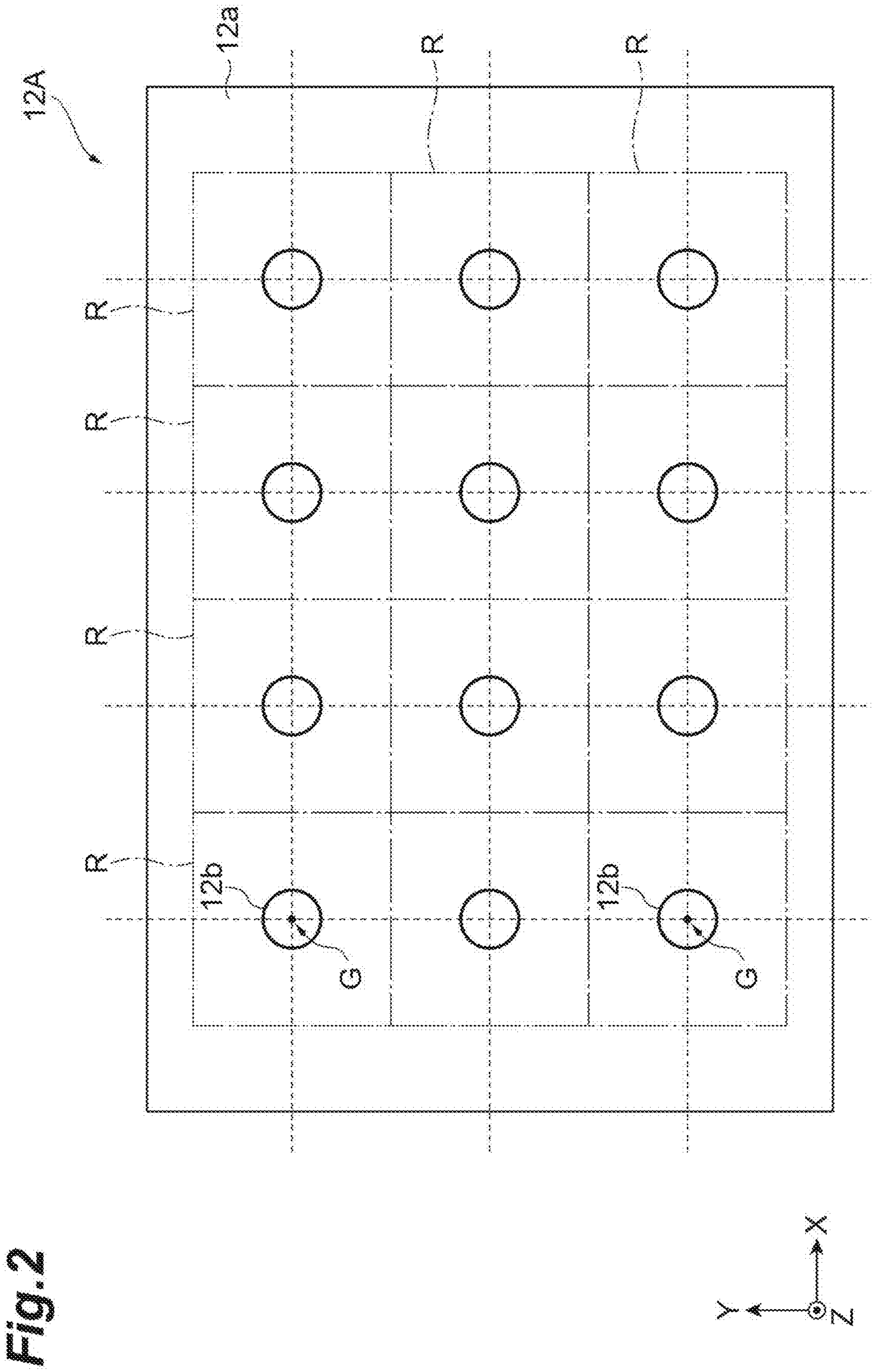
FIG. 2 is a plan view of a photonic crystal layer.

The photonic crystal layer 12A is a resonance mode forming layer in the present embodiment. FIG. 2 is a plan view of the photonic crystal layer 12A. The photonic crystal layer 12A includes a basic region 12*a* and a plurality of different refractive index regions 12*b*. The basic region 12*a* is a semiconductor layer composed of a first refractive index medium. The plurality of different refractive index regions 12*b* are composed of a second refractive index medium having a refractive index different from that of the first refractive index medium and are located within the basic region 12*a*. The different refractive index region 12*b* may be a hole or may be configured with a solid medium embedded in the hole. In a case where the different refractive index region 12*b* is a hole, the photonic crystal layer 12A may further have a region for covering the hole on the basic region 12*a*. The constituent material of this region may be the same as or different from the constituent material of the basic region 12*a*.

The plurality of different refractive index regions 12*b* are arrayed two-dimensionally and periodically in a plane perpendicular to the thickness direction of the photonic crystal layer 12A, that is, in the XY plane. In a case where the equivalent refractive index is $n_1$, the wavelength $\lambda_1$ selected by the photonic crystal layer 12A is expressed as $\lambda = a_1 \times n_1$. Here, $a_1$ is lattice spacing. The wavelength $\lambda_1$ is included in the emission wavelength range of the active layer 11. The photonic crystal layer 12A forms a resonance mode of light of the wavelength $\lambda_1$ in the plane perpendicular to the thickness direction of the photonic crystal layer 12A, that is, in the XY plane. The array period of the plurality of different refractive index regions 12*b* is set so that the light of the wavelength $\lambda_1$ oscillates at the Γ-point. Therefore, the photonic crystal layer 12A can selectively diffract the wavelength $\lambda_1$ out of the emission wavelengths of the active layer 11 in the Z direction.

Here, a virtual square lattice in the XY plane is set in the photonic crystal layer 12A. One side of the square lattice is parallel to the X axis and the other side thereof is parallel to the Y axis. In this case, square-shaped unit constituent regions R centered on the lattice points of the square lattice can be set two-dimensionally over a plurality of columns along the X axis and a plurality of rows along the Y axis. The unit constituent region R is a region surrounded by straight lines that bisect the lattice points of the virtual square lattice. The plurality of different refractive index regions 12*b* are provided in each unit constituent region R in the same number of one or two or more. The planar shape of the different refractive index region 12*b* is, for example, circular. In each unit constituent region R, the center of gravity G of the different refractive index region 12*b* overlaps each lattice point and coincides with each lattice point. The periodic structure of the plurality of different refractive index regions 12*b* is not limited to this, and for example, a triangular lattice may be set instead of the square lattice.

FIG. 2 shows an example in which the shape of the different refractive index region 12*b* in the XY plane is circular. The different refractive index region 12*b* may have a shape other than a circular shape. For example, the shape of the different refractive index region 12*b* in the XY plane may have mirror symmetry, that is, line symmetry. Here, the mirror symmetry or line symmetry means that, with a certain straight line along the XY plane interposed, the planar shape of the different refractive index region 12*b* located on one side of the straight line and the planar shape of the different refractive index region 12*b* located on the other side of the straight line can be mirror symmetrical, that is, line symmetrical to each other. As shown in FIG. 3, examples of shapes having mirror symmetry or line symmetry include (a) a perfect circle, (b) a square, (c) a regular hexagon, (d) a regular octagon, (e) a regular hexadecagon, (f) a rectangle, (g) an ellipse, and the like.

The shape of the different refractive index region 12*b* in the XY plane may be a shape that does not 180° rotational symmetry. As shown in FIG. 4, examples of such shapes include (a) an equilateral triangle, (b) a right-angled isosceles triangle, (c) a shape in which two circles or ellipse partially overlap each other, (d) an oval, that is, a shape obtained by deforming an ellipse such that the minor-axis dimension near one end along the major axis of the ellipse is smaller than the minor-axis dimension near the other end, (e) a teardrop shape, that is, a shape in which one end along the major axis of an ellipse is deformed into a sharp end protruding along the major axis, (f) an isosceles triangle, (g) an arrow shape, that is, a shape in which one side of a rectangle is recessed in a triangular shape and one side opposite thereto is pointed in a triangular shape, (h) a trapezoid, (i) a pentagon, (j) a shape in which parts of two rectangles overlap each other, (k) a shape in which parts of two rectangles overlap each other and do not have mirror symmetry, and the like. In this manner, the shape of the different refractive index region 12*b* in the XY plane does not have 180° rotational symmetry, and thus it is possible to obtain a higher optical output.

Parts (a) to (k) of FIG. 5 are plan views illustrating other examples of the shape of the different refractive index region in the XY plane. In this example, a plurality of different refractive index regions 12*c* other than the plurality of different refractive index regions 12*b* are further provided. Each of the different refractive index regions 12*c* is composed of a second refractive index medium having a refractive index different from the refractive index of the first refractive index medium of the basic region 12*a*. Similarly to the different refractive index region 12*b*, the different refractive index region 12*c* may be a hole or may be configured with a solid medium embedded in the hole. The different refractive index regions 12*c* are provided in one-to-one correspondence with the different refractive index regions 12*b*. The center of gravity G of the combined different refractive index region 12*b* and 12*c* is located on the lattice point of the unit constituent region R constituting a virtual square lattice. Both of the different refractive index regions 12*b* and 12*c* are included in the range of the corresponding unit constituent region R.

Although the planar shape of the different refractive index region 12*c* is, for example, circular, the region can have various shapes similarly to the different refractive index region 12*b*. Parts (a) to (k) of FIG. 5 show examples of the shapes and relative relationships of the different refractive index regions 12*b* and 12*c* in the XY plane. Parts (a) and (b) of FIG. 5 show a form in which the different refractive index regions 12*b* and 12*c* have diagrams of the same shape. Parts (c) and (d) of FIG. 5 show a form in which the different refractive index regions 12*b* and 12*c* have diagrams of the same shape and partially overlap each other. Part (e) of FIG. 5 shows a form in which the different refractive index regions 12*b* and 12*c* have diagrams of the same shape and the different refractive index regions 12*b* and 12*c* are inclined with respect to each other. Part (f) of FIG. 5 shows a form in which the different refractive index regions 12*b* and 12*c* have diagrams of shapes different from each other. Part (g) of FIG. 5 shows a form in which the different refractive index regions 12*b* and 12*c* have diagrams of shapes different from each other and the different refractive index regions 12*b* and 12*c* are separated from each other.

As shown in parts (h) to (k) of FIG. 5, the different refractive index region 12*b* may be configured to include two regions 12*b*1 and 12*b*2 which are spaced apart from each other. The distance between the center of gravity of the combined regions 12*b*1 and 12*b*2 and the center of gravity of the different refractive index region 12*c* may be set arbitrarily within the unit constituent region R. The center of gravity of the combined regions 12*b*1 and 12*b*2 is equivalent to the center of gravity of the single different refractive index region 12*b*. As shown in part (h) of FIG. 5, the regions 12*b*1 and 12*b*2 and the different refractive index region 12*c* may have diagrams of the same shape. As shown in part (i) of FIG. 5, two diagrams out of the regions 12*b*1 and 12*b*2 and the different refractive index region 12*c* may be different from the other. As shown in part (j) of FIG. 5, in addition to the angle of the straight line connecting the regions 12*b*1 and 12*b*2 with respect to the X axis, the angle of the different refractive index region 12*c* with respect to the X axis may be set arbitrarily within the unit constituent region R. As shown in part (k) of FIG. 5, the angle of the straight line connecting the regions 12*b*1 and 12*b*2 with respect to the X axis may be set arbitrarily within the unit constituent region R while the regions 12*b*1 and 12*b*2 and the different refractive index region 12*c* maintain the same relative angle.

The plurality of different refractive index regions 12*b* may be provided for each unit constituent region R. Here, unit constituent region R refers to a region having a minimum area in the region surrounded by the perpendicular bisectors of the lattice point of a certain unit constituent region R and the lattice points of other unit constituent regions arrayed periodically, and corresponds to a Wigner-Seitz cell in solid-state physics. In that case, the plurality of different refractive index regions 12*b* included in one unit constituent region R may have diagrams of the same shape, and their centers of gravity may be spaced apart from each other. The shapes of the different refractive index regions 12*b* in the XY plane may be the same as each other among a plurality of unit constituent regions R, and may be superimposable on each other among the unit constituent regions R through a translation operation, or a translation operation and a rotation operation. In that case, fluctuations in the photonic band structure are reduced and a spectrum with a narrow line width can be obtained. Alternatively, the shapes of the different refractive index regions in the XY plane may not necessarily be the same as each other among the plurality of unit constituent regions R, and the shapes may be different from each other among the adjacent unit constituent regions R.

In the above-described structure, the different refractive index region 12*b* is formed by holes. The different refractive index region 12*b* may be formed by an inorganic material having a refractive index different from the refractive index of the basic region 12*a* being embedded in the holes. In that case, for example, the different refractive index region 12*b* may be formed by forming holes in the basic region 12*a* through etching and embedding an inorganic material in the holes using a chemical vapor deposition method, an atomic layer deposition method, or the like. Alternatively, after the inorganic material is embedded in the holes of the basic region 12*a* to form the different refractive index region 12*b*, the same inorganic material as the constituent material of the different refractive index region 12*b* may be further deposited thereon. In a case where the different refractive index region 12*b* is a hole, the hole may be filled with an inert gas such as argon or nitrogen, or a gas such as hydrogen or air.

Reference will be made to FIG. 1 again. The upper cladding layer 15 is provided by epitaxial growth on the photonic crystal layer 12A and is in contact with the photonic crystal layer 12A in an example. The thickness of the upper cladding layer 15 is, for example, in a range of 0.5 μm to 5.0 μm. The bandgap of the upper cladding layer 15 is larger than the bandgaps of the active layer 11 and the basic region 12*a* of the photonic crystal layer 12A, and is constant in the thickness direction. The refractive index of the upper cladding layer 15 is smaller than the refractive indexes of the active layer 11 and the basic region 12*a* of the photonic crystal layer 12A.

In the present embodiment in which the surface-emitting laser device 1A is a PCSEL, the bandgap of the upper cladding layer 15 is smaller than the bandgap of the lower cladding layer 13. Specifically, in a case where the lower cladding layer 13 and the upper cladding layer 15 contain Al as a composition, the Al composition ratio of the upper cladding layer 15 is smaller than the Al composition ratio of the lower cladding layer 13. Thereby, since the refractive index of the upper cladding layer 15 becomes relatively high, the ratio of a mode distributed in the photonic crystal layer 12A among the modes of the entire surface-emitting laser device 1A increases, and thus the diffraction efficiency can be improved.

The relaxation layer 16A is provided by epitaxial growth on the upper cladding layer 15 and is in contact with the upper cladding layer 15. The relaxation layer 16A is provided to relax a potential barrier caused by the bandgap difference between the upper cladding layer 15 and the contacting layer 17. The relaxation layer 16A is composed of, for example, the same constituent elements as the upper cladding layer 15. The relaxation layer 16A has a bandgap width that is between the bandgap width of the upper cladding layer 15 and the bandgap width of the contacting layer 17. The bandgap width of the relaxation layer 16A decreases monotonically from the interface on the upper cladding layer 15 side toward the interface on the contacting layer 17 side. FIG. 1 shows a graph G1 showing the distribution of the bandgap width of the relaxation layer 16A in thickness direction. In the graph G1, the horizontal axis represents the bandgap width and the vertical axis represents the position in the thickness direction. As shown in the graph G1, in the present embodiment, the bandgap width of the relaxation layer 16A changes continuously so as to approach the bandgap width of the contacting layer 17 from the bandgap width of the upper cladding layer 15. In the shown example, since the bandgap width of the contacting layer 17 is smaller than the bandgap width of the upper cladding layer 15, the bandgap width of the relaxation layer 16A decreases continuously from the interface on the upper cladding layer 15 side toward the interface on the contacting layer 17 side. In an example, the bandgap width of the relaxation layer 16A changes in proportion to the distance from the interface on the upper cladding layer 15 side. In FIG. 1, the distribution of the bandgap width of the relaxation layer 16A is represented by the shade of color, and the bandgap width increases as the color becomes darker. The bandgap width of the relaxation layer 16A at the interface of the relaxation layer 16A on the upper cladding layer 15 side may be equal to the bandgap width of the upper cladding layer 15. The bandgap width of the relaxation layer 16A at the interface of the relaxation layer 16A on the contacting layer 17 side may be equal to the bandgap width of the contacting layer 17.

In a case where the upper cladding layer 15 contains Al as a composition, the relaxation layer 16A also functions as a layer that suppresses the oxidation of Al in the upper cladding layer 15. In this case, the relaxation layer 16A also contains Al. The relaxation layer 16A has an Al composition ratio that is between the Al composition ratio of the upper cladding layer 15 and the Al composition ratio of the contacting layer 17. In a case where the contacting layer 17 does not contain Al as a composition, the Al composition ratio of the contacting layer 17 is zero. The Al composition ratio of the relaxation layer 16A decreases monotonically from the interface on the upper cladding layer 15 side toward the interface on the contacting layer 17 side. FIG. 1 shows a graph G2 illustrating the distribution of the Al composition ratio of the relaxation layer 16A in the thickness direction. In the graph G2, the horizontal axis represents the Al composition ratio and the vertical axis represents the position in the thickness direction. As shown in the graph G2, in the present embodiment, the Al composition ratio of the relaxation layer 16A decreases continuously from the interface on the upper cladding layer 15 side toward the interface on the contacting layer 17 side. In an example, the Al composition ratio of the relaxation layer 16A decreases in proportion to the distance from the interface on the upper cladding layer 15 side. The Al composition ratio of the relaxation layer 16A at the interface of the relaxation layer 16A on the upper cladding layer 15 side may be equal to the Al composition ratio of the upper cladding layer 15. The Al composition ratio of the relaxation layer 16A at the interface of the relaxation layer 16A on the contacting layer 17 side may be equal to the Al composition ratio of the contacting layer 17. In a case where the Al composition ratio of the contacting layer 17 is zero, that is, a case where the contacting layer 17 does not contain Al as a composition, the Al composition ratio at the interface of the relaxation layer 16A on the contacting layer 17 side is also zero.

The thickness of the relaxation layer 16A is smaller than the thickness of the upper cladding layer 15. The thickness of the relaxation layer 16A is, for example, in a range of 5 nm to 1,000 nm. The relaxation layer 16A is located at distance of 1 μm or more from both the photonic crystal layer 12A and the active layer 11, and is more suitably located at distance of 1.5 μm or more from both the photonic crystal layer 12A and the active layer 11. That is, in a case where only the upper cladding layer 15 is provided between the relaxation layer 16A and both the photonic crystal layer 12A and the active layer 11, the thickness of the upper cladding layer 15 is 1 μm or more, more suitably 1.5 μm or more. The sum of the thickness of the upper cladding layer 15 and the thickness of the relaxation layer 16A may be equal to the thickness of the lower cladding layer 13.

The contacting layer 17 is provided by epitaxial growth on the relaxation layer 16A and is in contact with the relaxation layer 16A. The contacting layer 17 has a bandgap width different from that of the upper cladding layer 15. Typically, the bandgap width of the contacting layer 17 is smaller than the bandgap width of the upper cladding layer 15. In an example, the composition of the contacting layer 17 is the same as the compositions of the basic region 12*a* of the photonic crystal layer 12A and the barrier layer of the active layer 11. The thickness of the contacting layer 17 is, for example, in a range of 50 nm to 500 nm.

The first electrode 21 is a metallic electrode provided on the rear surface 8*b* of the semiconductor substrate 8. The first electrode 21 is electrically connected to the lower cladding layer 13 by making ohmic contact with the semiconductor substrate 8. The first electrode 21 has a rectangular frame shape with an opening 21*a* for allowing passage of the laser beam Lout when viewed in a direction perpendicular to the rear surface 8*b* of the semiconductor substrate 8. The rear surface 8*b* of the semiconductor substrate 8 is exposed from the first electrode 21 through the opening 21*a*. The laser beam Lout oscillated in the photonic crystal layer 12A is output to the outside of the surface-emitting laser device 1A through the opening 21*a*.

The second electrode 22 is a metallic electrode provided on the surface of the contacting layer 17 at least on a region where the opening 21*a* of the first electrode 21 is projected, that is, the central region of the semiconductor laminate 10. The second electrode 22 is in ohmic contact with the contacting layer 17. A portion of the contacting layer 17 which is not in contact with the second electrode 22 may be removed. The second electrode 22 also serves to reflect light generated in the active layer 11.

In one example, the semiconductor substrate 8 is a GaAs substrate, and the active layer 11, the photonic crystal layer 12A, the lower cladding layer 13, the light guide layer 14, the upper cladding layer 15, the relaxation layer 16A, and the contacting layer 17 are composed of a GaAs-based semiconductor. In an example, the lower cladding layer 13 and the light guide layer 14 are AlGaAs layers, the active layer 11 has a multi-quantum well structure, the barrier layer of a multi-quantum well structure is an AlGaAs layer, the quantum well layer is a GaAs layer, the number of layers of the well layer is, for example, three, the basic region 12*a* of the photonic crystal layer 12A is an AlGaAs layer or a GaAs layer, the different refractive index region 12*b* is a hole, the upper cladding layer 15 and the relaxation layer 16A are AlGaAs layers, and the contacting layer 17 is a GaAs layer. In this case, the thickness of the semiconductor substrate 8 is, for example, 150 μm. The thickness of the lower cladding layer 13 is, for example, 2,000 nm. The thickness of the light guide layer 14 is, for example, 80 nm. The thicknesses of the well layer and the barrier layer of the active layer 11 are, for example, 10 nm. The thickness of the photonic crystal layer 12A is, for example, 300 nm. The thickness of the upper cladding layer 15 is, for example, 1,500 nm. The thickness of the relaxation layer 16A is, for example, 500 nm. The thickness of the contacting layer 17 is, for example, 200 nm. The Al composition ratio of the lower cladding layer 13 is, for example, 70 atom %. The Al composition ratio of the light guide layer 14 is, for example, 15 atom %. The Al composition ratio of the barrier layer of the active layer 11 is, for example, 15 atom %. The Al composition ratio of the upper cladding layer 15 is, for example, 43 atom %. The Al composition ratio of the relaxation layer 16A at the interface with the upper cladding layer 15 is, for example, 43 atom %. The Al composition ratio of the relaxation layer 16A at the interface with the contacting layer 17 is, for example, 0 atom %. The Al composition ratio of the contacting layer 17 is, for example, 0 atom %.

The lower cladding layer 13 is given the same conductivity type as the semiconductor substrate 8, that is, a first conductivity type, while the upper cladding layer 15, the relaxation layer 16A, and the contacting layer 17 are given a conductivity type opposite to the semiconductor substrate 8, that is, a second conductivity type. In an example, the semiconductor substrate 8 and the lower cladding layer 13 are n-type, while the upper cladding layer 15, the relaxation layer 16A, and the contacting layer 17 are p-type. The photonic crystal layer 12A has the same conductivity type as the semiconductor substrate 8 in a case where it is provided between the active layer 11 and the lower cladding layer 13, and has a conductivity type opposite to the semiconductor substrate 8 in a case where it is provided between the active layer 11 and the upper cladding layer 15. The concentration of impurities for determining the conductivity type is, for example, $1\times10^{16}/cm^3$ to $1\times10^{21}/cm^3$. The active layer 11 and the light guide layer 14 are intrinsic, that is, i-type, with no impurities intentionally added, but may be given any conductivity type. The intrinsic, that is, i-type, impurity concentration is $1\times10^{16}/cm^3$ or less. The impurity concentration of the photonic crystal layer 12A may be intrinsic, that is, i-type in a case where it is necessary to suppress the influence of loss due to light absorption through impurity levels, or the like. The impurity concentration of the relaxation layer 16A may be the same as or higher than the impurity concentration for determining the conductivity type of the upper cladding layer 15.

The material of the first electrode 21 is appropriately selected in accordance with the constituent material of the semiconductor substrate 8. In a case where the semiconductor substrate 8 is an n-type GaAs substrate, the first electrode 21 may contain, for example, a mixture of Au and Ge. In an example, the first electrode 21 has an AuGe monolayer or a laminated structure of an AuGe layer and an Au layer. The material of the second electrode 22 is appropriately selected in accordance with the constituent material of the contacting layer 17. In a case where the contacting layer 17 is p-type GaAs, the second electrode 22 can be composed of, for example, a material containing Au and at least one of Cr, Ti, and Pt, and has, for example, a laminated structure of a Cr layer and an Au layer. However, the materials of the first electrode 21 and the second electrode 22 are not limited to these insofar as ohmic junction can be realized.

The surface-emitting laser device 1A of the present embodiment having the above configuration operates as follows. When a driving current is supplied between the first electrode 21 and the second electrode 22, recombination of electrons and holes occurs in the active layer 11, and light is output from the active layer 11. The electrons and holes that contribute to this light emission, and the generated light are efficiently distributed between the lower cladding layer 13 and the upper cladding layer 15. Since the light output from the active layer 11 is distributed between the lower cladding layer 13 and the upper cladding layer 15, it enters the photonic crystal layer 12A and is diffracted by the photonic crystal layer 12A while being confined between the lower cladding layer 13 and the upper cladding layer 15. In the photonic crystal layer 12A, a resonance mode is formed in the in-plane direction perpendicular to the thickness direction of the photonic crystal layer 12A, light oscillates at a wavelength corresponding to the array period of the plurality of different refractive index regions 12*b*, and a laser beam is generated. For example, in a case where the array period of the square lattice crystal is the length of one wavelength of light, a portion of the laser beam is diffracted in the thickness direction of the photonic crystal layer 12A, that is, the Z direction. The light diffracted from the photonic crystal layer 12A in the Z direction travels in a direction perpendicular to the main surface 8*a* of the semiconductor substrate 8. The light is directly output from the rear surface 8*b* through the opening 21*a* to the outside of the surface-emitting laser device 1A, or reflected by the second electrode 22 and then output from the rear surface 8*b* through the opening 21*a* to the outside of the surface-emitting laser device 1A.

Effects which are obtained by the surface-emitting laser device 1A of the present embodiment described above will be described below. The surface-emitting laser device 1A includes the relaxation layer 16A between the upper cladding layer 15 and the contacting layer 17. The relaxation layer 16A has bandgap width that is between the bandgap width of the upper cladding layer 15 and the bandgap width of the contacting layer 17. Therefore, as compared with a case where the relaxation layer 16A is not provided, the rate of change in bandgap width occurring between the upper cladding layer 15 and the contacting layer 17 is relaxed, and the potential barrier is reduced. Therefore, the electric resistance of the device is lowered, and thus sufficient laser oscillation can be obtained even at a low drive voltage. As a result, it is possible to reduce power consumption, to improve the reliability of the device, and to extend the lifespan of the device.

As described above, the relaxation layer 16A may be composed of the same constituent elements as the upper cladding layer 15. In an example, both the upper cladding layer 15 and the relaxation layer 16A are composed of AlGaAs. In a case where the upper cladding layer 15 and the relaxation layer 16A have the same constituent elements, the relaxation layer 16A can be grown without changing raw materials to be supplied after the upper cladding layer 15 is grown. Therefore, it is possible to easily form the relaxation layer 16A.

As shown in the graph G1 of FIG. 1, the bandgap of the relaxation layer 16A may change continuously from the bandgap of the upper cladding layer 15 toward the bandgap of the contacting layer 17. In this case, the potential barrier can be effectively reduced, and thus the above effect of the surface-emitting laser device 1A of the present embodiment can be obtained more remarkably.

As in the present embodiment, the upper cladding layer 15 and the relaxation layer 16A contain Al as a composition, and the Al composition ratio of the relaxation layer 16A may be smaller than the Al composition ratio of the upper cladding layer 15. In a case where the upper cladding layer 15 contains Al and the relaxation layer 16A is not provided, Al in the upper cladding layer 15 is likely to be oxidized by oxygen atoms passing through the contacting layer 17. Alternatively, in a case where growth is interrupted between the upper cladding layer 15 and the contacting layer 17, Al in the upper cladding layer 15 is likely to be oxidized. When Al in the upper cladding layer 15 is oxidized, the electric resistance of the upper cladding layer 15 increases, and sufficient laser oscillation cannot be obtained unless a drive voltage is increased. As a result, power consumption increases and the reliability of the device decreases. In the present embodiment, since the relaxation layer 16A having an Al composition ratio smaller than the Al composition ratio of the upper cladding layer 15 is interposed between the contacting layer 17 and the upper cladding layer 15, the influence of oxidation of Al can be reduced. That is, according to the present embodiment, it is possible to suppress an increase in electric resistance due to the oxidation of Al and to obtain sufficient laser oscillation at a lower drive voltage. As a result, it is possible to make power consumption smaller and to further improve the reliability of the device.

As shown in the graph G2 of FIG. 1, the Al composition ratio of the relaxation layer 16A may decrease continuously from the interface on the upper cladding layer 15 side toward the interface on the contacting layer 17 side. In this case, the oxidation of Al can be effectively reduced, and thus the above effect can be obtained more remarkably.

As in the present embodiment, the upper cladding layer 15 and the relaxation layer 16A may be AlGaAs layers, and the contacting layer 17 may be a GaAs layer. In this case, it is possible to obtain the surface-emitting laser device 1A capable of outputting the laser beam Lout of an infrared region.

As in the present embodiment, the thickness of the relaxation layer 16A may be smaller than the thickness of the upper cladding layer 15. In this case, the thickness of the upper cladding layer 15 becomes relatively larger, and the relaxation layer 16A having a larger refractive index than the upper cladding layer 15 is separated from the active layer 11 and the photonic crystal layer 12A. Therefore, it is possible to suppress coupling of a mode generated by the relaxation layer 16A and the contacting layer 17 to the photonic crystal layer 12A. This makes it possible to stabilize the fundamental mode and improve the quality of the output light.

As in the present embodiment, the relaxation layer 16A may be located at distance of 1 μm or more or 1.5 μm or more from both the photonic crystal layer 12A and the active layer 11. In this case, the relaxation layer 16A having a refractive index larger than the refractive index of the upper cladding layer 15 is separated from the active layer 11 and the photonic crystal layer 12A. Therefore, it is possible to suppress coupling of a mode generated by the relaxation layer 16A and the contacting layer 17 to the photonic crystal layer 12A. This makes it possible to stabilize the fundamental mode and improve the quality of the output light. Particularly, in the surface-emitting laser device 1A which is a PCSEL, when a layer-direction higher-order mode is formed, a band edge of a higher-order mode is formed. This may cause an unexpected beam pattern to appear such as the formation of a beam pattern at an anti-intersection with the band edge of the fundamental mode. The relaxation layer 16A is located at distance of 1 μm or more or 1.5 μm or more from both the photonic crystal layer 12A and the active layer 11, and thus it is possible to avoid the formation of a layer-direction higher-order mode and to suppress the appearance of an unexpected beam pattern.

Here, an example of the surface-emitting laser device 1A of the present embodiment is shown. The following Table 1 shows an example of the composition and thickness of each layer constituting the surface-emitting laser device 1A. In this example, the relaxation layer 16A is located at distance of 2 μm from the photonic crystal layer 12A. The term "filling factor" refers to the ratio of the area of the unit constituent region R occupied by the different refractive index region 12*b*. Part (a) of FIG. 6 is a graph illustrating a refractive index distribution G11 of the surface-emitting laser device 1A having the configuration shown in Table 1, a fundamental mode distribution G12 generated around the active layer 11 and the photonic crystal layer 12A, and a mode distribution G13 generated around the relaxation layer 16A and the contacting layer 17. Part (b) of FIG. 6 shows an enlarged view of the vicinity of the active layer 11 and the photonic crystal layer 12A in part (a) of FIG. 6. Part (a) of FIG. 7 is a graph illustrating the refractive index distribution G11, the fundamental mode distribution G12, and the mode distribution G13 of the surface-emitting laser device without the relaxation layer 16A for the purpose of comparison. Part (b) of FIG. 7 shows an enlarged view of the vicinity of the active layer 11 and the photonic crystal layer 12A in part (a) of FIG. 7. In the drawing, a section Tclad1 corresponds to the lower cladding layer 13, a section Tac corresponds to the active layer 11, a section Tpc corresponds to the photonic crystal layer 12A, a section Tclad2 corresponds to the upper cladding layer 15, a section Trelax corresponds to the relaxation layer 16A, a section Tcont corresponds to the contacting layer 17, and a section Tair corresponds to air.

TABLE 1

| Layer structure | Layer thickness (nm) |
|---|---|
| p-type GaAs contacting layer | 150 |
| p-type AlGaAs relaxation layer (Al composition: 40% → 0%) | 500 |
| p-type AlGaAs upper cladding layer (Al composition: 40%) | 2000 |
| Photonic crystal layer (base region: i-type GaAs, different refractive index region: hole, filling factor 15%) | 240 |
| Only base region of photonic crystal layer (i-type GaAs) | 60 |
| i-type InGaAs/AlGaAs active layer | 175 |
| n-type AlGaAs lower cladding layer (Al composition: 70%) | 2000 |
| n-type GaAs substrate | — |

Referring to parts (a) and (b) of FIG. 6, the electric field of the mode distribution G13 is almost zero in the photonic crystal layer 12A and does not contribute to diffraction in the photonic crystal layer 12A. Additionally, the coupling coefficient between the fundamental mode distribution G12 and the mode distribution G13 is almost zero. From the above, it can be seen that the relaxation layer 16A having a refractive index larger than the refractive index of the upper cladding layer 15 is sufficiently separated from the active layer 11 and the photonic crystal layer 12A, and thus coupling of the mode generated in the relaxation layer 16A and the contacting layer 17 to the fundamental mode generated around the active layer 11 and the photonic crystal layer 12A can be sufficiently suppressed.

In the present embodiment, a case where the refractive index of the upper cladding layer 15 is larger than the refractive index of the lower cladding layer 13 has been described, but there is no limitation to this form. The refractive index of the upper cladding layer 15 may be smaller than the refractive index of the lower cladding layer 13. In this case, it is possible to suppress the coupling between the mode generated in the contacting layer 17 and the fundamental mode, and to improve the quality of the output light. As the refractive index of the lower cladding layer 13 becomes smaller, the bandgap width of the lower cladding layer 13 increases, and the difference between the bandgap width of the lower cladding layer 13 and the bandgap width of the semiconductor substrate 8 increases. In this case, a relaxation layer having a bandgap width that is between the bandgap width of the lower cladding layer 13 and the bandgap width of the semiconductor substrate 8 may be provided between the lower cladding layer 13 and the semiconductor substrate 8. The surface-emitting laser device 1A of the present embodiment is particularly useful in such a case.

Here, a method of manufacturing the surface-emitting laser device 1A of the present embodiment will be described. First, the lower cladding layer 13, the light guide layer 14, the active layer 11, and the basic region 12*a* of the photonic crystal layer 12A are crystal-grown in this order on the main surface 8*a* of the semiconductor substrate 8, for example, using a metalorganic chemical vapor deposition method (MOCVD). Next, an electron beam resist is applied onto the surface of the basic region 12*a*, and the different refractive index region 12*b* is patterned using an electron beam drawing method. The different refractive index region 12*b* is formed by transferring the pattern of the electron beam resist to the basic region 12*a* using, for example, inductively coupled plasma (ICP) etching. Thus, the photonic crystal layer 12A having the basic region 12*a* and the different refractive index region 12*b* is formed. After the electron beam resist is removed, the upper cladding layer 15, the relaxation layer 16A, and the contacting layer 17 are crystal-grown in this order on the photonic crystal layer 12A using, for example, MOCVD.

Subsequently, the rear surface 8*b* of the semiconductor substrate 8 is polished to thin the semiconductor substrate 8, and then mirror polishing is performed on the rear surface 8*b*. The first electrode 21 having the opening 21*a* is then formed on the rear surface 8*b* using photolithography, a vacuum vapor deposition method, and a lift-off method. The second electrode 22 is formed on the surface of the contacting layer 17 using photolithography, a vacuum vapor deposition method, and a lift-off method. Either the formation of the first electrode 21 or the formation of the second electrode 22 may be performed first. Thereafter, the semiconductor substrate 8 and each layer formed on the semiconductor substrate 8 are diced into chips. The surface-emitting laser device 1A of the present embodiment is manufactured through the above steps.

Second Embodiment

In the above-described embodiment, the surface-emitting laser device 1A including the photonic crystal layer 12A in which the different refractive index regions 12*b* are periodically arrayed has been described. The surface-emitting laser device of the present disclosure is not limited to the photonic crystal layer in which the different refractive index regions are periodically arrayed, and can include various resonance mode forming layers. In recent years, a phase modulation light-emitting device that outputs any light images by controlling the phase spectrum and intensity spectrum of light emitted from a plurality of light-emitting points arrayed two-dimensionally has been studied. Such a phase modulation light-emitting device is referred to as an S-iPM laser, and outputs a light image of any spatial shape. The resonance mode forming layer may include a configuration used in such an S-iPM laser.

FIG. 8 is a diagram schematically illustrating a cross-sectional configuration of a surface-emitting laser device 1B according to a second embodiment. The difference between the surface-emitting laser device 1B of the present embodiment and the surface-emitting laser device 1A of the first embodiment is the configuration of a resonance mode forming layer. The surface-emitting laser device 1B of the present embodiment has a phase modulation layer 12B as a resonance mode forming layer instead of the photonic crystal layer 12A of the first embodiment.

FIG. 9 is a plan view of the phase modulation layer 12B. The phase modulation layer 12B includes the basic region 12*a* and the plurality of different refractive index regions 12*b*. The basic region 12*a* is composed of a first refractive index medium. The plurality of different refractive index regions 12*b* are composed of a second refractive index medium having a refractive index different from that of the first refractive index medium. Here, a virtual square lattice in the XY plane is set in the phase modulation layer 12B. One side of the square lattice is parallel to the X axis, and the other side thereof is parallel to the Y axis. In this case, a square-shaped unit constituent region R centered on a lattice point O of the square lattice can be set two-dimensionally over a plurality of columns along the X axis and a plurality of rows along the Y axis. One different refractive index region 12*b* is provided in each unit constituent region R. The planar shape of the different refractive index region 12*b* can be various shapes such as a circle similarly to the above embodiment. In each unit constituent region R, the center of gravity G of the different refractive index region 12*b* is located away from the lattice point O closest to the different refractive index region 12*b*.

As shown in FIG. 10, the angle between the direction from the lattice point O to the center of gravity G and the X axis is defined as φ(x, y). The angle φ(x, y) is a rotation angle around the lattice point O of the center of gravity G of the different refractive index region 15*b*. Here, x indicates the position of the x-th lattice point on the X axis, and y indicates the position of the y-th lattice point on the Y axis. In a case where the rotation angle φ is 0°, the direction of a vector connecting the lattice point O and the center of gravity G coincides with the positive direction of the X axis. The length of the vector connecting the lattice point O and the center of gravity G is defined as r(x, y). In an example, r(x, y) is uniform regardless of x and y. In other words, r(x, y) is uniform over the entire phase modulation layer 12B.

As shown in FIG. 9, in the phase modulation layer 12B, the rotation angle φ is set independently and individually for each unit constituent region R in accordance with a desired light image. The rotation angles φ of the centers of gravity G of at least two different refractive index regions 12*b* are different from each other. The rotation angle φ(x, y) has a specific value for each position determined by the values of x and y, but is not necessarily represented by a specific function. That is, the distribution of the rotation angle φ(x, y) is determined from the phase distribution extracted from a complex amplitude distribution obtained by performing inverse Fourier transform on a desired light image. When the complex amplitude distribution is obtained from the desired light image, the reproducibility of a beam pattern is improved by applying an iterative algorithm such as a Gerchberg-Saxton (GS) method which is generally used in calculation for generating a hologram.

In the present embodiment, the light output from the active layer 11 is diffracted by the phase modulation layer 12B while being confined between the lower cladding layer 13 and the upper cladding layer 15 to form a predetermined mode according to the lattice structure inside the phase modulation layer 12B. A laser beam Lout2 scattered and emitted in the phase modulation layer 12B passes through the lower cladding layer 13 and the semiconductor substrate 8, and is output to the outside of the surface-emitting laser device 1A. In this case, 0-order light is emitted in the thickness direction of the phase modulation layer 12B, that is, the Z direction. On the other hand, +1-order light and −1-order light are emitted in any spatial direction including the Z direction and a direction inclined with respect to the Z direction.

FIG. 11 is a diagram for explaining a relationship between a light image obtained by imaging an output beam pattern of the surface-emitting laser device 1B according to the present embodiment and a distribution of the rotation angle φ(x, y) in the phase modulation layer 12B. The center Q of the output beam pattern is located in the Z direction from the center of the light emitting surface of the surface-emitting laser device 1B. FIG. 11 shows four quadrants with the center Q as the origin. FIG. 11 shows a case where light images are obtained in the first and third quadrants as an example, but it is also possible to obtain light images in the second and fourth quadrants, or in all quadrants. In the present embodiment, as shown in FIG. 11, a light image which is point-symmetrical with respect to the origin is obtained. FIG. 11 shows, as an example, a case where the pattern of the letter "A" is obtained as +1-order diffracted light in the third quadrant, and the pattern obtained by rotating the letter "A" by 180 degrees is obtained as −1-order diffracted light in the first quadrant. In a case where the light image has a rotationally symmetrical shape, for example, a cross, a circle, a double circle, or the like, +1-order diffracted light and −1-order diffracted light overlap each other and are observed as one light image. The light image obtained by projecting the output beam pattern of the surface-emitting laser device 1B according to the present embodiment includes at least one of spots, straight lines, crosses, line drawings, lattice patterns, photographs, striped patterns, computer graphics (CG), and letters. In order to obtain a desired light image, the distribution of the rotation angle φ(x, y) of the different refractive index region 12*b* of the phase modulation layer 12B is determined by the following procedure.

An XYZ orthogonal coordinate system is set which is defined by the Z axis coincident with the normal direction and the XY plane including the X axis and the Y axis, orthogonal to each other, coincident with one surface of the phase modulation layer 12B including the plurality of different refractive index regions 12*b*. As a first precondition, a virtual square lattice composed of M1×N1 unit constituent regions R each having a square shape is set on the XY plane. M1 and N1 are integers equal to or greater than 1.

As shown in FIG. 12, spherical coordinates (r, $\theta_{rot}$, $\theta_{tilt}$) defined by the length r of the radius, the inclination angle $\theta_{tilt}$ from the Z axis, and the rotation angle $\theta_{rot}$ from the X axis specified on the XY plane are defined. As a second precondition, the coordinates (ξ, η, ζ) in the XYZ orthogonal coordinate system is assumed to satisfy the relationships shown in the following Formulas (1) to (3) with respect to the spherical coordinates (r, $\theta_{rot}$, $\theta_{tilt}$). FIG. 12 is a diagram for explaining coordinate transformation from the spherical coordinates (r, $\theta_{rot}$, $\theta_{tilt}$) to the coordinates (ξ, η, ζ) in the XYZ orthogonal coordinate system. The coordinates (ξ, η, ζ) represent a designed light image on a predetermined plane set in the XYZ orthogonal coordinate system which is a real space.

[Formula 1]

$$\xi = r\sin\theta_{tilt}\cos\theta_{rot} \tag{1}$$

[Formula 2]

$$\eta = r\sin\theta_{tilt}\sin\theta_{rot} \tag{2}$$

[Formula 3]

$$\zeta = r\cos\theta_{tilt} \tag{3}$$

The beam pattern equivalent to the light image output from the surface-emitting laser device 1B is assumed to be a set of bright spots directed in the direction specified by the angles $\theta_{tilt}$ and $\theta_{rot}$. In this case, the angles $\theta_{tilt}$ and $\theta_{rot}$ are assumed to be converted into coordinate values $k_x$ and $k_y$. The coordinate value $k_x$ is a normalized wavenumber specified by the following Formula (4) and is a coordinate value on the Kx axis corresponding to the X axis. The coordinate value $k_y$ is a normalized wavenumber specified by the following Formula (5) and is a coordinate value on the Ky axis corresponding to the Y axis and orthogonal to the Kx axis. The normalized wavenumber means a wavenumber normalized by setting the wavenumber equivalent to the lattice spacing of a virtual square lattice to 1.0. In this case, in the wavenumber space defined by the Kx axis and the Ky axis, a specific wavenumber range including a beam pattern equivalent to the light image is composed of M2×N2 image regions FR each having a square shape. M2 and N2 are integers equal to or greater than 1. The integer M2 need not coincide with the integer M1. The integer N2 need not coincide with the integer N1. Formulas (4) and (5) are disclosed in, for example, Y. Kurosaka et al., "Effects of non-lasing band in two-dimensional photonic-crystal lasers clarified using omnidirectional band structure," Opt. Express 20, 21773-21783 (2012).

[Formula 4]

$$k_x = \frac{a}{\lambda}\sin\theta_{tilt}\cos\theta_{rot} \tag{4}$$

[Formula 5]

$$k_y = \frac{a}{\lambda}\sin\theta_{tilt}\sin\theta_{rot} \tag{5}$$

a: Lattice constant of virtual square lattice

λ: Oscillation wavelength of surface-emitting laser device 1B

In the wavenumber space, the image region FR ($k_x$, $k_y$) is specified by the coordinate component $k_x$ in the Kx axis direction and the coordinate component $k_y$ in the Ky axis direction. The coordinate component $k_x$ is an integer equal to or greater than 0 and equal to or less than M2−1. The coordinate component $k_y$ is an integer equal to or greater than 0 and equal to or less than N2−1. The unit constituent region R(x, y) on the XY plane is specified by the coordinate component x in the X-axis direction and the coordinate component y in the Y-axis direction. The coordinate component x is an integer equal to or greater than 0 and equal to or less than M1−1. The coordinate component y is an integer equal to or greater than 0 and equal to or less than N1−1. As a third precondition, the complex amplitude F(x, y) obtained by performing two-dimensional inverse discrete Fourier transform on each image region $FR(k_x, k_y)$ into the unit constituent region R(x, y) is given by the following Formula (6) with j as an imaginary unit. The complex amplitude F(x, y) is defined by the following Formula (7) where A(x, y) is the amplitude term and P(x, y) is the phase term. As a fourth precondition, the unit constituent region R(x, y) is defined by the s axis and the t axis. The s axis and the t axis are parallel to the X axis and the Y axis, respectively, and are orthogonal to each other at the lattice point O(x, y) which is the center of the unit constituent region R(x, y).

[Formula 6]

$$F(x, y) = \sum_{k_x=0}^{M2-1} \sum_{k_y=0}^{N2-1} FR(k_x, k_y)\exp\left[j2\pi\left(\frac{k_x}{M2}x + \frac{k_y}{N2}y\right)\right] \quad (6)$$

[Formula 7]

$$F(x, y) = A(x, y) \times \exp[jP(x, y)] \quad (7)$$

Under the first to fourth preconditions, the phase modulation layer 12B is configured to satisfy the following fifth and sixth conditions. The fifth condition is that the center of gravity G is away from the lattice point O(x, y) in the unit constituent region R(x, y). The sixth condition is that the segment length r(x, y) from the lattice point O(x, y) to the corresponding center of gravity G is set to a common value in each of the M1×N1 unit constituent regions R. Additionally, the angle φ(x, y) between the s axis and the segment connecting the lattice point O(x, y) and the corresponding center of gravity G satisfies the following relationship.

$\varphi(x,y)=C\times P(x,y)+B$

C: Proportionality constant, for example, 180/π

B: Arbitrary constant, for example, 0

FIG. 13 is a plan view illustrating an example in which the refractive index structure of FIG. 9 is applied only within a specific region of the phase modulation layer 12B. In the example shown in FIG. 13, a refractive index structure for emitting a target beam pattern, for example, the structure of FIG. 9 is formed inside an inner region RIN of a square shape. On the other hand, a different refractive index region of a perfectly circular shape whose center of gravity coincides with the lattice point position of the square lattice is disposed in an outer region ROUT surrounding the inner region RIN. In the inner region RIN and the outer region ROUT, the lattice spacings of the square lattice set virtually are the same as each other. In the case of this structure, since light is also distributed in the outer region ROUT, it is possible to suppress the generation of high-frequency noise, so-called window function noise, which is caused by a sudden change in light intensity in the periphery of the inner region RIN. In addition, since light leakage in the in-plane direction can be suppressed, it is possible to improve the efficiency of conversion from light generated in the active layer 11 to the laser beam Lout2.

As a method of obtaining an intensity distribution and a phase distribution from the complex amplitude distribution obtained using the Fourier transform, there is the following method. For example, the intensity distribution I(x, y) can be calculated by using the abs function of numerical analysis software "MATLAB" of Math Works. The phase distribution P(x, y) can be calculated by using the angle function of MATLAB.

When the distribution of the rotation angle φ(x, y) is obtained from the Fourier transform result of the light image and the placement of the plurality of different refractive index regions 12*b* is determined, points of attention in the case of calculation using general discrete Fourier transform or fast Fourier transform will be described. When the light image which is a calculation source is divided as shown in part (a) of FIG. 14, each divided portion in the output beam pattern calculated from the complex amplitude distribution obtained by the inverse Fourier transform is as shown in part (b) of FIG. 14. In parts (a) and (b) of FIG. 14, the space is divided into four quadrants of A1, A2, A3, and A4. In this case, as shown in part (b) of FIG. 14, in the first quadrant of the output beam pattern, a pattern appears in which the third quadrant of the original light image is superimposed on the first quadrant of the original light image rotated 180 degrees. In the second quadrant of the output beam pattern, a pattern appears in which the fourth quadrant of the original light image is superimposed on the second quadrant of the original light image rotated 180 degrees. In the third quadrant of the output beam pattern, a pattern appears in which the first quadrant of the original light image is superimposed on the third quadrant of the original light image rotated 180 degrees. In the fourth quadrant of the output beam pattern, a pattern appears in which the second quadrant of the original light image is superimposed on the fourth quadrant of the original light image rotated 180 degrees. The pattern rotated 180 degrees is due to the −1-order light component.

Therefore, in a case where a light image before Fourier transform, that is, an original light image, has values only in the first quadrant, the first quadrant of the original light image appears in the third quadrant of the output beam pattern, and the pattern obtained by rotating the first quadrant of the original light image by 180 degrees appears in the first quadrant of the output beam pattern.

Parts (a) to (d) of FIG. 15 show examples of beam patterns, that is, light images, output from a GaAs-based S-iPM laser of a near-infrared wavelength band using the same principle as in the present embodiment. The center of each drawing is located in the Z direction from the center of the light emitting surface of the S-iPM laser. As shown in these drawings, the S-iPM laser outputs 1-order light including a first light image portion E1, −1-order light including a second light image portion E2, and 0-order light E3. The 1-order light is output in a first direction inclined with respect to an axis extending in the Z direction from the center of the light emitting surface. The −1-order light is output in a second direction symmetrical with the first direction with respect to the axis. The second light image portion E2 is rotationally symmetrical with the first light image portion E1 with respect to the axis. The 0-order light E3 travels on the axis. The above also applies to the surface-emitting laser device 1B of the present embodiment.

In the present embodiment, the light output from the active layer 11 is diffracted by the phase modulation layer 12B while being confined between the lower cladding layer 13 and the upper cladding layer 15. This light forms a predetermined mode according to the lattice structure inside the phase modulation layer 12B. In the phase modulation layer 12B, the centers of gravity of the plurality of different refractive index regions 12*b* have a rotation angle φ(x, y) set for each different refractive index region 12*b* around the lattice point O of a virtual square lattice. In such a case, as compared with a case where the centers of gravity G of the plurality of different refractive index regions 12*b* are located on the lattice points of the square lattice (see FIG. 2), the light intensity of the 0-order light is reduced, and higher-order light such as, for example, 1-order light and −1-order light appears. The 0-order light is light emitted in the thickness direction of the phase modulation layer 12B, in other words, the Z direction perpendicular to the light emitting surface of the surface-emitting laser device 1B. The higher-order light is light emitted in a direction inclined with respect to that direction. Further, the rotation angle φ(x, y) around the lattice point of the center of gravity G of each different refractive index region 12*b* is individually set in accordance with a desired light image. Thereby, the phase of light is modulated independently for each different refractive index region 12*b*, and thus a light image of any spatial shape can be output in the Z direction perpendicular to the light emitting surface and in the direction inclined with respect to the Z direction. This light image, that is, the laser beam Lout2, passes through the lower cladding layer 13 and the semiconductor substrate 8 and is output to the outside of the surface-emitting laser device 1B.

In the first embodiment in which the surface-emitting laser device 1A is a PCSEL, the bandgap width of the upper cladding layer 15 is smaller than the bandgap width of the lower cladding layer 13. On the other hand, in the present embodiment in which the surface-emitting laser device 1B is an iPM laser, the bandgap width of the upper cladding layer 15 is set to be larger than the bandgap width of the lower cladding layer 13. This is because the refractive index of the upper cladding layer 15 is made smaller than the refractive index of the lower cladding layer 13 to prevent a mode originating from the upper cladding layer 15 from competing with the fundamental mode centered on the active layer 11 and the phase modulation layer 12B. In the iPM laser, the mode originating from the upper cladding layer 15 may be distributed in the phase modulation layer 12B to form a band structure and anti-intersect the band structure of the fundamental mode. This causes noise in the output light image. As described above, since the bandgap width of the upper cladding layer 15 is larger than the bandgap width of the lower cladding layer 13, it is possible to suppress the competition between these modes and to reduce noise contained in the output light image.

Specifically, in a case where the lower cladding layer 13 and the upper cladding layer 15 contain Al as a composition, the Al composition ratio of the upper cladding layer 15 is higher than the Al composition ratio of the lower cladding layer 13. In one example, the semiconductor substrate 8 is a GaAs substrate, and the active layer 11, the phase modulation layer 12B, the lower cladding layer 13, the light guide layer 14, the upper cladding layer 15, the relaxation layer 16A, and the contacting layer 17 are composed of a GaAs-based semiconductor. In an example, the lower cladding layer 13 and the light guide layer 14 are AlGaAs layers, the active layer 11 has a multi-quantum well structure, the barrier layer of a multi-quantum well structure is composed of AlGaAs, the quantum well layer is composed of InGaAs, the number of layers of the well layer is, for example, three, the basic region 12*a* of the phase modulation layer 12B is an AlGaAs layer or a GaAs layer, the different refractive index region 12*b* is a hole, the upper cladding layer 15 and the relaxation layer 16A are AlGaAs layers, and the contacting layer 17 is a GaAs layer. In this case, the thickness of the semiconductor substrate 8 is, for example, 150 μm. The thickness of the lower cladding layer 13 is, for example, 2,000 nm. The thickness of the light guide layer 14 is, for example, 80 nm. The thicknesses of the well layer and the barrier layer of the active layer 11 are, for example, 10 nm. The thickness of the phase modulation layer 12B is, for example, 300 nm. The thickness of the upper cladding layer 15 is, for example, 1,500 nm. The thickness of the relaxation layer 16A is, for example, 500 nm. The thickness of the contacting layer 17 is, for example, 150 nm. The Al composition ratio of the lower cladding layer 13 is, for example, 43 atom %. The Al composition ratio of the light guide layer 14 is, for example, 15 atom %. The Al composition ratio of the barrier layer of the active layer 11 is, for example, 15 atom %. The Al composition ratio of the upper cladding layer 15 is, for example, 70 atom %. The Al composition ratio of the relaxation layer 16A at the interface with the upper cladding layer 15 is, for example, 70 atom %. The Al composition ratio of the relaxation layer 16A at the interface with the contacting layer 17 is, for example, 0 atom %. The Al composition ratio of the contacting layer 17 is, for example, 0 atom %.

In the surface-emitting laser device 1B of the present embodiment, similarly to the above embodiment, the relaxation layer 16A also has a bandgap width that is between the bandgap width of the upper cladding layer 15 and the bandgap width of the contacting layer 17. Therefore, the rate of change in bandgap width occurring between the upper cladding layer 15 and the contacting layer 17 is relaxed by the relaxation layer 16A, and the potential barrier is reduced. Therefore, the electric resistance of the device is lowered, and thus sufficient laser oscillation can be obtained even at a low drive voltage. As a result, it is possible to reduce power consumption, to improve the reliability of the device, and to extend the lifespan of the device. Additionally, in the surface-emitting laser device 1B which is an iPM laser, supply of a uniform current to the entire active layer 11 is required in order to improve the quality of the light image. In a case where the different refractive index region 12*b* is a hole, the phase modulation layer 12B has a relatively high resistance, but a reduction in voltage due to the relaxation layer 16A makes it possible to nearly uniformly supply a current to the entire active layer 11 even at a low driving current. The surface-emitting laser device 1B of the present embodiment can be manufactured through the same steps as the surface-emitting laser device 1A of the first embodiment.

In the present embodiment, the bandgap width of the relaxation layer 16A may also change continuously so as to approach the bandgap width of the contacting layer 17 from the bandgap width of the upper cladding layer 15. In this case, the potential barrier can be effectively reduced, and thus the above effect of the surface-emitting laser device 1B of the present embodiment can be obtained more remarkably.

In the present embodiment, the upper cladding layer 15 and the relaxation layer 16A may also contain Al as a composition. The Al composition ratio of the relaxation layer 16A may be smaller than the Al composition ratio of the upper cladding layer 15. In the case of the iPM laser, in order to reduce a mode originating from the contacting layer 17, the thickness of the contacting layer 17 may be set to be smaller than that of the PCSEL. In that case, oxygen atoms are likely to pass through the contacting layer 17, and Al in the upper cladding layer 15 is more likely to be oxidized in a case where the relaxation layer 16A is not provided. Alternatively, in a case where growth is interrupted between the upper cladding layer 15 and the contacting layer 17, Al in the upper cladding layer 15 is likely to be oxidized. Therefore, reducing the influence of oxidation of Al with the relaxation layer 16A is particularly useful in the iPM laser as in the present embodiment.

In the present embodiment, the Al composition ratio of the relaxation layer 16A may also decrease continuously from the interface on the upper cladding layer 15 side toward the interface on the contacting layer 17 side. In this case, the oxidation of Al can be effectively reduced, and thus the above effect can be obtained more remarkably.

As described above, the refractive index of the upper cladding layer 15 may be smaller than the refractive index of the lower cladding layer 13. In this case, the coupling between the mode generated in the contacting layer 17 and the fundamental mode can be suppressed. Thereby, it is possible to improve the quality of the output light and to further reduce noise included in the output light image. As the refractive index of the upper cladding layer 15 becomes smaller, the bandgap width of the upper cladding layer 15 increases, and the bandgap difference between the upper cladding layer 15 and the contacting layer 17 increases. The surface-emitting laser device 1B of the present embodiment including the relaxation layer 16A between the upper cladding layer 15 and the contacting layer 17 is particularly useful in such a case.

As described above, in a case where the lower cladding layer 13 and the upper cladding layer 15 contain Al as a composition, the Al composition ratio of the upper cladding layer 15 may be higher than the Al composition ratio of the lower cladding layer 13. In this case, the refractive index of the upper cladding layer 15 is smaller than the refractive index of the lower cladding layer 13. Therefore, as described above, it is possible to suppress the mode generated in the upper cladding layer 15, to improve the quality of the output light, and to further reduce noise included in the output light image. In a case where the Al composition ratio of the upper cladding layer 15 is high as described above, the surface-emitting laser device 1B of the present embodiment including the relaxation layer 16A is particularly useful.

In a case where the Al composition ratio of the upper cladding layer 15 is high as described above, the difference in lattice constant with the contacting layer 17 increases. Therefore, in a case where the upper cladding layer 15 and the contacting layer 17 are in contact with each other, the distortion of the crystal structure of the contacting layer 17 increases. As a result, crystal defects such as dislocations on the device surface increase, which is a factor in deteriorating the quality of the light image. In the present embodiment, the relaxation layer 16A is provided. The relaxation layer 16A has an Al composition ratio between the Al composition ratio of the upper cladding layer 15 and the Al composition ratio of the contacting layer 17. This makes it possible to relax the distortion of the crystal structure of the contacting layer 17, to reduce crystal defects on the device surface, and to suppress deterioration in the quality of the light image.

In the present embodiment, the thickness of the relaxation layer 16A may also be smaller than the thickness of the upper cladding layer 15. In this case, since the thickness of the upper cladding layer 15 is relatively thick, the relaxation layer 16A having a refractive index larger than the upper cladding layer 15 is separated from the phase modulation layer 12B and the active layer 11. Therefore, it is possible to suppress the coupling of the mode of the relaxation layer 16A to the phase modulation layer 12B. This makes it possible to stabilize the fundamental mode, to improve the quality of the output light, and to further reduce noise included in the output light image.

In the present embodiment, the relaxation layer 16A may also be located at distance of 1 μm or more or 1.5 μm or more from both the active layer 11 and the phase modulation layer 12B. In this case, since the relaxation layer 16A having a refractive index larger than the upper cladding layer 15 is separated from the active layer 11 and the phase modulation layer 12B, it is possible to suppress the coupling of the mode of the relaxation layer 16A to the phase modulation layer 12B. This makes it possible to stabilize the fundamental mode, to improve the quality of the output light, and to further reduce noise included in the output light image.

Here, an example of the surface-emitting laser device 1B of the present embodiment is shown. The following Table 2 shows an example of the composition and thickness of each layer constituting the surface-emitting laser device 1B. In this example, the relaxation layer 16A is located at distance of 1.5 μm from the phase modulation layer 12B. Part (a) of FIG. 16 is a graph illustrating a refractive index distribution G21 of the surface-emitting laser device 1B having the configuration shown in Table 2, a fundamental mode distribution G22 generated around the active layer 11 and the phase modulation layer 12B, and a mode distribution G23 generated around the relaxation layer 16A and the contacting layer 17. Part (b) of FIG. 16 shows an enlarged view of the vicinity of the active layer 11 and the phase modulation layer 12B in part (a) of FIG. 16. Part (a) of FIG. 17 is a graph illustrating the refractive index distribution G11 and the fundamental mode distribution G12 of the surface-emitting laser device without the relaxation layer 16A for the purpose of comparison. Part (b) of FIG. 17 shows an enlarged view of the vicinity of the active layer 11 and the phase modulation layer 12B in part (a) of FIG. 17. In the drawing, a section Tclad1 corresponds to the lower cladding layer 13, a section Tac corresponds to the active layer 11, a section Tpm corresponds to the phase modulation layer 12B, a section Tclad2 corresponds to the upper cladding layer 15, a section Trelax corresponds to the relaxation layer 16A, a section Tcont corresponds to the contacting layer 17, and a section Tair corresponds to air.

TABLE 2

| Layer structure | Layer thickness (nm) |
|---|---|
| p-type GaAs contacting layer | 150 |
| p-type AlGaAs relaxation layer (Al composition: 70% → 0%) | 500 |
| p-type AlGaAs upper cladding layer (Al composition: 70%) | 1500 |
| Phase modulation layer (base region: i-type GaAs, different refractive index region: hole, filling factor 15%) | 240 |
| Only base region of phase modulation layer (i-type GaAs) | 40 |
| i-type InGaAs/AlGaAs active layer | 175 |
| n-type AlGaAs lower cladding layer (Al composition: 40%) | 2000 |
| n-type GaAs substrate | — |

Referring to parts (a) and (b) of FIG. 16, the electric field of the mode distribution G23 is almost zero in the phase modulation layer 12B and does not contribute to diffraction in the phase modulation layer 12B. Additionally, the coupling coefficient between the fundamental mode distribution G22 and the mode distribution G23 is almost zero. From the above, it can be seen that the relaxation layer 16A having a refractive index larger than the refractive index of the upper cladding layer 15 is sufficiently separated from the active layer 11 and the phase modulation layer 12B, and thus coupling of the mode generated in the relaxation layer 16A and the contacting layer 17 to the fundamental mode generated around the active layer 11 and the phase modulation layer 12B can be sufficiently suppressed.

Third Embodiment

The S-iPM laser is not limited to the configuration of the second embodiment described above. For example, even with the configuration of the phase modulation layer of the present embodiment, the S-iPM laser can be suitably realized. FIG. 18 is a plan view of a phase modulation layer 12C served as a resonance mode forming layer included in an optical device according to a third embodiment. FIG. 19 is a diagram illustrating a positional relationship of the different refractive index regions 12*b* in the phase modulation layer 12C.

As shown in FIGS. 18 and 19, in the phase modulation layer 12C, the centers of gravity G of the plurality of different refractive index regions 12*b* are arranged on each of a plurality of straight lines D. Each of the straight lines D is a straight line that passes through the corresponding lattice point O of each unit constituent region R and inclined with respect to each side of the square lattice. In other words, the straight line D is a straight line inclined with respect to both the X axis and the Y axis. The inclination angle of the straight line D with respect to one side along the X axis of the square lattice is 0. The inclination angle θ is uniform within the phase modulation layer 12C. The inclination angle θ satisfies $0° < \theta < 90°$, and in an example, $\theta = 45°$. Alternatively, the inclination angle θ satisfies $180° < \theta < 270°$, and is an example, $\theta = 225°$. In a case where the inclination angle θ satisfies $0° < \theta < 90°$ or $180° < \theta < 270°$, the straight line D extends from the first quadrant to the third quadrant of the coordinate plane defined by the X axis and the Y axis. Alternatively, the inclination angle θ satisfies $90° < \theta < 180°$, and in an example, $\theta = 135°$. Alternatively, the inclination angle θ satisfies $270° < \theta < 360°$, and in an example, $\theta = 315°$. In a case where the inclination angle θ satisfies $90° < \theta < 180°$ or $270° < \theta < 360°$, the straight line D extends from the second quadrant to the fourth quadrant of the coordinate plane defined by the X axis and the Y axis. In this manner, the inclination angle θ is an angle excluding 0°, 90°, 180°, and 270°. By inclining the straight line D with respect to the square lattice, both light waves traveling in the X-axis direction and light waves traveling in the Y-axis direction can be caused to contribute to the optical output beam. Here, r(x, y) is set to the distance between the lattice point O and the center of gravity G. In addition, x indicates the position of the x-th lattice point on the X axis, and y indicates the position of the y-th lattice point on the Y axis. In a case where the distance r(x, y) is a positive value, the center of gravity G is located in the first quadrant or the second quadrant. In a case where the distance r(x, y) is a negative value, the center of gravity G is located in the third quadrant or the fourth quadrant. In a case where the distance r(x, y) is 0, the center of gravity G coincides with the lattice point O.

The distance r(x, y) between the center of gravity G of each different refractive index region 12*b* and the corresponding lattice point O of each unit constituent region R is individually set for each different refractive index region 12*b* in accordance with a desired light image. The distances r(x, y) between the centers of gravity G of at least two different refractive index regions 12*b* and the lattice points O are different from each other. The distribution of the distance r(x, y) has a specific value for each position determined by the x and y values, but is not necessarily represented by a specific function. The distribution of the distance r(x, y) is determined from the phase distribution extracted from the complex amplitude distribution obtained by performing inverse Fourier transform on a desired light image. That is, in a case where the phase P(x, y) at certain coordinates (x, y) is $P_0$, the distance r(x, y) is set to 0. In a case where the phase P(x, y) is $\pi + P_0$, the distance r(x, y) is set to the maximum value $R_0$. In a case where the phase P(x, y) is $-\tau + P_0$, the distance r(x, y) is set to the minimum value $-R_0$. For a phase P(x, y) halfway between $P_0$ and $x + P_0$, or halfway between $-\pi + P_0$ and $P_0$, the distance r(x, y) is set so that $r(x, y) = \{P(x, y) - P_0\} \times R_0/\pi$. Here, the initial phase $P_0$ can be set arbitrarily. When the lattice spacing of the square lattice is a, the maximum value $R_0$ of r(x, y) is, for example, in the range of the following Formula (8).

[Formula 8]

$$0 \leq R_0 \leq \frac{a}{\sqrt{2}} \tag{8}$$

When the complex amplitude distribution is obtained from a desired light image, the reproducibility of the beam pattern is improved by applying an iterative algorithm such as a GS method which is generally used in calculation for generating a hologram.

In the present embodiment, a desired light image can be obtained by determining the distribution of the distance r(x, y) of the different refractive index region 12*b* of the phase modulation layer 12C according to the following procedure. Under the first to fourth preconditions described in the second embodiment, the phase modulation layer 12C is configured to satisfy the following conditions. That is, the different refractive index region 12*b* is disposed in the unit constituent region R(x, y) so that the distance r(x, y) satisfies the following relationship.

$$r(x,y) = C \times (P(x,y) - P_0)$$

C: Proportionality constant, for example, $R_0/\pi$ $P_0$: Arbitrary constant, for example, 0

In a case where a desired light image is desired to be obtained, it is preferable that inverse discrete Fourier transform is performed on the light image and that the distribution of the distance r(x, y) according to the phase P(x, y) of the complex amplitude is given to the plurality of different refractive index regions 12*b*. The phase P(x, y) and the distance r(x, y) may be proportional to each other.

In the present embodiment, the refractive index structure of FIG. 18 may also be applied only within a specific region of the phase modulation layer 12C. For example, as in the example shown in FIG. 13, a refractive index structure for emitting a target beam pattern, for example, the structure of FIG. 18 may be formed inside an inner region RIN of the square shape. In this case, a different refractive index region of a perfectly circular shape whose center of gravity coincides with the lattice point position of the square lattice is disposed in an outer region ROUT surrounding the inner region RIN. In the inner region RIN and the outer region ROUT, the lattice spacings of the square lattice set virtually are the same as each other. In the case of this structure, since light is also distributed in the outer region ROUT, it is possible to suppress the generation of high-frequency noise, so-called window function noise, which is caused by a sudden change in light intensity in the periphery of the inner region RIN. In addition, since light leakage in the in-plane direction can be suppressed, it is possible to improve the efficiency of conversion from light generated in the active layer 11 to the laser beam Lout2.

As a method of obtaining an intensity distribution and a phase distribution from the complex amplitude distribution obtained using the inverse Fourier transform, there is the following method. For example, the intensity distribution I(x, y) can be calculated by using the abs function of numerical analysis software "MATLAB" of Math Works.

The phase distribution P(x, y) can be calculated by using the angle function of MATLAB. When the phase distribution P(x, y) is obtained from the inverse Fourier transform result of the light image and the distance r(x, y) of each different refractive index region 12*b* is determined, points of attention in the case of calculation using general discrete Fourier transform or fast Fourier transform are the same as in the second embodiment described above.

In the present embodiment, the light output from the active layer 11 is diffracted by the phase modulation layer 12C while being confined between the lower cladding layer 13 and the upper cladding layer 15. This light forms a predetermined mode according to the lattice structure inside the phase modulation layer 12C. In the phase modulation layer 12C, the centers of gravity G of the plurality of different refractive index regions 12*b* are located on a plurality of straight lines D that pass through each of the lattice points O of a virtual square lattice and are inclined with respect to the square lattice. The distance r(x, y) between the center of gravity G of each different refractive index region 12*b* and the corresponding lattice point O is individually set in accordance with the light image. In such a case, as compared with a case where the centers of gravity G of the plurality of different refractive index regions 12*b* are located on the lattice points O of the square lattice (see FIG. 2), the light intensity of the 0-order light is reduced, and higher-order light such as, for example, 1-order light and −1-order light appears. The 0-order light is light emitted in thickness direction of the phase modulation layer 12C, in other words, the Z direction perpendicular to the light emitting surface of the surface-emitting laser device. The higher-order light is light emitted in a direction inclined with respect to that direction. Further, the distance r(x, y) between the center of gravity G of each different refractive index region 12*b* and the corresponding lattice point O is individually set in accordance with a desired light image. Thereby, the phase of light is modulated independently for each different refractive index region 12*b*, and thus a light image of any spatial shape can be output in the Z direction perpendicular to the light emitting surface and in the direction inclined with respect to the Z direction. This light image, that is, the laser beam Lout2, passes through the lower cladding layer 13 and the semiconductor substrate 8 and is output to the outside of the surface-emitting laser device.

In the surface-emitting laser device of the present embodiment, similarly to each of the embodiments, the relaxation layer 16A also has a bandgap width that is between the bandgap width of the upper cladding layer 15 and the bandgap width of the contacting layer 17. Therefore, the rate of change in bandgap width occurring between the upper cladding layer 15 and the contacting layer 17 is relaxed by the relaxation layer 16A, and the potential barrier is reduced. Therefore, the electric resistance of the device is lowered, and thus sufficient laser oscillation can be obtained even at a low drive voltage. As a result, it is possible to reduce power consumption, to improve the reliability of the device, and to extend the lifespan of the device. Additionally, the configuration of the surface-emitting laser device of the present embodiment is the same as that of the surface-emitting laser device 1B of the second embodiment except for the phase modulation layer 12C, and thus the surface-emitting laser device of the present embodiment can achieve the same operational effects as the surface-emitting laser device 1B of the second embodiment. The surface-emitting laser device of the present embodiment can be manufactured through the same steps as the surface-emitting laser device 1A of the first embodiment.

(First Modification)

FIG. 20 is a schematic diagram illustrating a cross-sectional configuration of a surface-emitting laser device 1C according to a first modification. The surface-emitting laser device 1C differs from the second embodiment or the third embodiment in that a portion of the contacting layer 17 excluding the portion provided with the second electrode 22 is removed, and coincides with these embodiments in other respects. In the present modification, the area of the contacting layer 17 is smaller than the area of the relaxation layer 16A when viewed in the thickness direction. The relaxation layer 16A is exposed from the contacting layer 17 around the contacting layer 17. With such a configuration, it is possible to limit the path of a current supplied from the second electrode 22 and to efficiently supply the current to the active layer 11.

In a case where the portion of the contacting layer 17 excluding the portion provided with the second electrode 22 is removed in this way, the upper cladding layer 15 is exposed in a conventional surface-emitting laser device in which the relaxation layer 16A is not provided, that is, the upper cladding layer 15 and the contacting layer 17 are in contact with each other. Thus, Al in the upper cladding layer 15 is more likely to be oxidized. In the surface-emitting laser device 1C of the present modification, the relaxation layer 16A of which the Al composition ratio is smaller than that of the upper cladding layer 15 is exposed. This makes it possible to reduce the amount of Al oxide on the exposed surface and to reduce the influence of oxidation of Al.

(Second Modification)

FIG. 21 is a diagram schematically illustrating a cross-sectional configuration of a surface-emitting laser device 1D according to a second modification. The surface-emitting laser device 1D differs from the first embodiment in that it includes a relaxation layer 16B instead of the relaxation layer 16A, and coincides with the first embodiment in other respects. The relaxation layer 16B is provided by epitaxial growth on the upper cladding layer 15 and is in contact with the upper cladding layer 15. The relaxation layer 16B is provided to relax a potential barrier caused by a bandgap difference between the upper cladding layer 15 and the contacting layer 17. The relaxation layer 16B is composed of, for example, the same constituent elements as the upper cladding layer 15. The relaxation layer 16B has a bandgap width that is between the bandgap width of the upper cladding layer 15 and the bandgap width of the contacting layer 17. FIG. 21 shows a graph G3 illustrating a distribution of the bandgap width of the relaxation layer 16B in the thickness direction. In the graph G3, the horizontal axis represents the bandgap width and the vertical axis represents the position in the thickness direction. As shown in the graph G3, in the present modification, the bandgap width of the relaxation layer 16B is constant in the thickness direction from the interface on the upper cladding layer 15 side to the interface on the contacting layer 17 side. The difference between the bandgap width at the interface of the relaxation layer 16B on the upper cladding layer 15 side and the bandgap width of the upper cladding layer 15 may be equal to the difference between the bandgap width at the interface of the relaxation layer 16B on the contacting layer 17 side and the bandgap width of the contacting layer 17.

In a case where the upper cladding layer 15 contains Al as a composition, the relaxation layer 16B also functions as a layer that prevents the oxidation of Al in the upper cladding layer 15. In this case, the relaxation layer 16B also contains Al. The relaxation layer 16B has an Al composition ratio that is between the Al composition ratio of the upper cladding layer 15 and the Al composition ratio of the contacting layer 17. FIG. 21 shows a graph G4 a distribution of the Al composition ratio of the relaxation layer 16B in the thickness direction. In the graph G4, the horizontal axis represents the Al composition ratio and the vertical axis represents the position in the thickness direction. As shown in the graph G4, in the present modification, the Al composition ratio of the relaxation layer 16B is constant in the thickness direction from the interface on the upper cladding layer 15 side to the interface on the contacting layer 17 side.

The thickness of the relaxation layer 16B is smaller than the thickness of the upper cladding layer 15. The thickness of the relaxation layer 16B is in the same range as the thickness of the relaxation layer 16A of the first embodiment. The relaxation layer 16B is located at distance of 1 μm or more from both the photonic crystal layer 12A and the active layer 11, and is located at a distance of, more suitably, 1.5 μm or more from both the photonic crystal layer 12A and the active layer 11. That is, in a case where only the upper cladding layer 15 is provided between the relaxation layer 16B and both the photonic crystal layer 12A and the active layer 11, the thickness of the upper cladding layer 15 is 1 μm or more, more suitably 1.5 μm or more. The sum of the thickness of the upper cladding layer 15 and the thickness of the relaxation layer 16B may be equal to the thickness of the lower cladding layer 13.

As in the present modification, the bandgap width of the relaxation layer 16B may be constant in the thickness direction. In such a case, the relaxation layer 16B also has a bandgap width that is between the bandgap width of the upper cladding layer 15 and the bandgap width of the contacting layer 17. Therefore, as compared with a case where the relaxation layer 16B is not provided, the rate of change in bandgap width occurring between the upper cladding layer 15 and the contacting layer 17 is relaxed, and the potential barrier is reduced. Therefore, the electric resistance of the device is lowered, and thus sufficient laser oscillation can be obtained even at a low drive voltage. As a result, it is possible to reduce power consumption and to improve the reliability of the device.

As in the present modification, the Al composition ratio of the relaxation layer 16B may be constant in the thickness direction. In such a case, the relaxation layer 16B having an Al composition ratio smaller than the Al composition ratio of the upper cladding layer 15 is also interposed between the contacting layer 17 and the upper cladding layer 15, and thus it is possible to reduce the influence of oxidation of Al. That is, according to the present modification, it is possible to suppress an increase in electric resistance due to the oxidation of Al and to obtain sufficient laser oscillation at a lower drive voltage. As a result, it is possible to make power consumption smaller and to further improve the reliability of the device.

Each embodiment and each modification described above other than the first embodiment may also include the relaxation layer 16B of the present modification instead of the relaxation layer 16A. This makes it possible to achieve the same effects as described above.

An example of the surface-emitting laser device 1D of the present modification is shown. The following Table 3 shows an example of the composition and thickness of each layer constituting the surface-emitting laser device 1D. In this example, the relaxation layer 16B is located at distance of 1.5 μm from the photonic crystal layer 12A. Part (a) of FIG. 22 is a graph illustrating a refractive index distribution G31 of the surface-emitting laser device 1D having the configuration shown in Table 3, a fundamental mode distribution G32 generated around the active layer 11 and the photonic crystal layer 12A, and a mode distribution G33 generated around the relaxation layer 16B and the contacting layer 17. Part (b) of FIG. 22 shows an enlarged view of the vicinity of the active layer 11 and the photonic crystal layer 12A in part (a) of FIG. 22. In the drawing, a section Tclad1 corresponds to the lower cladding layer 13, a section Tac corresponds to the active layer 11, a section Tpc corresponds to the photonic crystal layer 12A, a section Tclad2 corresponds to the upper cladding layer 15, a section Trelax corresponds to the relaxation layer 16B, a section Tcont corresponds to the contacting layer 17, and a section Tair corresponds to air.

TABLE 3

| Layer structure | Layer thickness (nm) |
|---|---|
| p-type GaAs contacting layer | 150 |
| p-type AlGaAs relaxation layer (Al composition: 20% constant) | 500 |
| p-type AlGaAs upper cladding layer (Al composition: 40%) | 1500 |
| Photonic crystal layer (base region: i-type GaAs, different refractive index region: hole, filling factor 15%) | 240 |
| Only base region of photonic crystal layer (i-type GaAs) | 60 |
| i-type InGaAs/AlGaAs active layer | 175 |
| n-type AlGaAs lower cladding layer (Al composition: 70%) | 2000 |
| n-type GaAs substrate | — |

Referring to parts (a) and (b) of FIG. 22, the electric field of the mode distribution G33 is almost zero in the photonic crystal layer 12A and does not contribute to diffraction in the photonic crystal layer 12A. Additionally, the coupling coefficient between the fundamental mode distribution G32 and the mode distribution G33 is almost zero. From the above, it can be seen that the relaxation layer 16B having a refractive index larger than the refractive index of the upper cladding layer 15 is sufficiently separated from the active layer 11 and the photonic crystal layer 12A, and thus coupling of the mode generated in the relaxation layer 16B and the contacting layer 17 to the fundamental mode generated around the active layer 11 and the photonic crystal layer 12A can be sufficiently suppressed.

The following Table 4 shows an example of the composition and thickness of each layer constituting the surface-emitting laser device in a case where the surface-emitting laser device 1B of the second embodiment includes the relaxation layer 16B of the present modification instead of the relaxation layer 16A. In this example, the relaxation layer 16B is located at distance of 1.5 μm from the phase modulation layer 12B. Part (a) of FIG. 23 is a graph illustrating a refractive index distribution G41 of the surface-emitting laser device having the configuration shown in Table 4, a fundamental mode distribution G42 generated around the active layer 11 and the phase modulation layer 12B, and a mode distribution G43 generated around the relaxation layer 16B and the contacting layer 17. Part (b) of FIG. 23 shows an enlarged view of the vicinity of the active layer 11 and the phase modulation layer 12B in part (a) of FIG. 23. In the drawing, a section Tclad1 corresponds to the lower cladding layer 13, a section Tac corresponds to the active layer 11, a section Tpm corresponds to the phase modulation layer 12B, a section Tclad2 corresponds to the upper cladding layer 15, a section Trelax corresponds to the relaxation layer 16B, a section Tcont corresponds to the contacting layer 17, and a section Tair corresponds to air.

TABLE 4

| Layer structure | Layer thickness (nm) |
|---|---|
| p-type GaAs contacting layer | 150 |
| p-type AlGaAs relaxation layer (Al composition: 40% constant) | 500 |
| p-type AlGaAs upper cladding layer (Al composition: 70%) | 1500 |
| Phase modulation layer (base region: i-type GaAs, different refractive index region: hole, filling factor 15%) | 240 |
| Only base region of phase modulation layer (i-type GaAs) | 40 |
| i-type InGaAs/AlGaAs active layer | 175 |
| n-type AlGaAs lower cladding layer (Al composition: 40%) | 2000 |
| n-type GaAs substrate | — |

Referring to parts (a) and (b) of FIG. 23, the electric field of the mode distribution G43 is almost zero in the phase modulation layer 12B and does not contribute to diffraction in the phase modulation layer 12B. Additionally, the coupling coefficient between the fundamental mode distribution G42 and the mode distribution G43 is almost zero. From the above, it can be seen that the relaxation layer 16B having a refractive index larger than the refractive index of the upper cladding layer 15 is sufficiently separated from the active layer 11 and the phase modulation layer 12B, and thus coupling of the mode generated in the relaxation layer 16B and the contacting layer 17 to the fundamental mode generated around the active layer 11 and the phase modulation layer 12B can be sufficiently suppressed.

(Third Modification)

FIG. 24 is a diagram schematically illustrating a cross-sectional configuration of a surface-emitting laser device 1E according to a third modification. The surface-emitting laser device 1E differs from the first embodiment in that it includes a relaxation layer 16C instead of the relaxation layer 16A, and coincides with the first embodiment in other respects. The relaxation layer 16C differs from the relaxation layer 16B of the second modification in the distribution of the bandgap width in the thickness direction and the distribution of the Al composition, and coincides with the relaxation layer 16B of the second modification in other respects.

The relaxation layer 16C has a bandgap width that is between the bandgap width of the upper cladding layer 15 and the bandgap width of the contacting layer 17. The bandgap width of the relaxation layer 16C decreases monotonically from the interface on the upper cladding layer 15 side toward the interface on the contacting layer 17 side. FIG. 24 shows a graph G5 illustrating a distribution of the bandgap width of the relaxation layer 16C in the thickness direction. In the graph G5, the horizontal axis represents the bandgap width and the vertical axis represents the position in the thickness direction. As shown in the graph G5, in the present modification, the bandgap width of the relaxation layer 16C changes stepwise from the bandgap width of the upper cladding layer 15 toward the bandgap width of the contacting layer 17. In the shown example, since the bandgap width of the contacting layer 17 is smaller than the bandgap width of the upper cladding layer 15, the bandgap width of the relaxation layer 16C decreases stepwise from the interface on the upper cladding layer 15 side toward the interface on the contacting layer 17 side. In FIG. 24, the distribution of the bandgap width of the relaxation layer 16C is represented by the shade of color, and the bandgap width increases as the color becomes darker. The number of changes in the step change in bandgap width may be any value equal to or greater than 1 such as, for example, two or three times. However, the number of changes does not include a change at the interface with the upper cladding layer 15 and a change at the interface with the contacting layer 17. The bandgap width may be constant between a certain change and another change. Alternatively, the bandgap width may change continuously between a certain change and another change so as to gradually decrease toward the interface on the contacting layer 17 side.

In a case where the upper cladding layer 15 and the relaxation layer 16C contain Al as a composition, the relaxation layer 16C has an Al composition ratio that is between the Al composition ratio of the upper cladding layer 15 and the Al composition ratio of the contacting layer 17. The Al composition ratio of the relaxation layer 16C decreases monotonically from the interface on the upper cladding layer 15 side toward the interface on the contacting layer 17 side. FIG. 24 shows a graph G6 illustrating a distribution of the Al composition ratio of the relaxation layer 16C in the thickness direction. In the graph G6, the horizontal axis represents the Al composition ratio and the vertical axis represents the position in the thickness direction. As shown in the graph G6, in the present modification, the Al composition ratio of the relaxation layer 16C decreases stepwise from the interface on the upper cladding layer 15 side to the interface on the contacting layer 17 side. The number of changes in the step change in Al composition ratio may be any value equal to or greater than 1 such as, for example, two or three times. However, the number of changes does not include a change at the interface with the upper cladding layer 15 and a change at the interface with the contacting layer 17. The Al composition ratio may be constant between a certain change and another change. Alternatively, the Al composition ratio may change continuously between a certain change and another change so as to gradually decrease toward the interface on the contacting layer 17 side.

As in the present modification, the bandgap width of the relaxation layer 16C may change stepwise from the bandgap width of the upper cladding layer 15 toward the bandgap width of the contacting layer 17. In such a case, the relaxation layer 16C also has a bandgap width that is between the bandgap width of the upper cladding layer 15 and the bandgap width of the contacting layer 17. Therefore, as compared with a case where the relaxation layer 16C is not provided, the rate of change in bandgap width occurring between the upper cladding layer 15 and the contacting layer 17 is relaxed, and the potential barrier is reduced. Therefore, the electric resistance of the device is lowered, and thus sufficient laser oscillation can be obtained even at a low drive voltage. As a result, it is possible to reduce power consumption and to improve the reliability of the device.

As in the present modification, the Al composition ratio of the relaxation layer 16C may decrease stepwise from the interface on the upper cladding layer 15 side toward the interface on the contacting layer 17 side. In such a case, the relaxation layer 16C having an Al composition ratio smaller than the Al composition ratio of the upper cladding layer 15 is also interposed between the contacting layer 17 and the upper cladding layer 15, and thus it is possible to reduce the influence of oxidation of Al. That is, according to the present modification, it is possible to suppress an increase in electric resistance due to the oxidation of Al and to obtain sufficient laser oscillation at a lower drive voltage. As a result, it is possible to make power consumption smaller and to further improve the reliability of the device.

Each embodiment and each modification described above other than the first embodiment and the second modification may also include the relaxation layer 16C of the present modification instead of the relaxation layer 16A. This makes it possible to achieve the same effects as described above.

(Fourth Modification)

A modification of the phase modulation layer 12B of the second embodiment will be described in detail. In the present modification, the lattice spacing a of a virtual square lattice and the emission wavelength λ of the active layer 11 satisfy the conditions for M-point oscillation. Further, when a reciprocal lattice space, in other words, a wavenumber space is considered in the phase modulation layer 12B, in-plane wavenumber vectors in four directions representing standing waves are formed. The in-plane wavenumber vectors in four directions each contain a wavenumber spread corresponding to the angular spread of light that undergoes phase modulation caused by the distribution of the rotation angle φ(x, y) to form a light image. The magnitude of at least one in-plane wavenumber vector out of these in-plane wavenumber vectors is smaller than 2π/λ. In the following description, a boundary specifying a range in which the magnitude of the in-plane wavenumber vector is equal to or less than 2π/λ is referred to as a light line. These points will be described in detail below.

First, for the purpose of comparison, a photonic crystal laser (PCSEL) of Γ-point oscillation in the reciprocal lattice space will be described. The PCSEL has an active layer and a photonic crystal layer. In the photonic crystal layer, a plurality of different refractive index regions are periodically arrayed two-dimensionally. The PCSEL forms a standing wave with an oscillation wavelength corresponding to the array period of the different refractive index regions in a plane perpendicular to the thickness direction of the photonic crystal layer. The PCSEL outputs a laser beam in the normal direction of the main surface of the semiconductor substrate. For Γ-point oscillation, the lattice spacing a of the virtual square lattice, the emission wavelength λ of the active layer 11, and the equivalent refractive index n of the mode need only satisfy the condition: λ=na.

FIG. 25 is a plan view illustrating a reciprocal lattice space, in other words, a wavenumber space, for the photonic crystal layer of a PCSEL of Γ-point oscillation. FIG. 25 shows a case where a plurality of different refractive index regions are located on the lattice points of a square lattice. A plurality of points P in the drawing represent reciprocal lattice points. A plurality of arrows B1 in the drawing represent fundamental reciprocal lattice vectors. Each of a plurality of arrows B2 represents a reciprocal lattice vector which is twice the fundamental reciprocal lattice vector B1. Arrows K1, K2, K3, and K4 represent four in-plane wavenumber vectors. The four in-plane wavenumber vectors K1, K2, K3, and K4 combine with each other through diffraction of 90° and 180° to form a standing wave state. Here, a Γ-X axis and a Γ-Y axis which are orthogonal to each other in the reciprocal lattice space are defined. The Γ-X axis is parallel to one side of the square lattice, and the Γ-Y axis is parallel to the other side of the square lattice. The in-plane wavenumber vector is a vector obtained by projecting a wavenumber vector into the Γ-X/Γ-Y plane. That is, the in-plane wavenumber vector K1 points in the positive direction of the Γ-X axis. The in-plane wavenumber vector K2 points in the positive direction of the Γ-Y axis. The in-plane wavenumber vector K3 points in the negative direction of the Γ-X axis. The in-plane wavenumber vector K4 points in the negative direction of the Γ-Y axis. As is obvious from FIG. 25, in the PCSEL of Γ-point oscillation, the magnitude of the in-plane wavenumber vectors K1 to K4, that is, the magnitude of the standing waves in the in-plane direction, is equal to the magnitude of the fundamental reciprocal lattice vector B1. The magnitude k of the in-plane wavenumber vectors K1 to K4 is given by the following Formula (9).

[Formula 9]

$$k = |B1| = \frac{2\pi}{a} \tag{9}$$

FIG. 26 is a perspective view of the reciprocal lattice space shown in FIG. 25, in a three-dimensional manner. FIG. 26 shows a Z axis orthogonal to the directions of the Γ-X axis and the Γ-Y axis. This Z axis is the same as the Z axis shown in FIG. 1. As shown in FIG. 26, in the PCSEL of Γ-point oscillation, the wavenumber in the in-plane direction becomes 0 due to diffraction and diffraction in the direction perpendicular to the plane, that is, the Z-axis direction, occurs as indicated by the arrow K5 in the drawing. Therefore, a laser beam is basically output in the Z-axis direction.

Next, a PCSEL of M-point oscillation will be described. For M-point oscillation, the lattice spacing a of the virtual square lattice, the emission wavelength λ of the active layer 11, and the equivalent refractive index n of the mode need only satisfy the condition: λ=(√2)n×a. FIG. 27 is a plan view illustrating a reciprocal lattice space, in other words, a wavenumber space, for the photonic crystal layer of a PCSEL of M-point oscillation. FIG. 27 also shows a case where a plurality of different refractive index regions are located on the lattice points of a square lattice. A plurality of points P in FIG. 27 represent reciprocal lattice points. A plurality of arrows B1 in FIG. 27 represent the same fundamental reciprocal lattice vectors as in FIG. 25. Arrows K6, K7, K8, and K9 represent four in-plane wavenumber vectors. Here, a Γ-M1 axis and a Γ-M2 axis which are orthogonal to each other in the reciprocal lattice space are defined. The Γ-M1 axis is parallel to one diagonal direction of the square lattice, and the Γ-M2 axis is parallel to the other diagonal direction of the square lattice. The in-plane wavenumber vector is a vector obtained by projecting the wavenumber vector into the Γ-M1/Γ-M2 plane. That is, the in-plane wavenumber vector K6 points in the positive direction of the Γ-M1 axis. The in-plane wavenumber vector K7 points in the positive direction of the Γ-M2 axis. The in-plane wavenumber vector K8 points in the negative direction of the Γ-M1 axis. The in-plane wavenumber vector K9 points in the negative direction of the Γ-M2 axis. As obvious from FIG. 27, in the PCSEL of M-point oscillation, the magnitude of the in-plane wavenumber vectors K6 to K9, that is, the magnitude of the standing waves in the in-plane direction, is smaller than the magnitude of the fundamental reciprocal lattice vector B1. The magnitude k of the in-plane wavenumber vectors K6 to K9 is given by the following Formula (10).

[Formula 10]

$$k = \frac{1}{\sqrt{2}}\frac{2\pi}{a} \quad (10)$$

Diffraction occurs in the in-plane wavenumber vectors K6 to K9 in the direction of the vector sum of the reciprocal lattice vectors. The magnitude of the reciprocal lattice vector is 2 mπ/a, where m is an integer. However, in the PCSEL of M-point oscillation, the wavenumber in the in-plane direction cannot become 0 due to diffraction, and no diffraction occurs in the direction perpendicular to the plane, that is, the Z-axis direction. Therefore, since a laser beam is not output in the direction perpendicular to the plane, M-point oscillation is usually not used in the PCSEL.

Next, an S-iPM laser of Γ-point oscillation will be described. The conditions for Γ-point oscillation are the same as in the PCSEL described above. FIG. 28 is a plan view illustrating a reciprocal lattice space for the phase modulation layer of an S-iPM laser of Γ-point oscillation. The fundamental reciprocal lattice vector B1 is the same as that of the PCSEL of Γ-point oscillation shown in FIG. 25, but the in-plane wavenumber vectors K1 to K4 undergo phase modulation caused by the distribution of the rotation angle φ(x, y) and each have a wavenumber spread SP corresponding to the spread angle of the light image. The wavenumber spread SP can be expressed as a rectangular region. The rectangular region is centered on the tip of each of the in-plane wavenumber vectors K1 to K4 in the PCSEL of Γ-point oscillation. The length of the side in the x-axis direction and the length of the side in y-axis direction in the rectangular region are $2\Delta kx_{max}$ and $2\Delta ky_{max}$, respectively. With such a wavenumber spread SP, each of the in-plane wavenumber vectors K1 to K4 spreads over a rectangular range of (Kix+Δkx, Kiy+Δky). However, i=1 to 4, Kix is the x-direction component of the vector Ki, and Kiy is the y-direction component of the vector Ki. Here, Δkx is a value in the range of $-\Delta kx_{max} \leq \Delta kx \leq \Delta kx_{max}$, and Δky is a value in the range of $-\Delta ky_{max} \leq \Delta ky \leq \Delta ky_{max}$. The magnitudes of $\Delta kx_{max}$ and $\Delta ky_{max}$ are determined in accordance with the spread angle of the light image. In other words, the magnitudes of $\Delta kx_{max}$ and $\Delta ky_{max}$ depend on the light image to be displayed.

FIG. 29 is a perspective view of the reciprocal lattice space shown in FIG. 28, in a three-dimensional manner. FIG. 29 shows a Z axis orthogonal to the direction along the Γ-X axis and the direction along the Γ-Y axis. This Z axis is the same as the Z axis shown in FIG. 8. As shown in FIG. 29, in the case of the S-iPM laser of Γ-point oscillation, a light image (beam pattern) LM having a two-dimensional spread including not only 0-order light in the direction perpendicular to the plane, that is, the Z-axis direction, but also 1-order light and −1-order light in a direction inclined with respect to the Z-axis direction is output.

Next, an S-iPM laser of M-point oscillation will be described. The conditions for M-point oscillation are the same as in the case of the PCSEL described above. FIG. 30 is a plan view illustrating a reciprocal lattice space for the phase modulation layer an S-iPM laser of M-point oscillation. The fundamental reciprocal lattice vector B1 is the same as that of the PCSEL of M-point oscillation shown in FIG. 27, but the in-plane wavenumber vectors K6 to K9 each have a wavenumber spread SP caused by the distribution of the rotation angle q(x, y). The shape and magnitude of the wavenumber spread SP are the same as in the case of the Γ-point oscillation described above. In the case of the S-iPM laser of M-point oscillation, the magnitude of the in-plane wavenumber vectors K6 to K9, that is, the magnitude of the standing wave in the in-plane direction, is also smaller than the magnitude of the fundamental reciprocal lattice vector B1. The wavenumber in the in-plane direction cannot become 0 due to diffraction, and no diffraction occurs in the direction perpendicular to the plane, that is, the Z-axis direction. Therefore, neither the 0-order light in the direction perpendicular to the plane, that is, the Z-axis direction, nor the 1-order light and −1-order light in a direction inclined with respect to the Z-axis direction are output.

Here, in the present modification, the following device is applied to the phase modulation layer 12B in the S-iPM laser of M-point oscillation. Thereby, some of the 1-order light and the −1-order light are output without outputting the 0-order light. Specifically, as shown in FIG. 31, a diffraction vector V having a certain magnitude and direction is added to the in-plane wavenumber vectors K6 to K9. Thereby, the magnitude of at least one of the in-plane wavenumber vectors K6 to K9 (the in-plane wavenumber vector K8 in the drawing) is made smaller than 2π/λ. In other words, at least one of the in-plane wavenumber vectors K6 to K9 (the in-plane wavenumber vector K8) after the diffraction vector V is added falls within a circular region having a radius of 2π/λ, that is, the light line LL. The in-plane wavenumber vectors K6 to K9 indicated by broken lines in FIG. 31 represent the diffraction vectors V before addition. The in-plane wavenumber vectors K6 to K9 indicated by solid lines represent the diffraction vectors V after addition. Since the light line LL corresponds to the total reflection condition, the wavenumber vector having a magnitude that falls within the light line LL has a component in the direction perpendicular to the plane, that is, the Z-axis direction. In an example, the direction of the diffraction vector V is along the Γ-M1 axis or the Γ-M2 axis, and the magnitude of the diffraction vector V is in the range of 2π/(√2)a−2π/λ to 2π/(√2)a+2π/λ. In an example, the magnitude of the diffraction vector V is 2π/(√2)a.

The magnitude and direction of the diffraction vector V for causing at least one of the in-plane wavenumber vectors K6 to K9 to fall within the light line LL is examined. The following Formulas (11) to (14) show the in-plane wavenumber vectors K6 to K9 before the diffraction vector V is added, respectively.

[Formula 11]

$$K6 = \left(\frac{\pi}{a} + \Delta kx, \frac{\pi}{a} + \Delta ky\right) \quad (11)$$

[Formula 12]

$$K7 = \left(-\frac{\pi}{a} + \Delta kx, \frac{\pi}{a} + \Delta ky\right) \quad (12)$$

[Formula 13]

$$K8 = \left(-\frac{\pi}{a} + \Delta kx, -\frac{\pi}{a} + \Delta ky\right) \quad (13)$$

[Formula 14]

$$K9 = \left(\frac{\pi}{a} + \Delta kx, -\frac{\pi}{a} + \Delta ky\right) \quad (14)$$

The spreads Δkx and Δky which are in-plane wavenumber vectors satisfy the following Formula (15) and Formula (16), respectively. The maximum value $\Delta kx_{max}$ of spread of the in-plane wavenumber vector in the x-axis direction and the maximum value $\Delta ky_{max}$ of spread thereof in the y-axis direction are defined by the angle spread of light that forms a designed light image.

[Formula 15]

$$-\Delta kx_{max} \leq \Delta kx \leq \Delta kx_{max} \quad (15)$$

[Formula 16]

$$-\Delta ky_{max} \leq \Delta ky \leq \Delta ky_{max} \quad (16)$$

The diffraction vector V is represented by the following Formula (17). In this case, the in-plane wavenumber vectors K6 to K9 to which the diffraction vector V has been added are given by the following Formula (18) to (21).

[Formula 17]

$$V = (Vx, Vy) \quad (17)$$

[Formula 18]

$$K6 = \left(\frac{\pi}{a} + \Delta kx + Vx, \frac{\pi}{a} + \Delta ky + Vy\right) \quad (18)$$

[Formula 19]

$$K7 = \left(-\frac{\pi}{a} + \Delta kx + Vx, \frac{\pi}{a} + \Delta ky + Vy\right) \quad (19)$$

[Formula 20]

$$K8 = \left(-\frac{\pi}{a} + \Delta kx + Vx, -\frac{\pi}{a} + \Delta ky + Vy\right) \quad (20)$$

[Formula 21]

$$K9 = \left(\frac{\pi}{a} + \Delta kx + Vx, -\frac{\pi}{a} + \Delta ky + Vy\right) \quad (21)$$

The relationship of the following Formula (22) is established when it is considered that any of the in-plane wavenumber vectors K6 to K9 falls within the light line LL in Formulas (18) to (21).

[Formula 22]

$$\left(\pm\frac{\pi}{a} + \Delta kx + Vx\right)^2 + \left(\pm\frac{\pi}{a} + \Delta ky + Vy\right)^2 < \left(\frac{2\pi}{\lambda}\right)^2 \quad (22)$$

That is, by adding the diffraction vector V that satisfies the above Formula (22), any of the in-plane wavenumber vectors K6 to K9 falls within the light line LL, and some of the 1-order light and the −1-order light are output.

The reason why the magnitude, that is, radius, of the light line LL is set to 2π/λ is as follows. FIG. 32 is a diagram schematically illustrating a peripheral structure of the light line LL. The drawing shows a boundary between the device and the air viewed in a direction perpendicular to the Z-axis direction. The magnitude of the wavenumber vector of light in a vacuum is 2π/λ, but when light propagates in a device medium as shown in FIG. 32, the magnitude of the wavenumber vector Ka in the medium having a refractive index n is 2πn/λ. In this case, considering the wavenumber conservation law, in order for light to propagate through the boundary between the device and air, wavenumber components parallel to the boundary need to be continuous. In FIG. 32, in a case where the wavenumber vector Ka and the Z axis form an angle β, the length of the wavenumber vector projected onto the plane, that is, the in-plane wavenumber vector Kb, is (2πn/λ)sin β. Since the refractive index n of a medium is generally greater than 1, the wavenumber conservation law is not established at the angle β where the in-plane wavenumber vector Kb in the medium becomes greater than 2π/λ. In this case, the light is totally reflected and cannot be extracted to the air side. The magnitude of the wavenumber vector corresponding to this total reflection condition is the magnitude of the light line LL, that is, 2π/λ.

As an example of a specific method of adding the diffraction vector V to the in-plane wavenumber vectors K6 to K9, a method of superimposing a rotation angle distribution $\varphi_2(x, y)$ corresponding to a second phase distribution unrelated to the light image on a rotation angle distribution $\varphi_1(x, y)$ corresponding to a first phase distribution for forming a desired light image is considered. In this case, the rotation angle distribution φ(x, y) of the phase modulation layer 12B is expressed as follows.

$$\varphi(x,y)=\varphi_1(x,y)+\varphi_2(x,y)$$

The rotation angle distribution $\varphi_1(x, y)$ is equivalent to the phase of the complex amplitude when the inverse Fourier transform is performed on the light image as described above. The rotation angle distribution $\varphi_2(x, y)$ is a rotation angle distribution for adding the diffraction vector V that satisfies Formula (22). FIG. 33 is a diagram conceptually illustrating an example of the rotation angle distribution $\varphi_2(x, y)$. As shown in FIG. 33, in this example, the first phase value $\varphi_A$ and the second phase value $\varphi_B$ having a value different from the first phase value $\varphi_A$ are arrayed in a checkered pattern. That is, the first phase value $\varphi_A$ and the second phase value $\varphi_B$ are alternately arrayed in two orthogonal directions. In an example, the phase value $\varphi_A$ is 0(rad) and the phase value $\varphi_B$ is π(rad). That is, the difference between the first phase value $\varphi_A$ and the second phase value $\varphi_B$ is π(rad). Such an array of phase values can favorably realize the diffraction vector V along the Γ-M1 axis or the Γ-M2 axis. In a case where the first phase value $\varphi_A$ and the second phase value $\varphi_B$ are arrayed in a checkered pattern as described above, the relation of V=(±π/a, ±π/a) is established, and thus the diffraction vector V and any one of the in-plane wavenumber vectors K6 to K9 shown in FIG. 30 is exactly canceled. The rotation angle distribution $\varphi_2(x, y)$ that realizes the diffraction vector V is represented by the inner product of the diffraction vector V(Vx, Vy) and the position vector r(x, y), and is given by the following formula.

$$\varphi_2(x,y)=V\cdot r=Vx\cdot x+Vy\cdot y$$

In a case where the diffraction vector V satisfies V=(±π/a, ±π/a), and the position vector is r(xa, ya), the phase values are 0(rad) and π(rad). Both x and y are integers. On the other hand, the diffraction vector V may be shifted from (±π/a, ±π/a) insofar as at least one of the in-plane wavenumber vectors K6 to K9 falls within the light line LL.

In the structure of the second embodiment, the material system, film thickness, and layer configuration can be changed variously insofar as the active layer 11 and the phase modulation layer 12B are included. Here, the scaling law is established for a so-called square lattice photonic crystal laser in a case where the perturbation from the virtual square lattice is 0. That is, in a case where the wavelength is multiplied by a constant α, a similar standing wave state can be obtained by multiplying the entire square lattice structure by α. Similarly, in the present modification, the structure of the phase modulation layer 12B can also be determined by the scaling law according to the wavelength.

Effects obtained by the phase modulation layer 12B according to the present modification described above will be described. In the present modification, the lattice spacing a of the virtual square lattice and the emission wavelength λ of the active layer 11 satisfy the conditions of M-point oscillation. Normally, in the standing wave state of M-point oscillation, the light that propagates in the phase modulation layer 12B is totally reflected, and the output of both the signal light, that is, 1-order light and −1-order light, and 0-order light, is suppressed. However, in the present modification, the magnitude of at least one in-plane wavenumber vector out of the in-plane wavenumber vectors K6 to K9 in four directions each including an in-plane wavenumber vector formed in the reciprocal lattice space of the phase modulation layer 12B, the wavenumber spread Δk caused by the distribution of the rotation angle φ(x, y), is smaller than 2π/λ, that is, the light line LL. In the S-iPM laser, such in-plane wavenumber vectors K6 to K9 can be adjusted, for example, by devising the distribution of the rotation angle φ(x, y). In a case where the magnitude of at least one in-plane wavenumber vector is smaller than 2π/λ, the in-plane wavenumber vector has a component in the Z-axis direction. Therefore, as a result, a portion of the signal light is output from the phase modulation layer 12B. However, the 0-order light is still confined in the plane in a direction that coincides with any one of the four in-plane wavenumber vectors (±π/a, ±π/a) forming the M-point standing wave. Therefore, the 0-order light is not output from the phase modulation layer 12B into the light line LL. That is, according to the present modification, the 0-order light included in the output of the S-iPM laser can be removed from within the light line LL, and only the signal light can be output into the light line LL.

As in the present modification, the distribution of the rotation angle φ(x, y) may be obtained by superimposing the rotation angle distribution $\varphi_1(x, y)$ corresponding to the light image and the rotation angle distribution $\varphi_2(x, y)$ unrelated to the light image. In that case, the rotation angle distribution $\varphi_2(x, y)$ may be a rotation angle distribution for adding the diffraction vector V having a certain magnitude and direction to the in-plane wavenumber vectors K6 to K9 in four directions based on the rotation angle distribution $\varphi_1(x, y)$ in the reciprocal lattice space of the phase modulation layer 12B. As a result of the diffraction vector V being added to the in-plane wavenumber vectors K6 to K9 in four directions, the magnitude of at least one of the in-plane wavenumber vectors K6 to K9 in four directions may be smaller than 2π/λ. This makes it easy to realize a configuration in which the magnitude of at least one in-plane wavenumber vector out of the in-plane wavenumber vectors K6 to K9 in four directions each including the wavenumber spreads Δkx and Δky based on the distribution of the rotation angle φ(x, y) in the reciprocal lattice space is smaller than 2π/λ, that is, the light line LL.

As in the present modification, the rotation angle distribution $\varphi_2(x, y)$ may be a pattern in which phase values $\varphi_A$ and $\varphi_B$ having values different from each other are arrayed in a checkered pattern. With such a rotation angle distribution $\varphi_2(x, y)$, it is possible to easily realize the diffraction vector V described above.

FIG. 34 is a diagram illustrating an example of the distribution of the rotation angle φ(x, y) of the phase modulation layer 12B. FIG. 35 is an enlarged view of a portion S shown in FIG. 34. In FIGS. 34 and 35, the magnitude of the rotation angle is represented by the shade of color, the rotation angle increases as the color becomes darker, that is, the phase angle increases. Referring to FIG. 35, it can be seen that patterns in which phase values different from each other are arrayed in a checkered pattern are superimposed.

In the present modification, it is also possible to output a pattern that includes a portion on the Z axis and is symmetrical with respect to the Z axis. Since the 0-order light is not output, pattern intensity unevenness does not occur even on the Z axis. Design examples of such beam patterns include multipoint patterns, mesh patterns, and one-dimensional patterns. By outputting such a beam pattern in a visible region, it can be applied to, for example, a display application or the like.

(Fifth Modification)

In this modification, in the phase modulation layer 12C of the third embodiment, similarly to the fourth modification, the lattice spacing a of the virtual square lattice and the emission wavelength λ of the active layer 11 satisfy the conditions for M-point oscillation. Further, when considering the reciprocal lattice space in the phase modulation layer 12C, the magnitude of at least one in-plane wavenumber vector out of the in-plane wavenumber vector in four directions each including the wavenumber spread based on the distribution of the distance r(x, y) is smaller than 2π/λ, that is, the light line LL.

More specifically, in the present modification, by applying the following device to the phase modulation layer 12C in the S-iPM laser of M-point oscillation, some of the 1-order light and the −1-order light are output without outputting the 0-order light into the light line LL. Specifically, as shown in FIG. 31, the diffraction vector V having a certain magnitude and direction is added to the in-plane wavenumber vectors K6 to K9. This makes the magnitude of at least one in-plane wavenumber vector out of the in-plane wavenumber vectors K6 to K9 smaller than 2π/λ. In other words, at least one of the in-plane wavenumber vectors K6 to K9 to which the diffraction vector V has been added falls within the light line LL which is a circular region with a radius of 2π/λ. That is, by adding the diffraction vector V that satisfies Formula (22) described above, any of the in-plane wavenumber vectors K6 to K9 falls within the light line LL, and some of the 1-order light and the −1-order light are output.

In the present modification, the lattice spacing a of the virtual square lattice and the emission wavelength λ of the active layer 11 also satisfy the conditions for M-point oscillation. Additionally, in the reciprocal lattice space of the phase modulation layer 12C, a plane wave forming a standing wave is phase-modulated by the distribution of the distance r(x, y), and the magnitude of at least one in-plane wavenumber vector out of the in-plane wavenumber vectors K6 to K9 in four directions each including the wavenumber spread Δk based on the angle spread of the light image is smaller than 2π/λ, that is, the light line LL. Alternatively, by adding the diffraction vector V to the in-plane wavenumber vectors K6 to K9 in four directions excluding the wavenumber spread Δk, the magnitude of at least one in-plane wavenumber vector becomes smaller than a value {(2π/λ)−Δk} obtained by subtracting the wavenumber spread Δk from 2π/λ. Therefore, it is possible to remove the 0-order light included in the output of the S-iPM laser from within the light line LL and to output only the signal light.

Example

The inventor actually manufactured and evaluated the surface-emitting laser device of the fourth modification. In that case, the different refractive index region 12*b* of the phase modulation layer 12B is a regular octagonal hole, the lattice constant a is 202 nm, the filling factor is 28%, and the distance r between the center of gravity G and the lattice point O is 0.08a. The plurality of different refractive index regions 12*b* are arranged so as to form a total of 36 multipoint beams of six rows and six columns in the output light image. The inner region RIN in the phase modulation layer 12B is a square with a side of 200 μm, the outer region ROUT is a square with a side of 240 μm, the contact portion between the second electrode 22 and the contacting layer 17 is a square with a side of 200 μm, and the planar shape of the device is a square with a side of 800 μm. As in the first modification, a portion of the contacting layer 17 excluding the portion provided with the second electrode 22 is removed to expose the relaxation layer 16A.

FIG. 36 is a diagram showing a far-field image of a multipoint beam formed in the present example. FIG. 37 is a graph illustrating the current-optical output characteristics of the fabricated surface-emitting laser device in continuous operation at room temperature. In FIG. 37, the horizontal axis represents the current (unit: mA) and the vertical axis represents the optical output (unit: mW). FIG. 38 is a graph illustrating the current-voltage characteristics of the fabricated surface-emitting laser device in continuous operation at room temperature. In FIG. 38, the horizontal axis represents the current (unit: mA) and the vertical axis represents the voltage (unit: V).

Referring to FIG. 37, it can be seen that the optical output rises significantly after the driving current exceeds a certain value (1,000 mA in this example). Referring to FIG. 38, the voltage increases gradually as the driving current increases, and there is no sharp increase in voltage due to high electric resistance, or kink, that is, a protrusion of the voltage characteristics to the high voltage side, or the like. In this way, by providing the relaxation layer 16A, it is possible to realize stabilization the current-voltage characteristics, improvement of the optical output, and reduction of voltage.

Parts (a) and (b) of FIG. 39 are diagrams showing near-field patterns (NFPs) of the present example at low driving currents (30 mA and 100 mA) before oscillation. Part (a) of FIG. 39 shows a case where the driving current is 30 mA. Part (b) of FIG. 39 shows a case where the driving current is 100 mA. In acquiring these NFPs, a pulsed driving current (pulse width of 50 nanoseconds, duty of 1%) was supplied between the first electrode 21 and the second electrode 22. The ambient temperature was 25° C.

Referring to parts (a) and (b) of FIG. 39, noise such as dark lines is not particularly observed. Additionally, there are few crystal defects such as dislocations on the regrowth surface, that is, the surface of the contacting layer 17, and the morphology is good. This suggests that the crystal quality of the contacting layer 17 has been improved by the relaxation layer 16A being interposed between the upper cladding layer 15 and the contacting layer 17.

Part (a) of FIG. 40 is a graph illustrating a difference in the current-optical output characteristics (IL characteristics) when the thickness of the relaxation layer 16A is changed in the present example. Part (b) of FIG. 40 is a graph illustrating a difference in the current-voltage characteristics (IV characteristics) when the thickness of the relaxation layer 16A is changed. Parts (a) and (b) of FIGS. 41 and 42 are diagrams schematically illustrating a manufactured laminated structure. The numerical values in the drawings represent the thickness of each layer. In parts (a) and (b) of FIG. 40, a graph G7 shows a case where the thickness of the relaxation layer 16A is 50 nm (see FIG. 41). A graph G8 shows, as a comparative example, a case where a p-type GaAs layer 18 having a thickness of 50 nm is provided instead of the relaxation layer 16A as shown in part (a) of FIG. 42. A graph G9 shows, as a comparative example, a case where the upper cladding layer 15 is in contact with the contacting layer 17 without providing the relaxation layer 16A as shown in part (b) of FIG. 42. Referring to parts (a) and (b) of FIG. 40, it can be seen that the IL characteristics and IV characteristics are particularly improved in a case where the thickness of the relaxation layer 16A is 50 nm (graph G7).

The surface-emitting laser device according to the present disclosure is not limited to the above-described embodiments, and various other modifications are possible. For example, in the above embodiments, a case where the surface-emitting laser device is a PCSEL and a case where it is an S-iPM laser are exemplified. The surface-emitting laser device is not limited to these, and the configuration of the present disclosure can be applied to various other surface-emitting laser devices insofar as the surface-emitting laser device includes a basic region and a plurality of different refractive index regions that differ in refractive index from the basic region and are distributed two-dimensionally in a plane perpendicular to the thickness direction, and includes a resonance mode forming layer that forms a resonance mode of light in the plane.

Two configurations are exemplified as the configuration of the S-iPM laser. One is a configuration in which the centers of gravity of a plurality of different refractive index regions are located away from the lattice points of a virtual square lattice and have rotation angles around the lattice points according to a light image. The other is a configuration in which the centers of gravity of the plurality of different refractive index regions are located on straight lines that pass through the lattice points of the virtual square lattice and are inclined with respect to the square lattice, the distance between the center of gravity of each different refractive index region and the corresponding lattice point is individually set in accordance with the light image. The configuration of the present disclosure may be applied to S-iPM lasers having configurations different from these.

In each of the embodiments, a case where the bandgap width of the contacting layer 17 is smaller than the bandgap width of the upper cladding layer 15 has been exemplified. The bandgap width of the contacting layer 17 may be larger than the bandgap width of the upper cladding layer 15. In that case, the relaxation layer also has a bandgap width that is between the bandgap width of the upper cladding layer 15 and the bandgap width of the contacting layer 17, and thus the same operational effects as in each of the embodiments can be achieved.

INDUSTRIAL APPLICABILITY

The embodiment can be used as a surface-emitting laser device such as a photonic crystal surface-emitting laser or an S-iPM laser capable of obtaining sufficient laser oscillation even at a low drive voltage.

REFERENCE SIGNS LIST 1A, 1B: surface-emitting laser device, 8: semiconductor substrate, 8*a*: main surface, 8*b*: rear surface, 10: semiconductor laminate, 11: active layer, 12A: photonic crystal layer, 12*a*: basic region, 12*b*, 12*c*: different refractive index region, 12B, 12C: phase modulation layer, 13: lower cladding layer, 14: light guide layer, 15: upper cladding layer, 16A, 16B, 16C: relaxation layer, 17: contacting layer, 21: first electrode, 21*a*: opening, 22: second electrode, D:

straight line, E1: first light image portion, E2: second light image portion, E3: 0-order light, G: center of gravity, G11, G21: refractive index distribution, G12, G22: fundamental mode distribution, G13, G23: mode distribution, K6 to K9, Kb: in-plane wavenumber vector, LL: light line, Lout, Lout2: laser beam, O: lattice point, Q: center, R: unit constituent region, RIN: inner region, ROUT: outer region, S: portion, V: diffraction vector.

The invention claimed is:

1. A surface-emitting laser device comprising:

a first electrode;

a first cladding layer of a first conductivity type electrically connected to the first electrode;

an active layer provided on the first cladding layer;

a second cladding layer of a second conductivity type provided on the active layer;

a relaxation layer of a second conductivity type provided on the second cladding layer;

a contacting layer of a second conductivity type provided on the relaxation layer and having a bandgap different from that of the second cladding layer;

a second electrode provided on the contacting layer to be in ohmic contact with the contacting layer; and a resonance mode forming layer provided between the first cladding layer and the active layer or between the active layer and the second cladding layer, including a basic region and a plurality of different refractive index regions, in which the plurality of different refractive index regions have a refractive index different from that of the basic region, and in which the plurality of different refractive index regions are distributed two-dimensionally in a plane perpendicular to a thickness direction to form a resonance mode of light in the plane, wherein the relaxation layer has a bandgap width of that is between a bandgap width of the second cladding layer and a bandgap width of the contacting layer, the second cladding layer and the relaxation layer contain Al as a composition, an Al composition ratio of the relaxation layer is smaller than an Al composition ratio of the second cladding layer, and the Al composition ratio of the relaxation layer decreases continuously or stepwise from an interface of the relaxation layer closer to the second cladding layer toward an interface of the relaxation layer closer to the contacting layer.

2. The surface-emitting laser device according to claim 1, wherein the resonance mode forming layer is a photonic crystal layer in which the plurality of different refractive index regions are arrayed periodically.

3. The surface-emitting laser device according to claim 1, wherein the surface-emitting laser device is configured to output a light image, and each of centers of gravity of the plurality of different refractive index regions is located away from a corresponding lattice point of a virtual square lattice set in the plane of the resonance mode forming layer and has a rotation angle corresponding to the light image around the lattice point, and rotation angles of the centers of gravity of at least two of the different refractive index regions are different from each other.

4. The surface-emitting laser device according to claim 1, wherein the surface-emitting laser device is configured to output a light image, when a virtual square lattice is set in the plane of the resonance mode forming layer, centers of gravity of the plurality of different refractive index regions are located on straight lines that pass through lattice points of the square lattice and are inclined with respect to the square lattice, and inclination angles of a plurality of the straight lines corresponding to the plurality of different refractive index regions with respect to the square lattice are uniform within the resonance mode forming layer, and a distance between a center of gravity of each of the different refractive index regions and each of the lattice points corresponding to each of the different refractive index regions is individually set in accordance with the light image, and distances of the centers of gravity of at least two of the different refractive index regions from the lattice points are different from each other.

5. The surface-emitting laser device according to claim 1, wherein the relaxation layer is composed of same constituent elements as the second cladding layer.

6. The surface-emitting laser device according to claim 1, wherein a refractive index of the second cladding layer is smaller than a refractive index of the first cladding layer.

7. The surface-emitting laser device according to claim 1, wherein the second cladding layer and the relaxation layer are AlGaAs layers, and the contacting layer is a GaAs layer.

8. The surface-emitting laser device according to claim 1, wherein the first cladding layer contains Al as a composition, and the Al composition ratio of the second cladding layer is higher than an Al composition ratio of the first cladding layer.

9. The surface-emitting laser device according to claim 1, wherein a thickness of the relaxation layer is smaller than a thickness of the second cladding layer.

10. The surface-emitting laser device according to claim 1, wherein the relaxation layer is located at distance of 1 μm or more from both the resonance mode forming layer and the active layer.

11. A surface-emitting laser device comprising:

a first electrode;

a first cladding layer of a first conductivity type electrically connected to the first electrode;

an active layer provided on the first cladding layer;

a second cladding layer of a second conductivity type provided on the active layer;

a relaxation layer of a second conductivity type provided on the second cladding layer;

a contacting layer of a second conductivity type provided on the relaxation layer and having a bandgap different from that of the second cladding layer;

a second electrode provided on the contacting layer to be in ohmic contact with the contacting layer; and a resonance mode forming layer provided between the first cladding layer and the active layer or between the active layer and the second cladding layer, including a basic region and a plurality of different refractive index regions, in which the plurality of different refractive index regions have a refractive index different from that of the basic region, and in which the plurality of different refractive index regions are distributed two-dimensionally in a plane perpendicular to a thickness direction to form a resonance mode of light in the plane, wherein the relaxation layer has a bandgap width of that is between a bandgap width of the second cladding layer and a bandgap width of the contacting layer, and an area of the contacting layer is smaller than an area of the relaxation layer when viewed in a thickness direction, and the relaxation layer is exposed from the contacting layer around the contacting layer.

12. The surface-emitting laser device according to claim 11, wherein the resonance mode forming layer is a photonic crystal layer in which the plurality of different refractive index regions are arrayed periodically.

13. The surface-emitting laser device according to claim 11, wherein the surface-emitting laser device is configured to output a light image, and each of centers of gravity of the plurality of different refractive index regions is located away from a corresponding lattice point of a virtual square lattice set in the plane of the resonance mode forming layer and has a rotation angle corresponding to the light image around the lattice point, and rotation angles of the centers of gravity of at least two of the different refractive index regions are different from each other.

14. The surface-emitting laser device according to claim 11, wherein the surface-emitting laser device is configured to output a light image, when a virtual square lattice is set in the plane of the resonance mode forming layer, centers of gravity of the plurality of different refractive index regions are located on straight lines that pass through lattice points of the square lattice and are inclined with respect to the square lattice, and inclination angles of a plurality of the straight lines corresponding to the plurality of different refractive index regions with respect to the square lattice are uniform within the resonance mode forming layer, and a distance between a center of gravity of each of the different refractive index regions and each of the lattice points corresponding to each of the different refractive index regions is individually set in accordance with the light image, and distances of the centers of gravity of at least two of the different refractive index regions from the lattice points are different from each other.

15. The surface-emitting laser device according to claim 11, wherein the relaxation layer is composed of same constituent elements as the second cladding layer.

16. The surface-emitting laser device according to claim 11, wherein the bandgap width of the relaxation layer changes continuously so as to approach the bandgap width of the contacting layer from the bandgap width of the second cladding layer.

17. The surface-emitting laser device according to claim 11, wherein the bandgap width of the relaxation layer changes stepwise so as to approach the bandgap width of the contacting layer from the bandgap width of the second cladding layer.

18. The surface-emitting laser device according to claim 11, wherein a refractive index of the second cladding layer is smaller than a refractive index of the first cladding layer.

19. The surface-emitting laser device according to claim 11, wherein a thickness of the relaxation layer is smaller than a thickness of the second cladding layer.

20. The surface-emitting laser device according to claim 11, wherein the relaxation layer is located at distance of 1 μm or more from both the resonance mode forming layer and the active layer.

* * * * *